US010763088B2

(12) United States Patent
Uemura et al.

(10) Patent No.: US 10,763,088 B2
(45) Date of Patent: Sep. 1, 2020

(54) VACUUM PROCESSING APPARATUS

(71) Applicant: HITACHI HIGH-TECH CORPORATION, Minato-ku, Tokyo (JP)

(72) Inventors: Takashi Uemura, Tokyo (JP); Takamasa Ichino, Tokyo (JP); Kazunori Nakamoto, Tokyo (JP); Kohei Sato, Tokyo (JP)

(73) Assignee: HITACHI HIGH-TECH CORPORATION, Tokyo (JP)

( * ) Notice: Subject to any disclaimer, the term of this patent is extended or adjusted under 35 U.S.C. 154(b) by 151 days.

(21) Appl. No.: 16/111,752

(22) Filed: Aug. 24, 2018

(65) Prior Publication Data
US 2019/0267219 A1 Aug. 29, 2019

(30) Foreign Application Priority Data
Feb. 23, 2018 (JP) .................................. 2018-030295

(51) Int. Cl.
*H01J 37/32* (2006.01)
(52) U.S. Cl.
CPC .... *H01J 37/32715* (2013.01); *H01J 37/3288* (2013.01); *H01J 37/32834* (2013.01); *H01J 2237/3341* (2013.01)
(58) Field of Classification Search
CPC ............. H01J 37/32715; H01J 37/3288; H01J 37/32834; H01J 2237/3341
See application file for complete search history.

(56) References Cited

U.S. PATENT DOCUMENTS

| 2003/0003749 A1 | 1/2003 | Sexton et al. |
| 2005/0193953 A1 | 9/2005 | Makino et al. |
| 2015/0214014 A1 | 7/2015 | Sato et al. |

FOREIGN PATENT DOCUMENTS

| JP | 2005-516379 A | 6/2005 |
| JP | 2005-252201 A | 9/2005 |
| JP | 2015141908 A | 8/2015 |

*Primary Examiner* — Yuechuan Yu
(74) *Attorney, Agent, or Firm* — Miles & Stockbridge, P.C.

(57) ABSTRACT

Provided is a vacuum processing apparatus that improves an operation rate or efficiency of processing. The vacuum processing apparatus includes: a cylindrical pedestal which is disposed below a base plate that constitutes a specimen stage and is made of a metal, whose internal space is under an atmospheric pressure, and which is connected to the base plate in a state in which the base plate, and a base member and an insulating member fastened to the base plate are placed; a plate-shaped beam part which is disposed in the space of the pedestal with a gap from a lower surface of the base plate, and extends outward from the center of the space in a T or Y shape; a plurality of pins that pass through the beam part, the base plate, the insulating member, and the base member, support the specimen on tips thereof on an upper side of the specimen stage, and vertically move the specimen; a pin drive unit that is mounted on a lower surface of the center of the beam part; and a seal that is disposed around a through-hole through which each of the plurality of pins passes, and airtightly seals the inside and the outside.

8 Claims, 20 Drawing Sheets

VACUUM PROCESSING APPARATUS

CLAIM OF PRIORITY

The present application claims priority from Japanese patent application JP 2018-030295 filed on Feb. 23, 2018, the content of which is hereby incorporated by reference into this application.

BACKGROUND OF THE INVENTION

1. Field of the Invention

The present invention relates to a vacuum processing apparatus that processes a specimen that is an object to be processed and is disposed on a specimen stage in a processing chamber to be depressurized inside a vacuum vessel using plasma formed in the processing chamber.

2. Description of Related Art

In vacuum processing apparatuses that process workpieces such as semiconductor wafers, for example, a processing gas is introduced into a vacuum processing chamber in a state in which an inner portion of the vacuum processing chamber is depressurized, the introduced processing gas is converted into plasma, and the workpieces such as semiconductor wafers held on a specimen stage having an electrostatic chuck are process by a chemical reaction with radicals and sputtering of electrons.

In the vacuum processing apparatuses, the processing gas is used, and a reaction product adheres to the inner portion of the vacuum processing chamber when the processing gas is converted into the plasma and processes the workpiece (the wafer). When the reaction product adheres to surfaces of components disposed inside the processing chamber, there is a problem that, due to deterioration of the components, the reaction product becomes fine particles from the surfaces, peels off, falls down, adheres to the wafer or the like as a foreign material, and contaminates the wafer. To suppress this, the components inside the processing chamber are periodically interchanged or cleaned, the reaction product or the like that is the cause of the foreign material is removed, or processing for reproducing the surface of each component is performed (maintenance). During the maintenance, the inner portion of the processing chamber is kept open in an atmosphere of the atmospheric pressure and cannot perform processing, and an operation of the apparatus is stopped. Thus, efficiency of the processing is reduced.

Further, an increase in diameter of the semiconductor wafer that is the workpiece has recently been in progress. For this reason, the vacuum processing apparatus is also made larger, and individual components constituting the vacuum processing apparatus are also made larger. Weight of the vacuum processing apparatus also tends to increase. Demounting, movement, mounting, etc. of the components are not easy, and it is expected that a time required for the maintenance is prolonged. There is a concern that maintenance efficiency is further reduced.

A technique for improving the maintenance efficiency of this vacuum processing apparatus is disclosed in, for instance, JP-A-2005-252201. The electrostatic chuck used in the vacuum processing chamber is disclosed in, for instance, JP-A-2005-516379.

A vacuum processing apparatus having an upper inner cylinder chamber that constitutes a processing chamber for processing a workpiece in an outer chamber, a specimen stage, and a lower inner cylinder chamber disposed close to an exhaust part is disclosed in JP-A-2005-252201. In this vacuum processing apparatus, during maintenance, a discharge chamber base plate that is disposed at an upper portion of the upper inner cylinder chamber and constitutes a discharge chamber for generating plasma is lifted upward to be rotated using a hinge part disposed close to a transfer chamber as a fulcrum, and a work space of the upper inner chamber is secured. Thereby, the upper inner chamber is lifted upward and ejected from the outer chamber. Further, a specimen stage base plate to which a ring-shaped support base member (a specimen stage block), which has support beams that are fixedly disposed around an axis using the center of the specimen stage in a vertical direction as the axis, is fixed is lifted upward to be rotated using the hinge part disposed close to the transfer chamber as the fulcrum, and a work space of the lower inner chamber is secured. Thereby, the lower inner chamber is lifted upward and ejected from the outer chamber. The support beams are disposed in axial symmetry using the center of the specimen stage in the vertical direction as the axis (that is, a shape of a gas flow passage is made nearly coaxially symmetrical with respect to the central axis of the specimen stage), and thereby a gas or the like (a processing gas, particles in the plasma, and a reaction product) of the space on the specimen stage in the upper inner cylinder chamber is exhausted through a space between the support beams via the lower inner cylinder chamber. Thereby, a flow of the gas in a circumferential direction of the workpiece becomes uniform, and uniform processing of the workpiece becomes possible.

When a technique for pulling up the discharge chamber base plate and the specimen stage base plate using the hinge part as the fulcrum is applied to maintenance of the workpiece whose diameter is made larger, the support beams to which the discharge base plate and the specimen stage are fixed are made larger, and weight thereof is increased. Thus, it is difficult to pull up these support beams by hands, and there is a concern that it is difficult to secure the work spaces of the upper inner cylinder chamber and the lower inner cylinder chamber. The maintenance of the exhaust part is performed by looking in from an upper portion of the outer chamber. However, there is a concern that the hand does not reach the exhaust part due to the increase in size of the apparatus, and sufficient cleaning or the like is difficult. Further, there is a concern that abnormal maintenance such as preparation or interchange of the components constituting the discharge base plate and the specimen stage that are pulled upward becomes unstable. Even if the support beams to which the discharge base plate and the specimen stage are fixed are pulled up by a crane, the two latters are not settled.

Further, a cantilever base plate support which is caused to pass through an opening provided in a sidewall of a vacuum processing chamber (in a horizontal direction), and thereby can be mounted in or demounted from the chamber, and on which an electrostatic chuck assembly is mounted is disclosed in JP-A-2005-516379. When this technique is applied to maintenance of a workpiece whose diameter is made larger, the base plate support is vacuum-sealed in the opening of the chamber sidewall. Thus, there is a concern that, when weight is increased, a weight load toward a vacuum seal part is increased, and it is difficult to hold vacuum. A shape of a gas flow pas sage is not made coaxially symmetrical with respect to a central axis of the cantilever base plate support, and a flow of a gas in a circumferential direction of the workpiece becomes non-uniform, and it is thought that it is difficult to perform uniform processing of the workpiece.

As a technique for solving this technique in the related art, a technique in which a vacuum vessel is configured to be divided into a portion constituting a specimen stage or an electrostatic chuck and a plurality of portions disposed to vertically interpose this portion and then forms a seal between them, the portion constituting the specimen stage or the electrostatic chuck is rotated and moved in a horizontal direction of a main body in a state in which it is coupled to a vacuum processing apparatus or a processing unit main body, and upper and lower portions are configured to be able to be demounted in turn, and thereby efficiency of maintenance is improved, is known. As an example of this technique, a technique disclosed in JP-A-2015-141908 was known in the past.

An vacuum processing apparatus having a vacuum vessel with a cylindrical lower vessel disposed on a base plate, a ring-shaped specimen stage base in which support beams supporting a specimen stage are provided, a cylindrical upper vessel, and a cylindrical discharge block, and a lid member that closes an upper portion of a discharge block and is made of a dielectric is disclosed in JP-2015-141908A. In the processing unit of this technique of the related art, atoms or molecules of a processing gas supplied into the processing chamber are excited by microwaves or a high-frequency electric field of a VHF or UHF band which is supplied by transmitting the lid member in the processing chamber formed inside the vacuum vessel by forming a seal between members of the vacuum vessel, and a magnetic field from a solenoid coil disposed around an upper side and a lateral side of the discharge block, and plasma is formed. A substrate-shaped specimen such as a semiconductor wafer placed and held on an upper surface of the specimen stage is processed.

Further, when inspection and maintenance such as cleaning, interchange, etc. of the members constituting the vacuum vessel or the members constituting an inner surface of the processing chamber, the inside of the processing chamber is set to the atmospheric pressure or a pressure value approximated such as to be regarded as such, and then the lid member or the discharge block is separated from the others, demounting of the upper vessel or the specimen stage base is horizontally rotated for each specimen stage and is moved and retracted from upper sides of the lower vessel and the base plate below the specimen stage base and from an upper side of a vacuum pump such as a turbo molecular pump disposed below the base plate. A worker who does work of interchange, maintenance, and inspection of the upper vessel and the lower vessel or work of interchange, maintenance, and inspection of the specimen stage and the member coupled to the specimen stage can secure a sufficient space to do the work in a state in which each portion is demounted from another portion or another portion is retracted, improve efficiency of the work, and shorten a time for which the vacuum processing apparatus does not process the specimen to improve efficiency of an operation of the vacuum processing apparatus.

The technique in the related art was short of a consideration with respect to the following points, and thus problems occurred.

That is, the specimen such as the semiconductor wafer typically reaches a temperature within a range suitable or allowable for the processing, and the processing is performed. However, after the temperature of the specimen stage or the specimen is adjusted within this range, a detector such as a sensor that detects the temperature is disposed in the specimen stage in order to detect the temperature of the specimen stage. If a state in which the detector is mounted in the specimen stage is different, output may be different with respect to the same value of the temperature. Thus, there is a need to perform calibration for setting or correcting an output value for a specific temperature that has been previously determined.

In a specimen stage having a plurality of detectors, there is a need to perform work for the calibration after the detectors are mounted in the specimen stage by the number of detectors mounted in the specimen stage. Meanwhile, since the upper surface and lateral surfaces of the specimen stage are members that face the plasma and constitutes the inner surface of the processing chamber, there occurs a need to demount the portions constituting the specimen stage that is the member constituting the inner surface in the work of maintenance and to perform cleaning or washing or interchange in order to remove an adhered material of the reaction product or the like that is generated during the processing and adheres to the surface in association with an increase in accumulated number of the processed wafers started from a state in which the surface is clean.

When the portion in which the detector is mounted is the target for the interchange in the technique of the related art, the work of calibration of the detector is required whenever the work of maintenance is performed, and thus a time for which the vacuum processing apparatus does not perform the processing of the specimen is increased, efficiency of the operation or operating efficiency or efficiency of the processing is damaged.

The pin drive unit for vertically moving the plurality of pins by which the wafer is moved up and down above the specimen stage is disposed in the center, and the power supplying point of the high-frequency power applied to the specimen stage is not disposed in the center of the specimen stage. The power supplying point becomes a singular point when a high frequency is applied, and in-plane uniformity of the water is damaged when the wafer is processed with the plasma.

These problems are not sufficiently considered in the technique of the related art, and a problem occurs.

SUMMARY OF THE INVENTION

An object of the present invention is to provide a vacuum processing apparatus that performs work of maintenance, inspection, etc. to shorten a time for which a specimen is not processed, improves an operation rate or efficiency of processing, uniformly processes a surface of the wafer, and improves a yield.

To accomplish the object, a vacuum processing apparatus includes a processing chamber which is disposed inside a vacuum vessel, and whose inner portion is exhausted and reduced in pressure; a specimen stage which is disposed in the processing chamber which a specimen to be processed is placed on an upper surface thereof; and an opening which is disposed below the specimen stage, and communicates with an exhaust pump for exhausting an inner portion of the processing chamber. The specimen is processed using plasma that is formed above the specimen stage and in the processing chamber, and the specimen stage includes: a base member that has a film, on an upper surface of which the specimen is placed and which is made of a dielectric, and that is made of a metal; a base plate that is disposed below the base member, is interposed and insulated between the base member and an insulating member, and is made of a metal; a connector that is inserted into the center of the base member from a lower side of the base plate, is mounted on a lower surface of the base plate, and supplies high-frequency power to the base member; a cylindrical pedestal which is disposed below the base plate, whose internal space is under an atmospheric pressure, and which is connected to the base plate in a state in which the base plate, and the base member and the insulating member fastened to the base plate are placed on an upper side of the space; a plate-shaped beam part which is disposed in the space of the pedestal with a gap from a lower surface of the base plate, and extends outward from the center of the space in a T or Y shape, and whose end is connected to an inner circumferential wall surface of the pedestal; a plurality of pins that pass through the beam part, the base plate, the insulating member, and the base member, support the specimen on tips thereof on an upper side of the specimen stage, and vertically move the specimen; a pin drive unit that is mounted on a lower surface of the center of the beam part; and a seal that is disposed at the beam part, is disposed around a through-hole through which each of the plurality of pins passes, and forms an airtight seal between a periphery of each of the pins and the space in the pedestal under the atmospheric pressure.

According to the present invention, a vacuum processing apparatus that improves efficiency of processing can be provided.

DESCRIPTION OF EMBODIMENTS

Figure 1A:
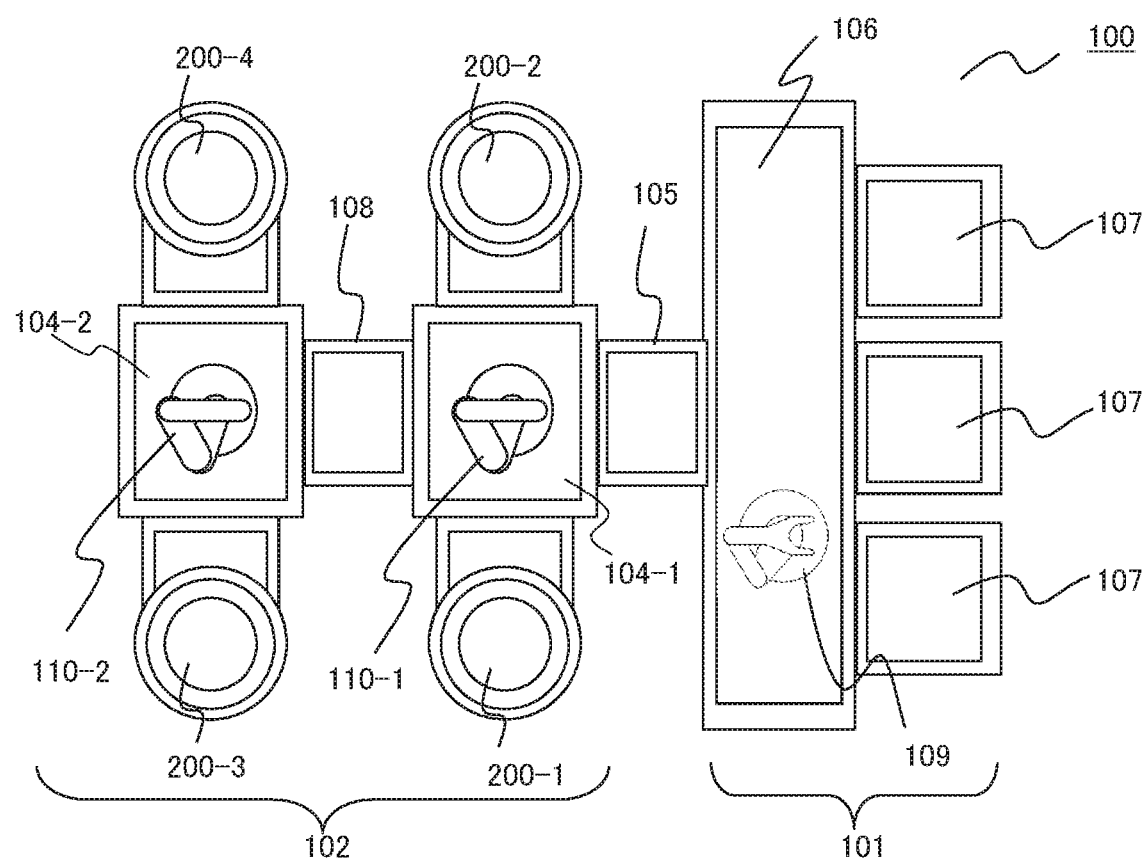
FIGS. 1A and 1B are a top view and a perspective view illustrating an outline of a configuration of a vacuum processing apparatus according to an embodiment of the present invention.

The inventors remembered the following points as means for accomplishing the above object. That is, (1) to secure favorable processing uniformity, a shape of a processing chamber is made nearly coaxially symmetrical with respect to a central axis of a specimen stage on which a workpiece is placed.

(2) To make easy normal maintenance possible, a reaction product or the like can be rapidly removed from a chamber member that is a target component for the normal maintenance in spite of an increase in diameter. Here, when the normal maintenance is easy, work performed in the event of the abnormal maintenance, for instance, disconnection of power cables or water cooling purge, is not necessary. (3) Since the easy abnormal maintenance is made possible, a discharging electrode head and various sensors that are targets for abnormal maintenance are easily ejected in spite of an increase in diameter.

Further, the inventors conceived of the following configurations as configurations that realized the foregoing.

With respect to (1), at least a shape of an inner wall of the vacuum processing chamber in a horizontal cross section is set to a circular shape, and support beams for supporting the specimen stage are disposed in axial symmetry using the center of the specimen stage in a vertical direction as an axis, and are fixed to a ring-shaped support base member. With respect to (2), components subjected to the normal maintenance can be swapped (interchanged). That is, components to which the reaction product adheres are not cleaned on the spot, and can be interchanged with new components or cleaned component. Further, the target components for the abnormal maintenance are grouped to a unit for each related component, are made movable in a horizontal direction in the unit basis, and facilitate avoidance such that they are out of the way in the event of the normal maintenance. With respect to (3), the unit to which the target components for the abnormal maintenance are grouped for each related component, is moved in the horizontal direction in the event of the maintenance, and a work space is set in the neighborhood.

In embodiments to be described below, as to a vacuum processing apparatus having these configurations, an example having configurations for accomplishing the above object will be described. In the drawings, the same reference sign indicates the same component.

EMBODIMENTS

Figure 1B:
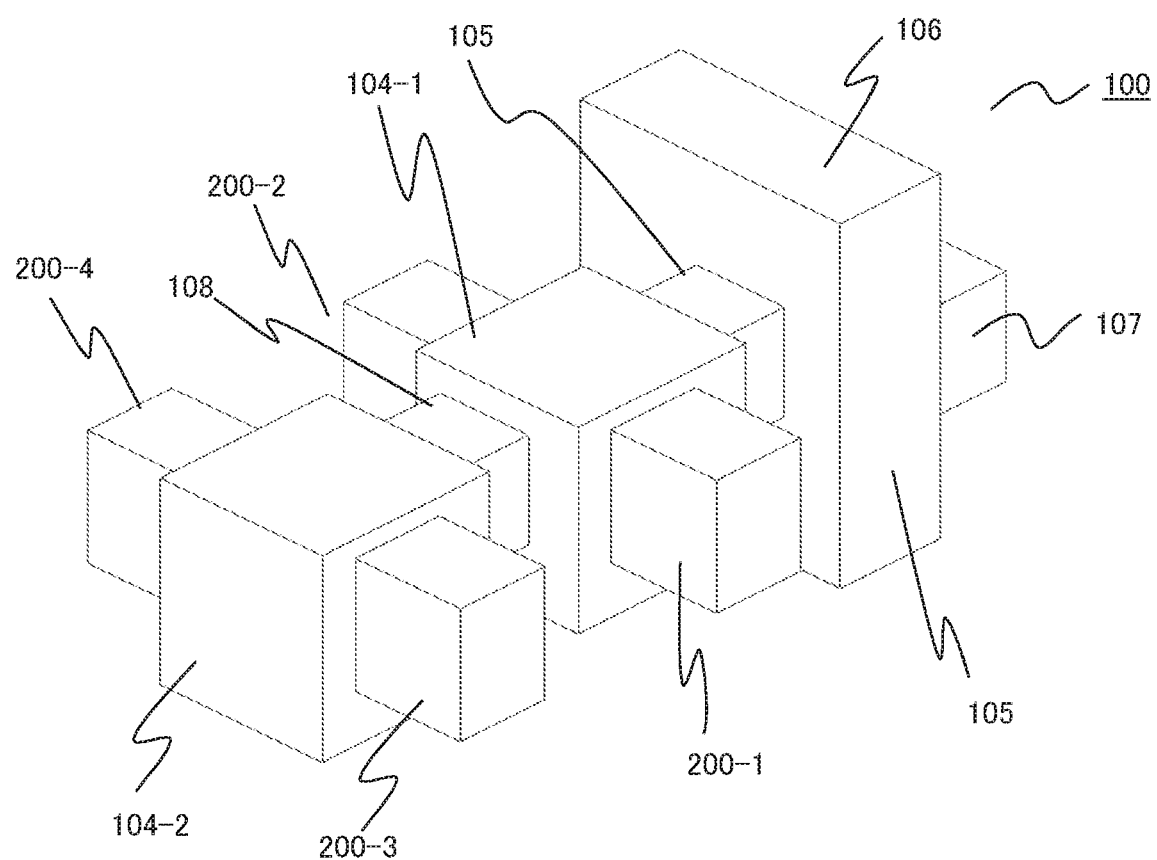

Hereinafter, a vacuum processing apparatus according to an embodiment of the present invention will be described using FIGS. 1A to 11B. FIGS. 1A and 1B are a top view and a perspective view illustrating an outline of a configuration of a vacuum processing apparatus according to an embodiment of the present invention.

A plasma processing apparatus that is a vacuum processing apparatus 100 of the present embodiment includes an atmospheric block 101 and a vacuum block 102. The atmospheric block 101 is a portion that transfers workpieces (specimens) such as semiconductor wafers under the atmospheric pressure and determines storage positions thereof, and the vacuum block 102 is a portion that transfers specimens such as wafers under a pressure depressurized from the atmospheric pressure, processes the specimens, and raises and lowers a pressure in a state in which the specimens are placed.

The atmospheric block 101 includes an atmospheric transfer chamber 106, and a plurality of cassette stands 107 that are mounted on a front surface side of the atmospheric transfer chamber 106 and has upper surfaces where cassettes in which specimens for processing and cleaning are stored are placed. The atmospheric block 101 is a place where the wafers for processing and cleaning stored in the cassettes on the cassette stands 107 are interchanged with the vacuum block 102 coupled to a back surface of the atmospheric transfer chamber 106, and an atmospheric transfer robot 109 having an arm for holding the wafers in order to transfer these wafers is disposed in the atmospheric transfer chamber 106.

The vacuum block 102 includes a plurality of vacuum processing chambers 200-1, 200-2, 200-3 and 200-4 that are depressurized to process the specimens, vacuum transfer chambers 104-1 and 104-2 that are coupled with these vacuum processing chambers and include vacuum transfer robots 110-1 and 110-2 that transfer the specimens under a reduced pressure in the vacuum transfer chambers, a lock chamber 105 that connects the vacuum transfer chamber 104-1 and the atmospheric transfer chamber 106, and a transfer intermediate chamber 108 that connects the vacuum transfer chamber 104-1 and the vacuum transfer chamber 104-2. The vacuum block 102 is made up of a unit by which an inner portion thereof is depressurized and can be maintained under a pressure of a high degree of vacuum. Control over operations of the atmospheric transfer robot and the vacuum transfer robots, and control over processing in the vacuum processing chambers are performed by a control unit.

Figure 3:
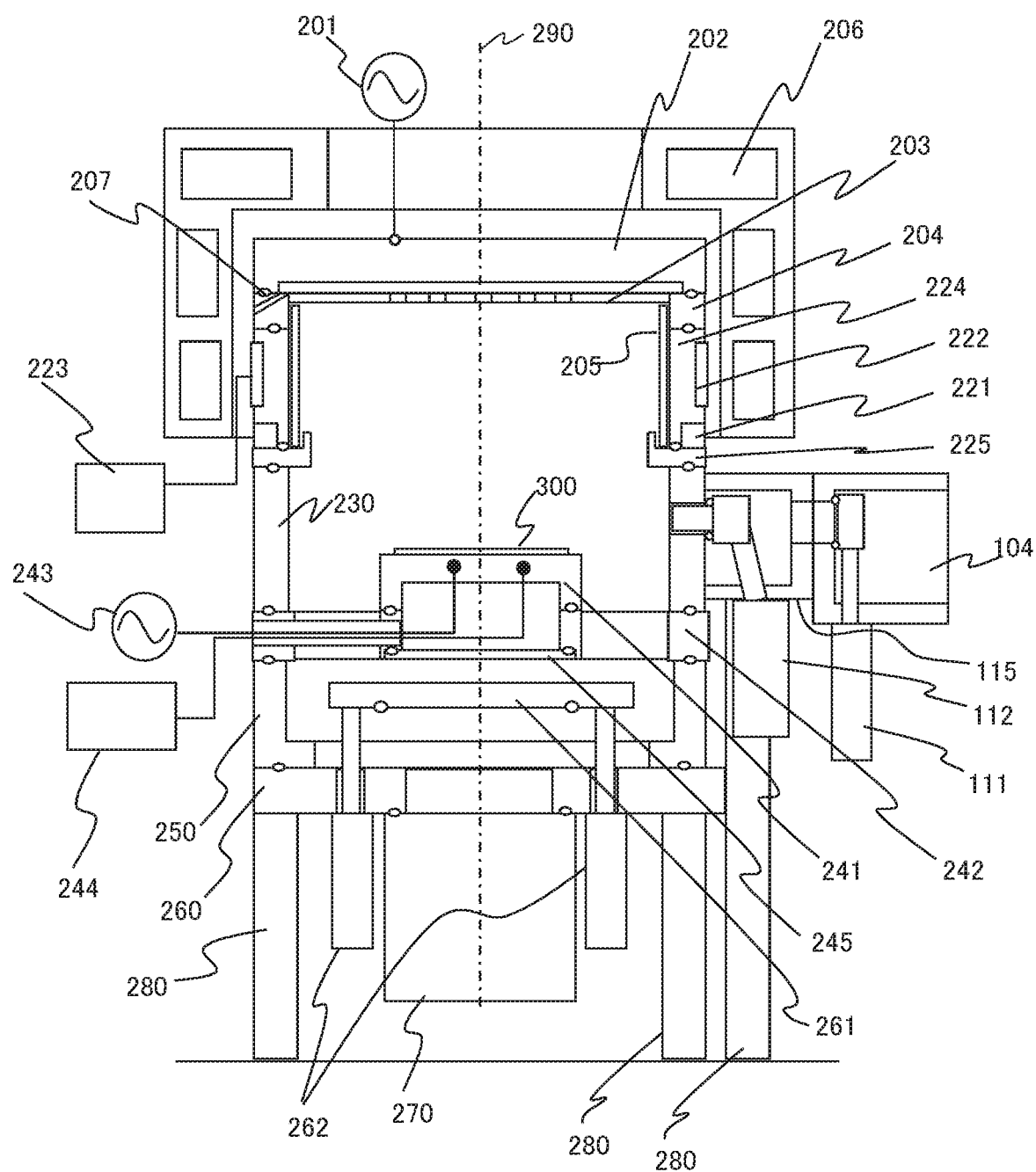
FIG. 3 is a longitudinal sectional view schematically illustrating an outline of a configuration of a vacuum processing chamber of the embodiment illustrated in FIGS. 1A and 1B.

FIG. 3 is a longitudinal sectional view schematically illustrating an outline of configurations of the vacuum processing chambers of the embodiment illustrated in FIGS. 1A and 1B. Especially, a sketch of the configuration of the vacuum processing chamber in the vacuum processing chamber 200 is illustrated in FIG. 3. In the present embodiment, the vacuum processing chambers including the same structure are arranged, but vacuum processing chambers including different structures may be assembled.

The vacuum processing chamber illustrated in FIG. 3 includes a vacuum vessel including an upper vessel 230 and a lower vessel 250, a lower exhaust pump 270 that is coupled to the vacuum vessel and is disposed, an upper first high-frequency power supply 201, and a solenoid coil 206. The upper vessel and the lower vessel have an inner wall whose horizontal sectional shape is a circular shape, and a cylindrical specimen stage 241 is disposed in the center of an inner portion thereof.

Outer walls of the upper vessel and the lower vessel constitute a vacuum partition wall. The specimen stage 241 is held by support beams provided on a specimen stage base 242, and the support beams are disposed in axial symmetry around the center of the specimen stage in a vertical direction (that is, a shape of a gas flow passage for a central axis 290 of the specimen stage is nearly coaxially symmetrical).

Since a gas and others (a processing gas, particles and a reaction product in plasma) of a space on the specimen stage 241 in the upper vessel 230 are exhausted via the lower vessel 250 through a space between the support beams, a flow of the gas becomes uniform in a circumferential direction of the specimen stage 241 on which the workpiece (the specimen) 300 is placed, and uniform processing to the workpiece 300 becomes possible. The specimen stage base 242 has a shape of a ring including the support beams, and this ring portion is held above and around the lower vessel and the upper vessel that is the vacuum vessel, and is vacuum-sealed. Thus, even when weight of the specimen stage or the like increases, the specimen stage base 242 can deal with the increased weight.

In the present embodiment, the vacuum processing chamber is made up of a plurality of members including the cylindrical lower vessel 250, the ring-shaped specimen stage base 242 including the support beams, the cylindrical upper vessel 230, an earth ring 225, a cylindrical discharge block 224, and a gas introduction ring 204, all of which are stacked on a base plate 260 in turn. These members are vacuum-sealed by O-rings 207. A cylindrical quartz inner cylinder 205 is disposed inside the discharge block 224. The specimen stage 241 having a specimen stage bottom lid 245 is fixed to the specimen stage base 242, and constitutes a specimen stage unit. The discharge block 224 on which a heater 222 is mounted is fixed to a discharge block base 221, and constitutes a discharge block unit.

The upper vessel 230, the lower vessel 250, and the base plate 260 have flange portions. The upper vessel 230 and the lower vessel 250 are fixed to the base plate 260 at the flange portions by screws. In the present embodiment, the members constituting the vacuum processing chamber have the cylindrical shape, but a horizontal sectional shape with regard to shapes of outer walls thereof may be a rectangular shape or another shape rather than a circular shape.

A lid member 202 that constitutes the vacuum vessel and has a disc shape, and a shower plate 203 that constitutes a ceiling surface of the vacuum processing chamber is disposed below the lid member 202, both disposed on an upper side of the vacuum processing chamber. The lid member 202 and the shower plate 203 are members formed of a dielectric material such as quartz. For this reason, these members are configured to be able to transmit a high-frequency electric field such as microwaves, UHF waves, or VHF waves, and an electric field from the first high-frequency power supply disposed above is supplied into the vacuum processing chamber through these members. Magnetic field forming unit (a solenoid coil) 206 is configured to be disposed on an outer circumference of a sidewall outside the vacuum vessel, to surround the outer circumference, and to be able to supply a generated electric field into the vacuum processing chamber.

Introduction holes of a processing gas that are a plurality of through-holes are disposed in the shower plate 203, and the processing gas introduced from the gas introduction ring 204 is supplied into the vacuum processing chamber through the introduction holes. The plurality of introduction holes of the shower plate 203 are disposed in a region which is above a placement surface of the specimen that is the upper surface of the specimen stage 241 and which has axial symmetry around the central axis 290 of the specimen stage 241, and the processing gas that has a predetermined composition and is constituted of different gas components is introduced into the vacuum processing chamber through the introduction holes that are evenly arranged.

Electromagnetic waves and a magnetic field generated by the first high-frequency power supply 201 that is the electric field forming unit and the solenoid coil 206 that is the magnetic field forming unit are supplied into the vacuum processing chamber, and thereby the processing gas introduced into the vacuum processing chamber is excited and is made into plasma in a space inside the discharge block 224 above the specimen stage 241. In this case, processing gas molecules are ionized into electrons and ions, or dissociated into radicals. Surroundings of a region where this plasma is generated are surrounded by the discharge block 224 disposed on the discharge block base 221, and the heater 222 that surrounds an outer circumferential sidewall of the discharge block 224 and is connected to a first temperature controller 223 is mounted on the outer circumferential sidewall of the discharge block 224, and can heat the quartz inner cylinder 205 that is in contact with the plasma.

With this configuration, adhesion of the reaction product to the quartz inner cylinder 205 and the discharge block 224 can be reduced. For this reason, these members can be excluded from targets of the normal maintenance.

The specimen stage 241 on which the wafer is placed is disposed inside the vacuum processing chamber as to be coincided with the central axis 290 of the shower plate 203. When processing using the plasma is performed, this processing is performed in a state in which a wafer that is a workpiece 300 is placed on the circular placement surface that is the upper surface of the specimen stage 241 and is adsorbed and held (electrostatic chuck) by film static electricity of a dielectric material of which this surface is formed.

In the present embodiment, in consideration of using the semiconductor wafer that is the specimen and has a diameter of 450 mm, an inner diameter of the cylindrical vacuum processing chamber is set to 800 mm. However, this inner diameter may be set to be no more than this dimension (about 600 mm).

A high-frequency bias power supply (a second high-frequency power supply) 243 is connected to electrodes disposed inside the specimen stage 241, an etching process is processed by a mutual reaction of a physical reaction caused by inducing and bombarding charged particles in the plasma onto the surface of the specimen using a high-frequency bias formed above the specimen stage 241 and the specimen 300 placed on the specimen stage 241 due to the supplied high-frequency power, and a chemical reaction between the radicals and the surface of the wafer. A temperature of the specimen stage can be controlled to a desired temperature by a second temperature controller 244.

Application of the high-frequency bias to the specimen stage 241 and temperature control over the specimen stage 241 are performed via a wiring cord for a power supply and a wiring cord for temperature control or refrigerant pipes, which are disposed in a cavity formed in the specimen stage base 242 including the support beams. Although not illustrated, in addition to the wiring cords, wiring cords for a temperature sensor and an electrostatic chuck may also be included. Since the reaction product easily adheres to the upper vessel 230 disposed around the specimen stage 241, the upper vessel 230 is a target member for the normal maintenance.

The exhaust pump 270 coupled with a bottom of the vacuum processing chamber via the base plate 260 having an exhaust opening is disposed below of the vacuum processing chamber. The exhaust opening provided in the base plate 260 can adjust exhaust conductance by vertically moving the exhaust unit lid 261, which is disposed just below the specimen stage 241, is disposed above the exhaust opening, and has an approximate disc shape, using a cylinder 262, and amounts and speeds of the internal gas, plasma, and product exhausted out of the vacuum processing chamber by the exhaust pump 270 are adjusted.

The exhaust unit lid 261 is opened when the workpiece is processed, and the pressure of the space in the vacuum processing chamber is held to a desired degree of vacuum by balance between supply of the processing gas and an operation of exhaust unit such as the exhaust pump 270. In the present embodiment, a pressure during the processing is adjusted to a value predetermined within a range of 0.1 to 4 Pa.

In the present embodiment, a turbo molecular pump and a roughing vacuum pump such as a rotary pump provided in a building in which the vacuum processing apparatus is installed are used as the exhaust pump. The exhaust unit lid 261 is configured to be closed during maintenance, and to enable the exhaust pump to be vacuum-sealed by an O-ring.

Further, in the present embodiment, a reference sign 111 indicates a first gate valve, a reference sign 112 indicates a second gate valve, a reference sign 115 indicates a valve box, and a reference sign 280 indicates a strut.

In the present embodiment, the processing gas introduced into the vacuum processing chamber and the plasma, and the reaction product during the processing move from the upper portion of the vacuum processing chamber through a space around the outer circumference of the specimen stage 241 to the opening provided in the base plate 260 below the specimen stage 241 via the lower vessel 250 due to an operation of the exhaust unit such as the exhaust pump 270. Since the reaction product easily adheres to the lower vessel 250, the lower vessel 250 becomes the target member for the normal maintenance.

The pressure in the vacuum processing chamber during the etching process is monitored by a vacuum gauge (not shown), and an exhaust speed is controlled by the exhaust unit lid 261. Thereby, the pressure in the vacuum processing chamber is controlled. The supply of the processing gas and the operations of the electric field forming unit, the magnetic field forming unit, the high-frequency bias, and the exhaust unit are adjusted by a control unit (not shown) connected to enable communication.

A single kind of gas or a gas in which various kinds of gases are mixed at an optimal flow rate ratio on each condition of each process is used as the processing gas used for plasma processing. A flow rate of this mixture gas is adjusted by a gas flow controller (not shown), and the mixture gas is introduced into a space for gas retention between the shower plate 203 and the lid member 202 on the upper side of the vacuum processing chamber at an upper portion of the vacuum vessel via the gas introduction ring 204 coupled with the gas flow controller. In the present embodiment, a gas introduction ring made of stainless steel is used.

Figure 2A:
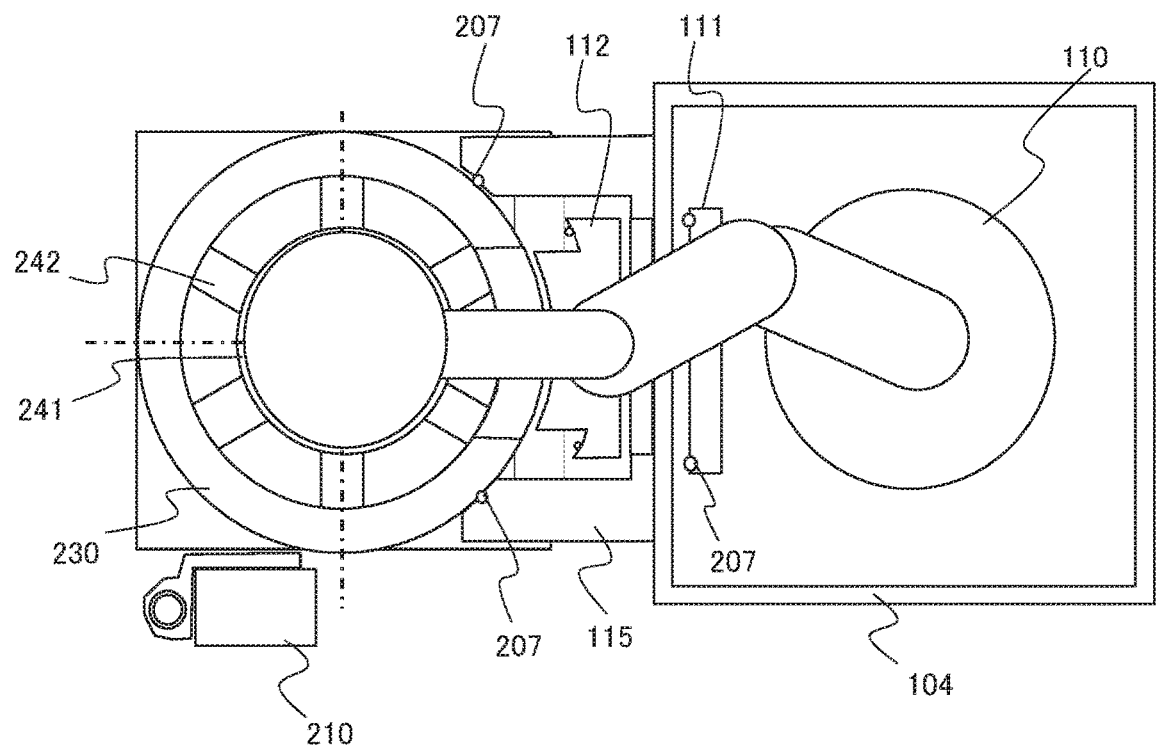
FIGS. 2A and 2B are schematic top views of key parts illustrating transfer of a workpiece in the vacuum processing apparatus according to the embodiment illustrated in FIGS. 1A and 1B.
Figure 2B:
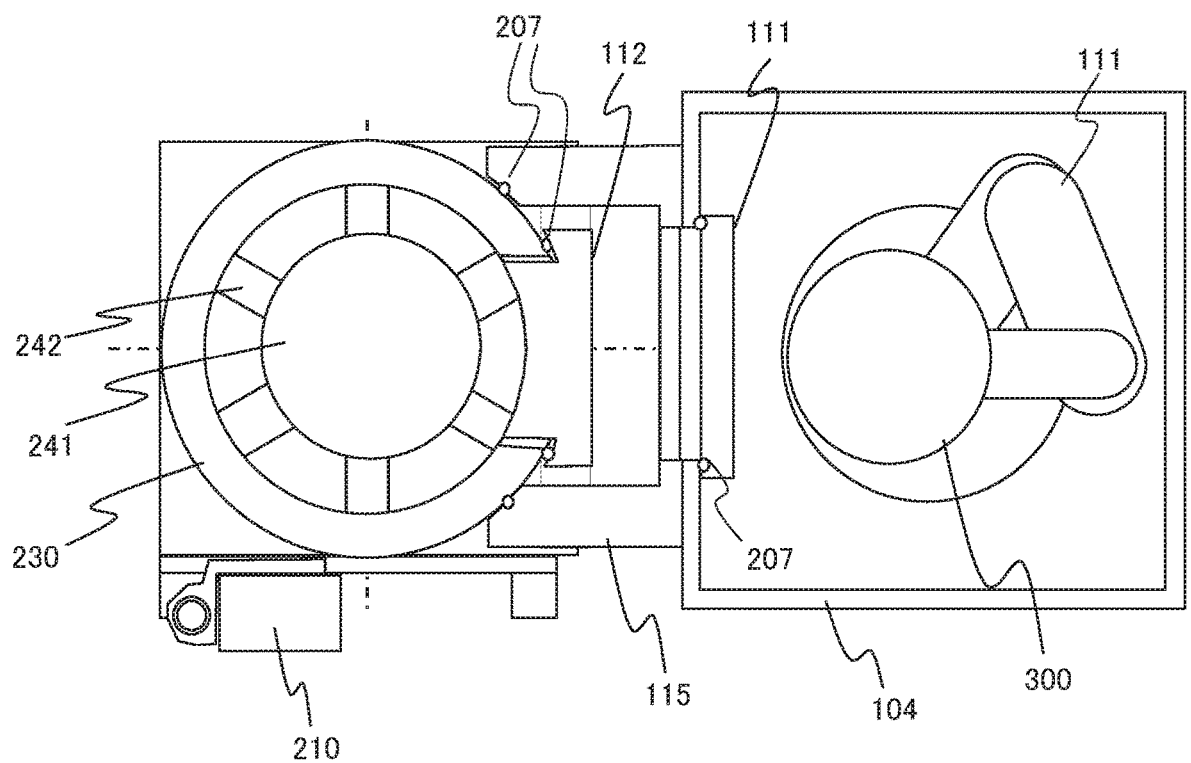

Next, a procedure of loading the workpiece into the vacuum processing chamber and procedure of unloading the workpiece out of the vacuum processing chamber will be described using FIGS. 2A to 4. FIGS. 2A and 2B are schematic top views of key parts illustrating transfer of the workpiece in the vacuum processing apparatus according to the embodiment illustrated in FIGS. 1A and 1B.

FIG. 2A is in a state in which gate valves are opened, and in a state in which a transfer robot is about to load or unload the workpiece into or out of the vacuum processing chamber. FIG. 2B is in a state in which the wafer 300 is loaded into the vacuum transfer chamber 104, and in a state in which the gate valves are closed, and illustrates a state in which the workpiece is loaded into the vacuum transfer chamber.

First, the wafer unloaded from the cassette by the atmospheric transfer robot in the atmospheric block is transferred to the vacuum transfer chamber 104 via the lock chamber. The vacuum processing chamber and the vacuum transfer chamber are connected via the first gate valve 111 and the second gate valve.

In this figure, both the gate valves are closed, and are vacuum-sealed by the O-rings 207. A reference sign 115 indicates a valve box, and a reference sign 210 indicates a turning lifter (moving unit).

The turning lifter 210 will be described below. Next, as illustrated in FIG. 2A, after the pressures of the vacuum processing chamber and the vacuum transfer chamber are equalized, the wafer 300 is loaded from the vacuum transfer chamber 104 into the vacuum processing chamber using the vacuum transfer robot 110 having an arm.

In this case, both the first and second gate valves 111 and 112 are in an opened state. Next, as illustrated in FIG. 3, the wafer 300 is placed on the specimen stage 241 in the vacuum processing chamber, and the vacuum transfer robot returns to the vacuum transfer chamber. The first and second gate valves 111 and 112 are closed.

Figure 4:
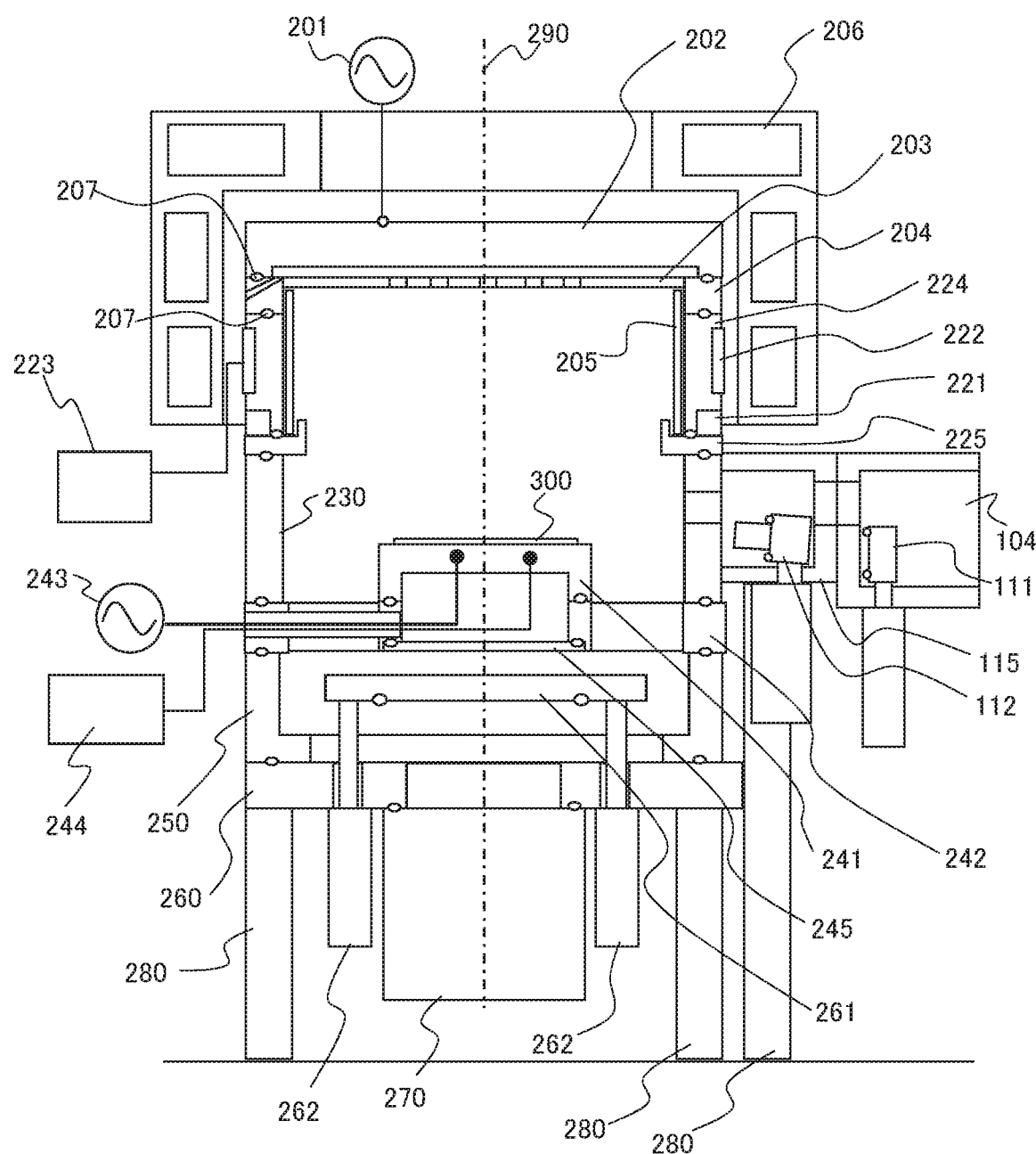
FIG. 4 is a longitudinal sectional view schematically illustrating an outline of the configuration of the vacuum processing chamber of the embodiment illustrated in FIGS. 1A and 1B.

When processing of the wafer 300 in the vacuum processing chamber is completed, after the pressures of the vacuum processing chamber and the vacuum transfer chamber are adjusted, the first and second gate valves 111 and 112 are made open as illustrated in FIG. 4. FIG. 4 is a longitudinal sectional view schematically illustrating the outline of the configuration of the vacuum processing chamber of the embodiment illustrated in FIGS. 1A and 1B, and illustrates a state in which the first and second gate valves 111 and 112 are opened.

In the same way as the state illustrated in FIG. 2A from this state, the wafer 300 is lifted upward from the specimen stage 241 using the vacuum transfer robot 110, and is released from the upper surface of the specimen stage 241. Continuously, as illustrated in FIG. 2B, the wafer 300 is loaded into the vacuum transfer chamber 104. Afterward, the wafer 300 is processed or not processed in another vacuum processing chamber, and is transferred to the cassette via the lock chamber.

Figure 5A:
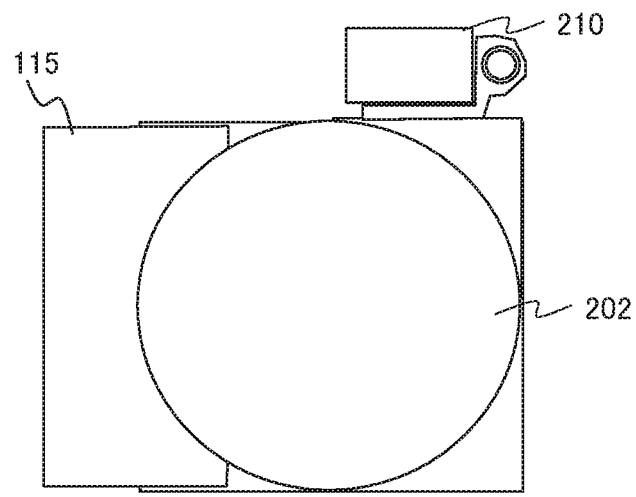
FIGS. 5A and 5B are a top view and a longitudinal sectional view illustrating a procedure of maintenance in the vacuum processing chamber of the vacuum processing apparatus according to the embodiment of the invention illustrated in FIGS. 1A and 1B.
Figure 5B:
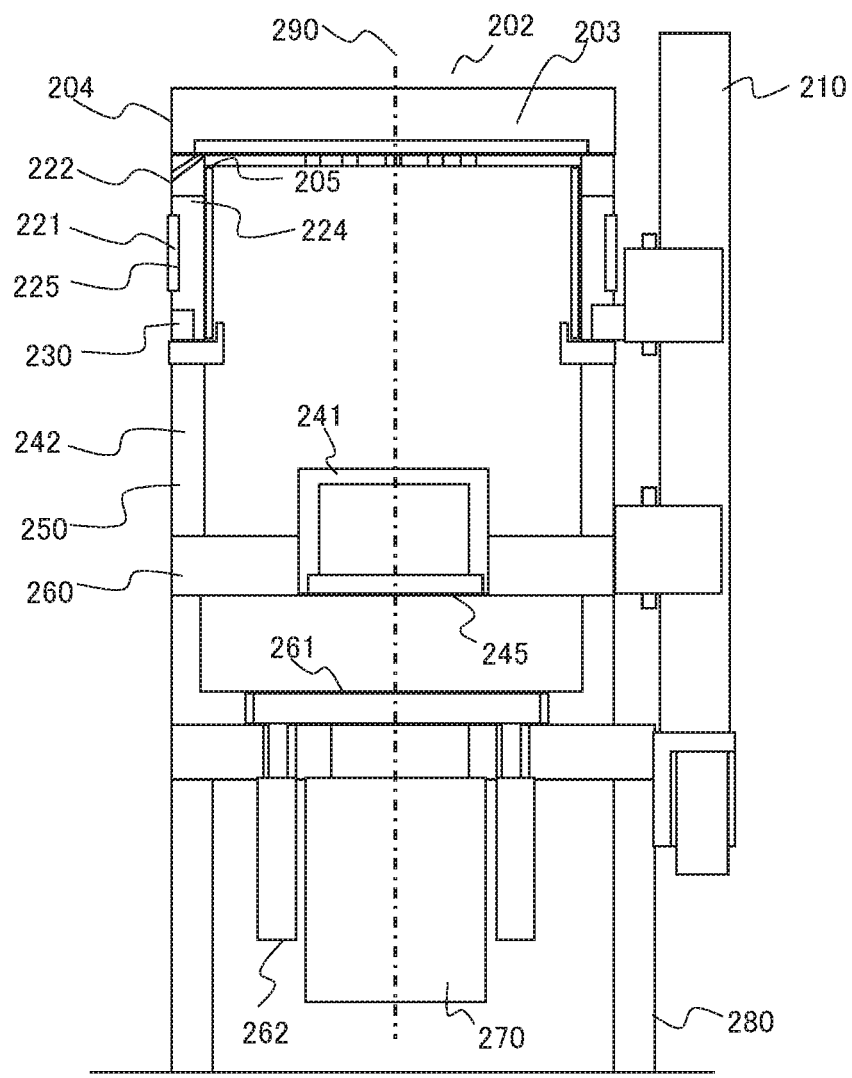

Next, a procedure of the normal maintenance will be described using FIGS. 5A to 11B. FIGS. 5A and 5B illustrate a configuration in which the solenoid coil 206 and the first high-frequency power supply 201 are removed from the configuration of the vacuum processing chamber illustrated in FIGS. 3 and 4 and simultaneously the opening of the base plate 260 connected to the exhaust pump 270 is blocked and vacuum-sealed by the exhaust unit lid 261. FIG. 5A is a top view, and FIG. 5B is a sectional view.

The exhaust pump 270 is vacuum-sealed by the exhaust unit lid 261, and the exhaust pump 270 is operated. Thereby, a start-up time of the vacuum processing chamber after the maintenance can be reduced. To describe the turning lifter 210, the sectional view illustrated in FIG. 5B is different in a viewing direction from FIG. 3 or FIG. 4.

That is, the sectional view illustrated in FIG. 3 or FIG. 4 is a view from the right side in the top view illustrated in FIG. 5A, and the sectional view illustrated in FIG. 5B is a view from the lower side in the top view illustrated in FIG. 5A. The longitudinal sectional views illustrated in FIGS. 6A to 11B are views from the same direction as in the sectional view illustrated in FIG. 5B.

Figure 6A:
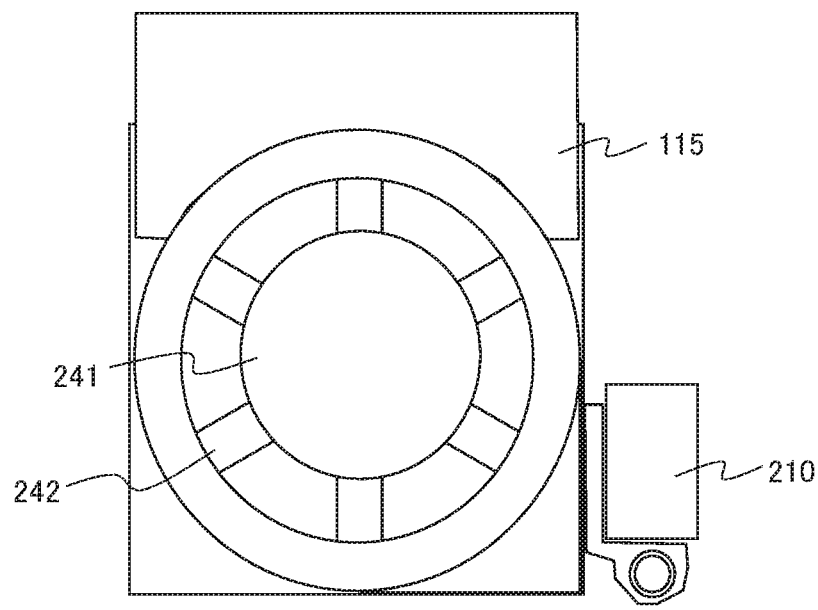
FIGS. 6A and 6B are a top view and a longitudinal sectional view illustrating a procedure of maintenance in the vacuum processing chamber of the vacuum processing apparatus according to the embodiment of the invention illustrated in FIGS. 1A and 1B.
Figure 6B:
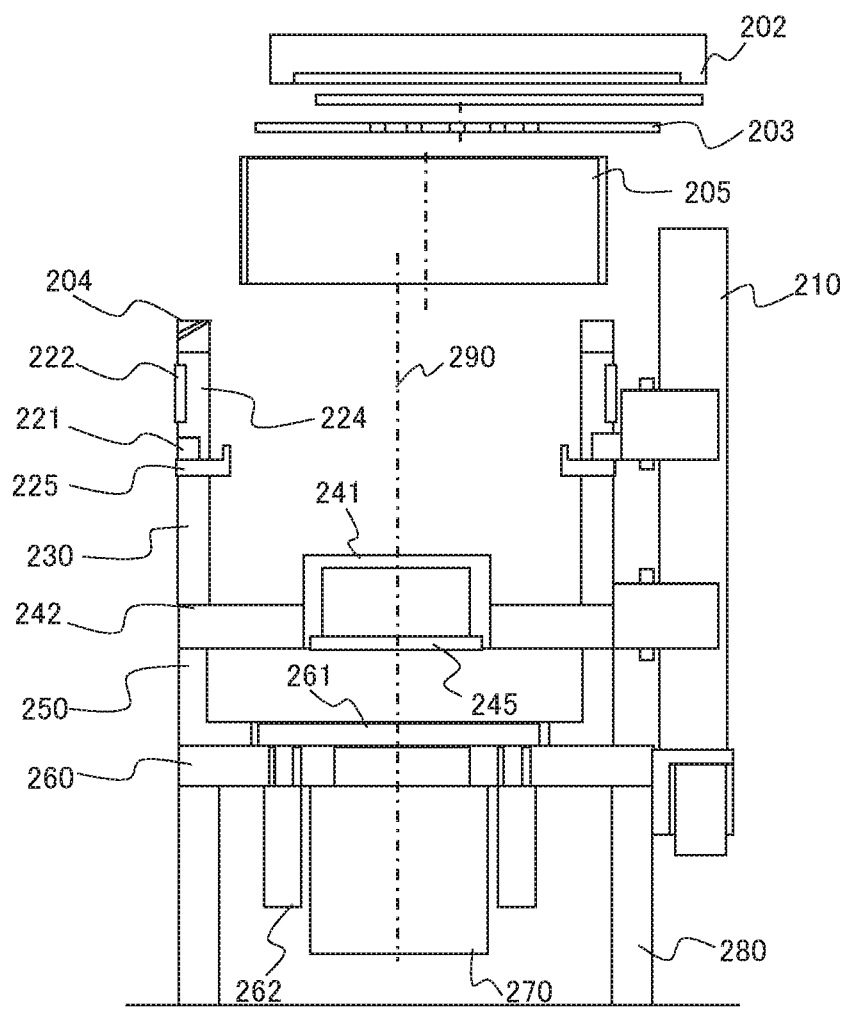

Next, as illustrated in FIGS. 6A and 6B, the quartz plate 202, and the shower plate 203 and the quartz inner cylinder 205 below the quartz plate 202 are moved upward and demounted. Thereby, the gas introduction ring 204 is exposed to an upper end of the vacuum processing chamber.

Figure 7A:
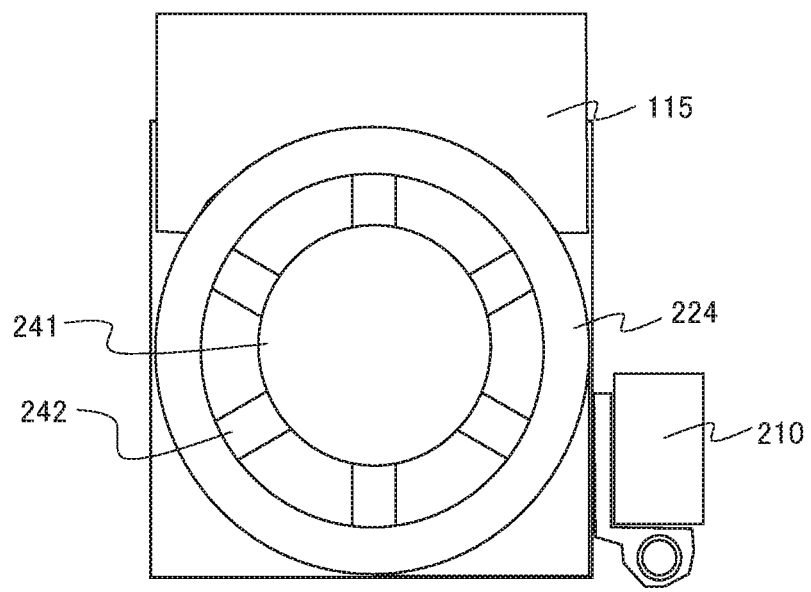
FIGS. 7A and 7B are a top view and a longitudinal sectional view illustrating a procedure of maintenance in the vacuum processing chamber of the vacuum processing apparatus according to the embodiment of the invention illustrated in FIGS. 1A and 1B.
Figure 7B:
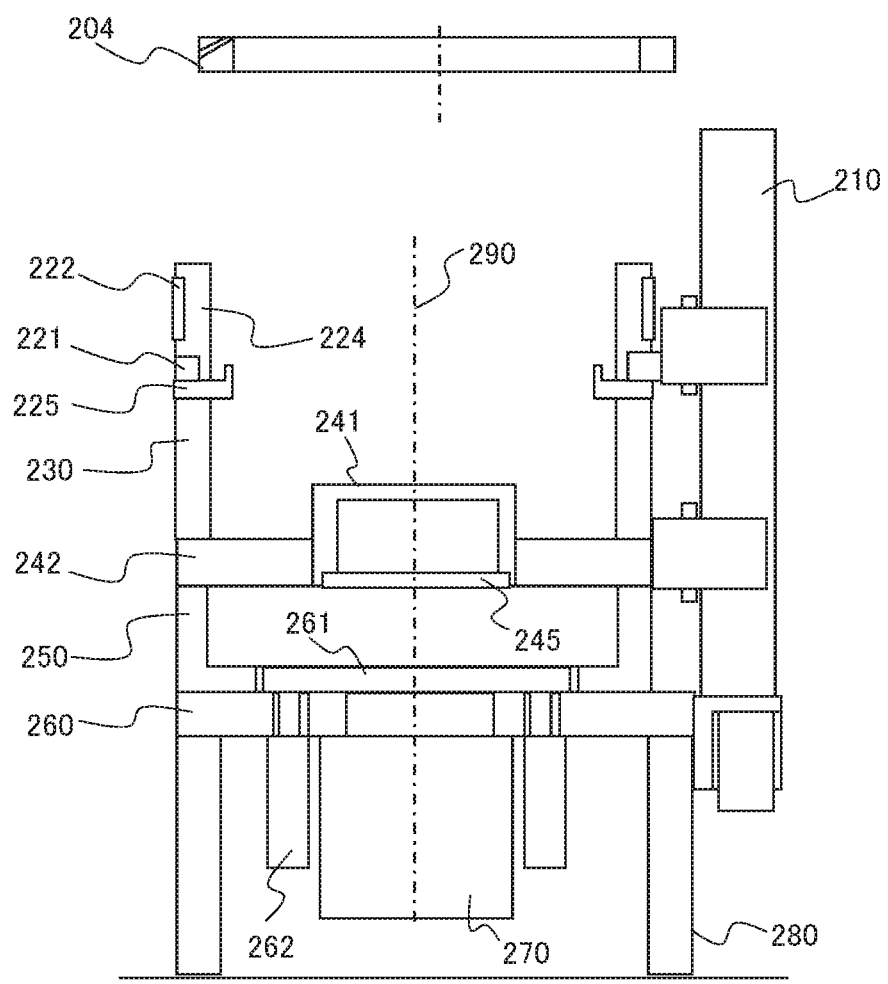

The specimen stage 241 and portions of the support beams of the specimen stage base 242 are exposed inside the vacuum processing chamber. Next, as illustrated in FIGS. 7A and 7B, the gas introduction ring 204 is moved upward and demounted.

Figure 8A:
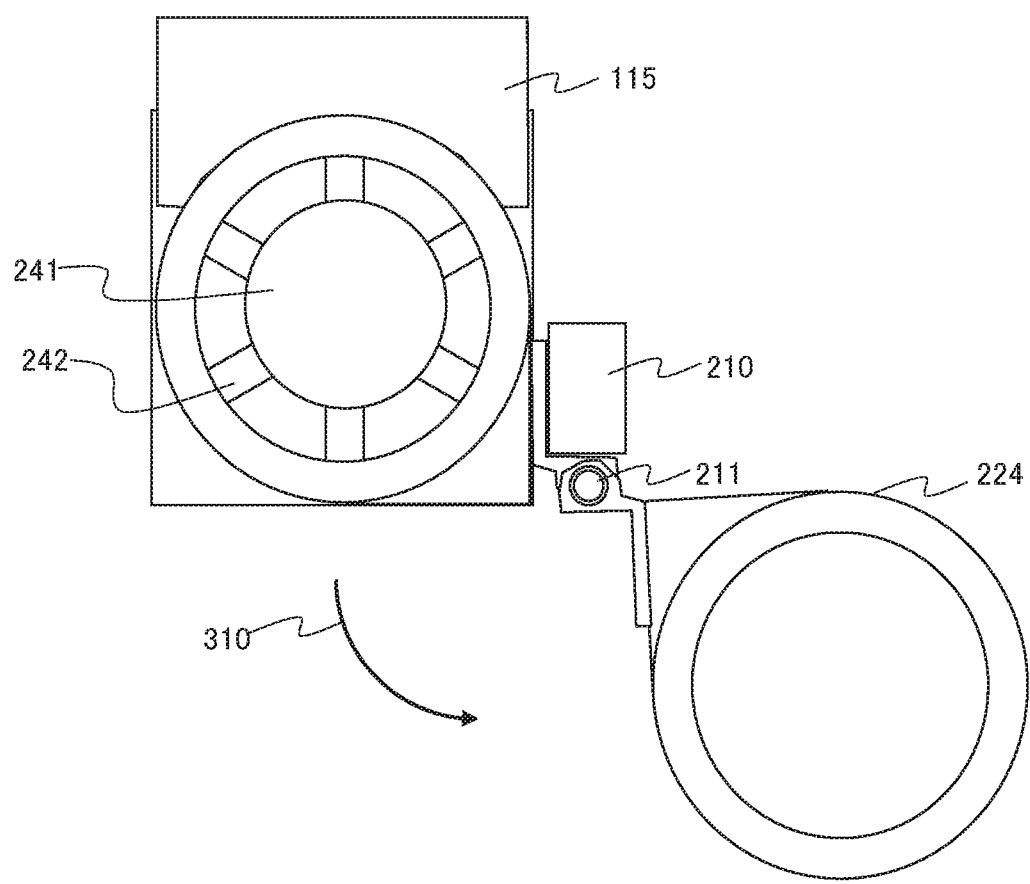
FIGS. 8A and 8B are a top view and a longitudinal sectional view illustrating a procedure of maintenance in the vacuum processing chamber of the vacuum processing apparatus according to the embodiment of the invention illustrated in FIGS. 1A and 1B.
Figure 8B:
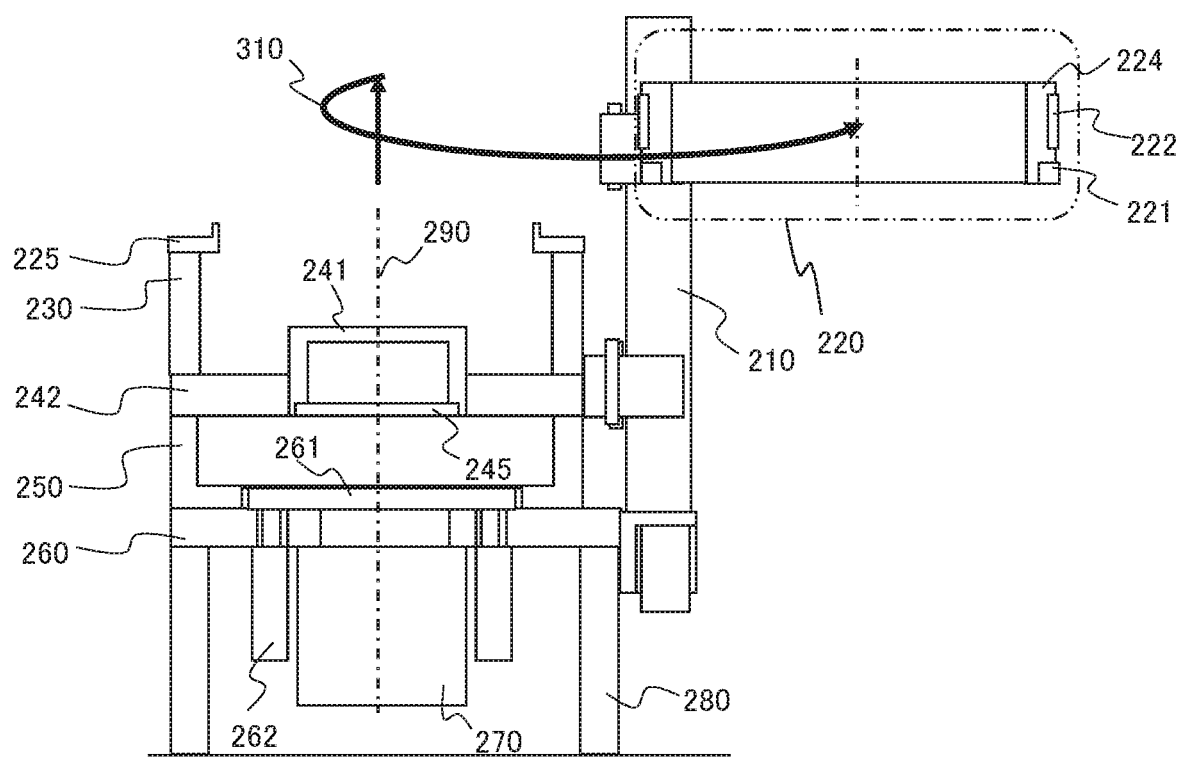

Continuously, as illustrated in FIGS. 8A and 8B, the discharge block base 221 fixed to a movable portion of the turning lifter 210, and a discharge block unit 220 including the discharge block 224 and the heater 222 mounted on the discharge block base 221 are moved upward centered on a turning shaft 211 as indicated by an arrow 310, then are horizontally turned in a counterclockwise direction, and thereby are moved out of a region of the vacuum processing chamber when viewed from vertically above. In the present embodiment, the discharge block unit is turned in the counterclockwise direction, but it may be configured to be turned in a clockwise direction by changing a position of the turning lifter to the opposite side (changing a right side layout to a left side layout in the figure).

A distance at which the discharge block unit 220 is moved upward is set to be equal to or greater than a height that exceeds a protrusion of the earth ring 225. In the present embodiment, the distance is set to 5 cm, but it is not limited thereto.

When the height of the protrusion of the earth ring is low, the distance by which the O-ring 207 gets away from the discharge block unit 220 or the earth ring 225 is set to be equal to or greater than a height (several centimeters). A turning angle is set to 180 degrees, but it may be set to be no less than 90 degrees and no more than 270 degrees.

However, considering workability, the turning angle is preferably 180□□20□. Discharge related members that are not the targets for the normal maintenance are turned together as the discharge block unit 220, and thereby these members can be rapidly easily avoided from the upper portion of the vacuum processing chamber. The discharge block unit 220 is avoided, and thereby the earth ring 225 is exposed to the upper end of the vacuum processing chamber.

Figure 9A:
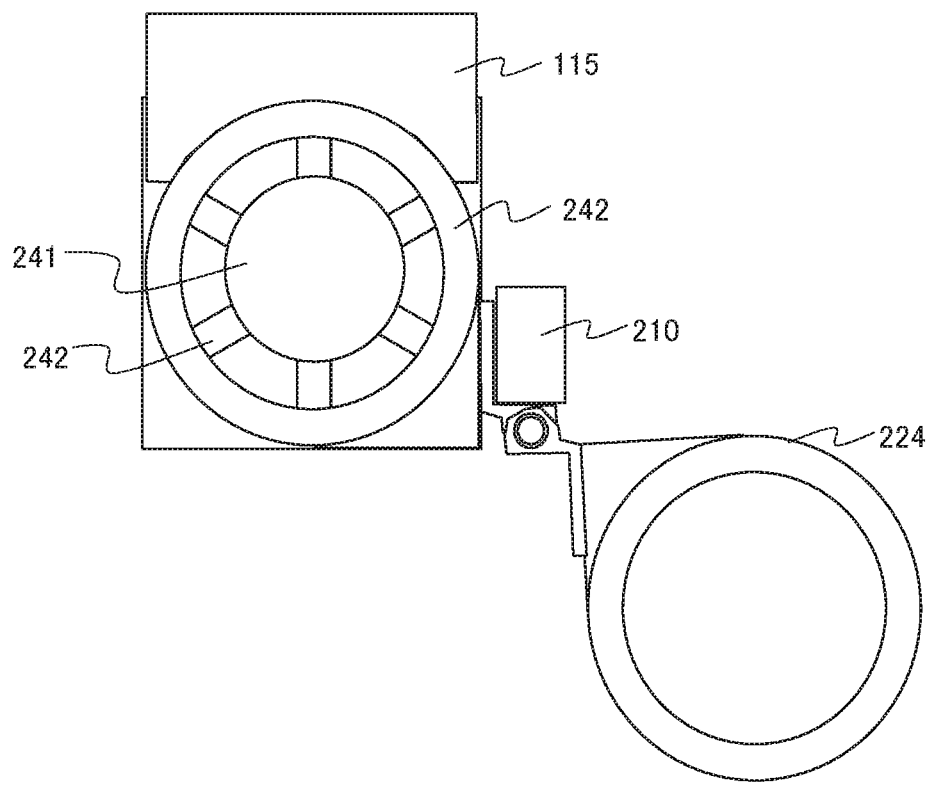
FIGS. 9A and 9B are a top view and a longitudinal sectional view illustrating a procedure of maintenance in the vacuum processing chamber of the vacuum processing apparatus according to the embodiment of the invention illustrated in FIGS. 1A and 1B.
Figure 9B:
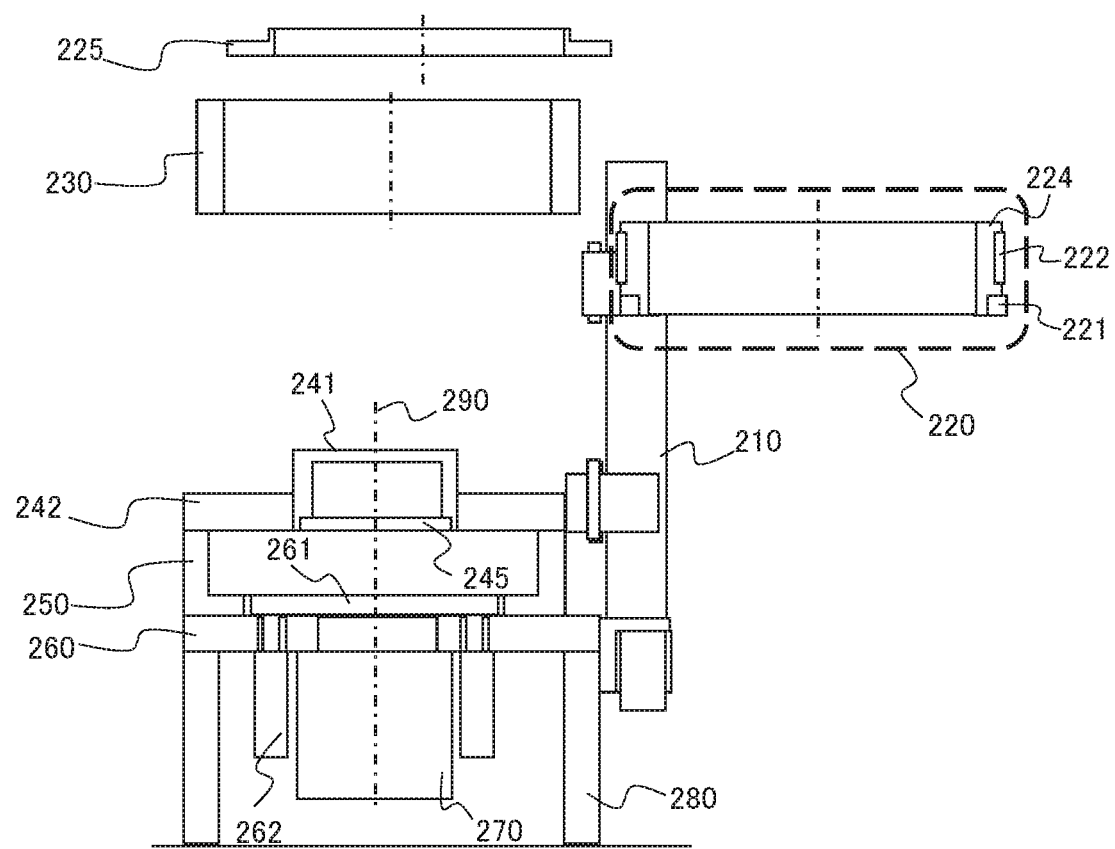

Next, as illustrated in FIGS. 9A and 9B, the earth ring 225 and the upper vessel 230 that is the main target member for the normal maintenance are moved upward and demounted. That is, the upper vessel 230 can be easily demounted in a swappable (interchangeable) state.

In the present embodiment, the vacuum partition wall itself (the upper vessel) constituting the vacuum processing chamber is interchangeable. Thereby, a maintenance time of the upper vessel 230 from dismantlement of the vacuum processing chamber can be kept to the minimum.

When the maintenance is performed, the first gate valve is kept closed, and the second gate valve is kept open. The first gate valve 111 is closed to maintain the vacuum transfer chamber 104 in a vacuum-sealed state. Thereby, processing in another vacuum processing chamber becomes possible, and a drop in operation rate as the vacuum processing apparatus can be kept to the minimum.

Meanwhile, the second gate valve 112 is kept open, and thereby the upper vessel 230 and the valve box 115 can be separated. The upper vessel 230 is demounted while removing the screws by which the upper vessel 230 and the base plate 260 are fixed at the flange parts.

The discharge block unit is moved by the control unit for controlling the turning lifter. This control unit may be exclusively used for the turning lifter, or be assembled as a part of the control unit of the entire vacuum processing apparatus. The upper vessel 230 is demounted, the ring portion of the specimen stage base 242 is exposed in addition to the specimen stage 241 and the support beams.

Figure 10A:
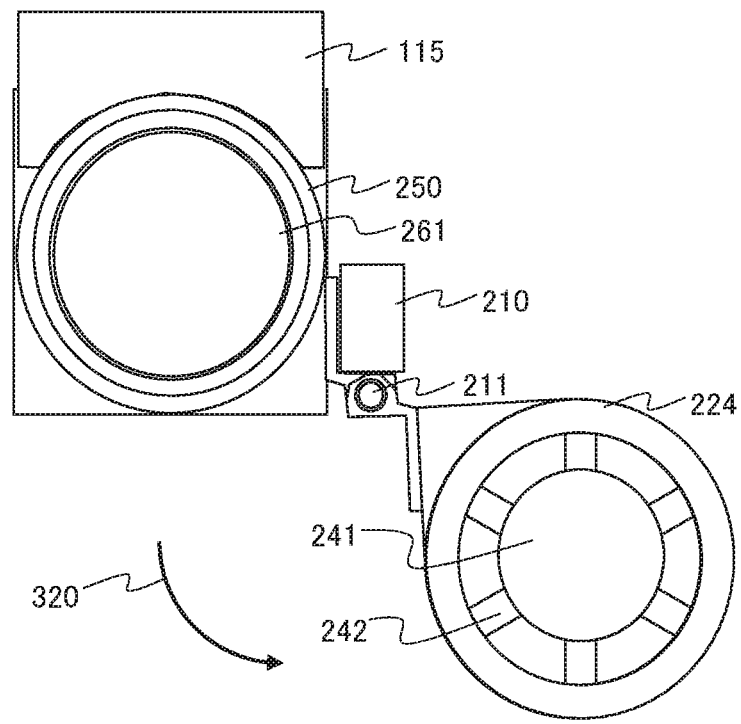
FIGS. 10A and 10B are a top view and a longitudinal sectional view illustrating a procedure of maintenance in the vacuum processing chamber of the vacuum processing apparatus according to the embodiment of the invention illustrated in FIGS. 1A and 1B.
Figure 10B:
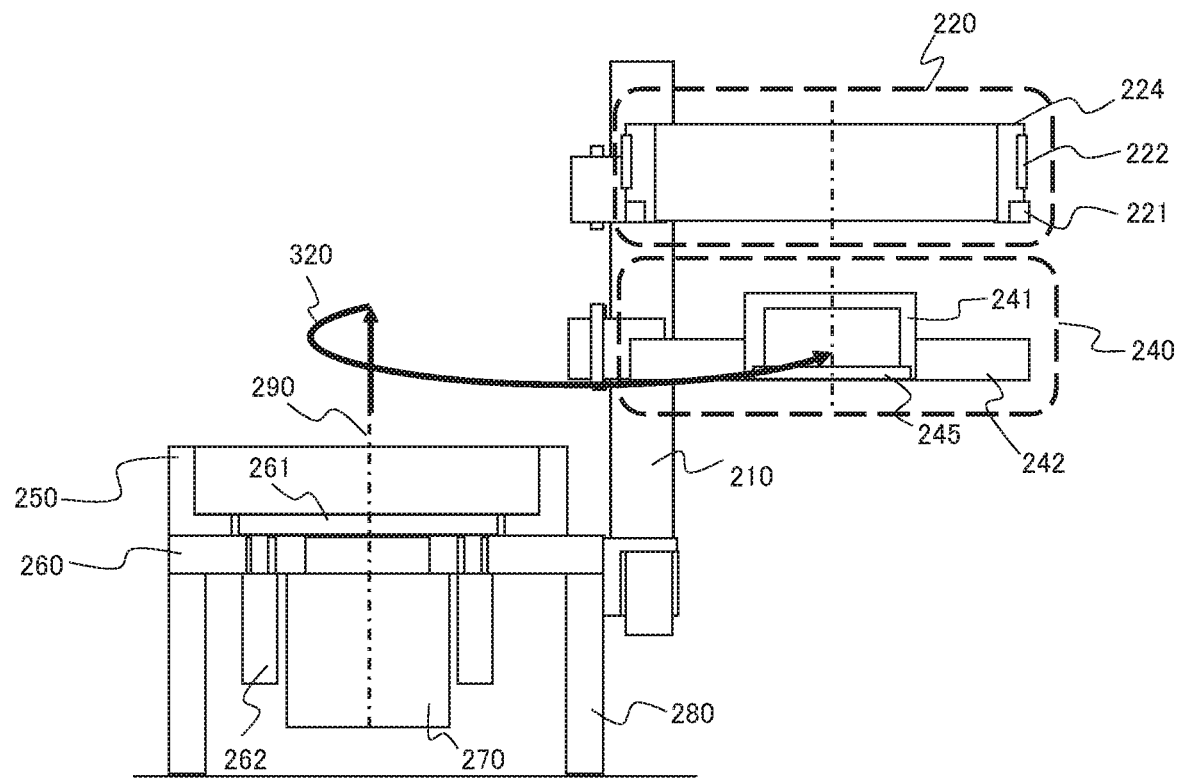

Next, as illustrated in FIGS. 10A and 10B, the specimen stage base 242 fixed to the movable part of the turning lifter 210, and a specimen stage unit 240 including the specimen stage 241 and the specimen stage bottom lid 245 mounted on the specimen stage base 242 are moved upward centered on the turning shaft 211 as indicated by the arrow 320, then are horizontally turned in the counterclockwise direction, and thereby are moved out of the region of the vacuum processing chamber when viewed from vertically above. In the present embodiment, the specimen stage unit is turned in the counterclockwise direction, but it may be configured to be turned in the clockwise direction by changing the position of the turning lifter to the opposite side (changing the right side layout to the left side layout in the figure).

A distance at which the specimen stage unit 240 is moved upward is set to be equal to or greater than a height by which the O-ring 207 is separated from the specimen stage unit 240 or the lower vessel 250. In the present embodiment, the distance is set to 2 cm, but it is not limited thereto.

A turning angle is preferably set to be identical to that of the discharge block unit 220. Thereby, when viewed from vertically above, a total area of both the discharge block unit 220 and the specimen stage unit 240 can be reduced.

The specimen stage related members that are not the targets for the normal maintenance are turned together as the specimen stage unit 240, and thereby these members can be rapidly easily avoided from the upper portion of the vacuum processing chamber. The specimen stage unit 240 is moved by the control unit for controlling the turning lifter.

This control unit may be exclusively used for the turning lifter, or be assembled as a part of the control unit of the entire vacuum processing apparatus. The specimen stage unit 240 is avoided, and thereby the lower vessel 250 is exposed to the upper end of the vacuum processing chamber. A whole area of the exhaust unit lid 261 is exposed.

Figure 11A:
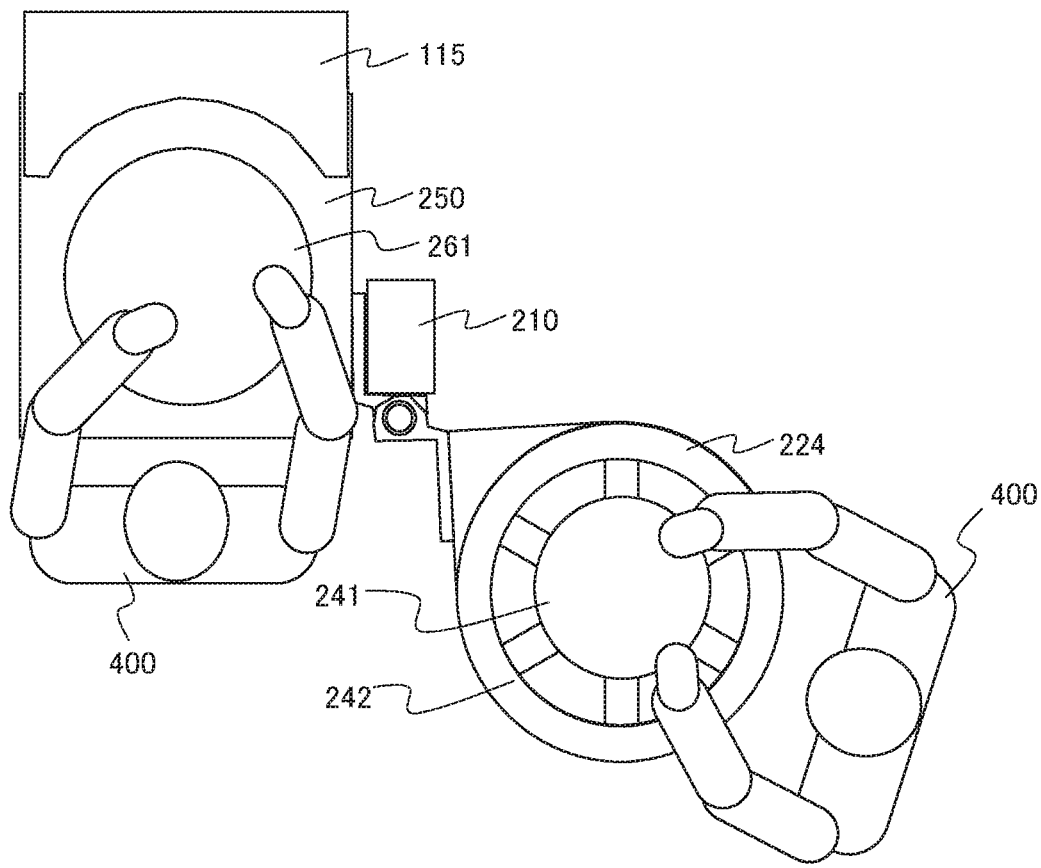
FIGS. 11A and 11B are a top view and a longitudinal sectional view illustrating a procedure of maintenance in the vacuum processing chamber of the vacuum processing apparatus according to the embodiment of the invention illustrated in FIGS. 1A and 1B.
Figure 11B:
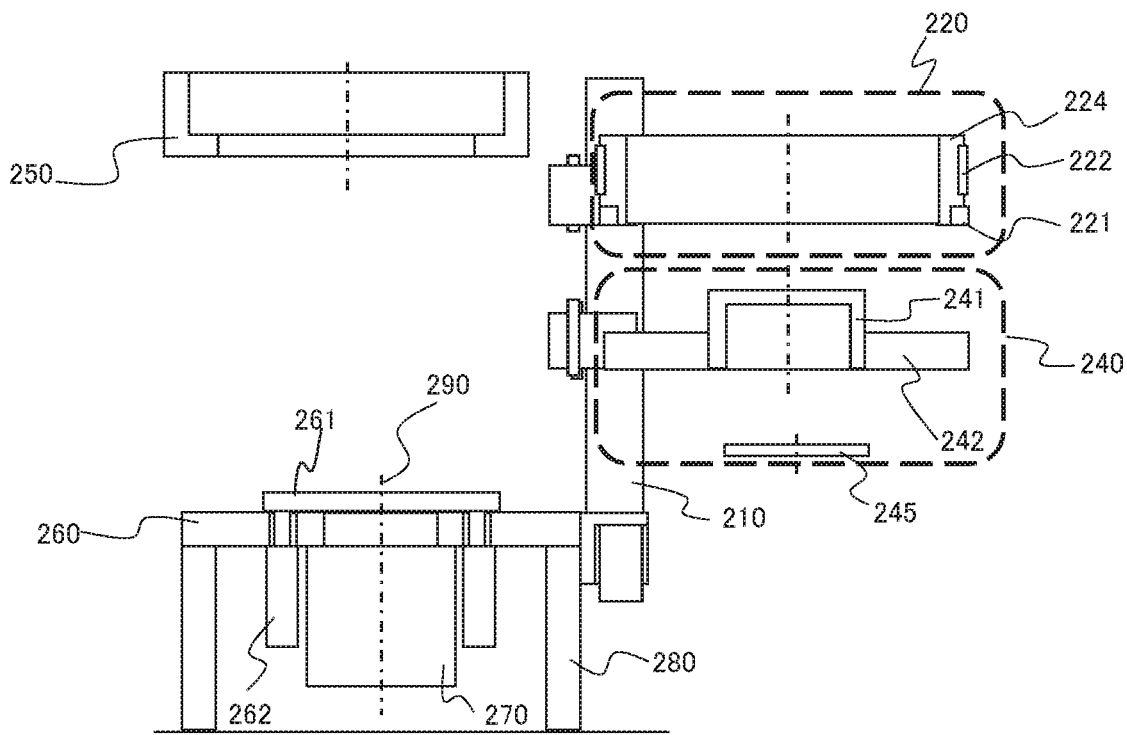

Continuously, after the screws by which the lower vessel 250 and the base plate 260 are fixed at the flange parts are removed, the lower vessel 250 that is the main target member for the normal maintenance is moved upward and demounted, as illustrated in FIGS. 11A and 11B.

That is, the lower vessel 250 can be easily demounted in a swappable (interchangeable) state. Thereby, a maintenance time of the lower vessel 250 from dismantlement of the vacuum processing chamber can be kept to the minimum.

After the lower vessel 250 is demounted, inspection and maintenance of surfaces of the base plate 260 and the exhaust unit lid 261 are performed. Typically, the exposed part of the base plate 260 is covered with the lower vessel 250, and thus the adhesion of the reaction product is small.

An upper surface of the exhaust unit lid 261 is disposed below the specimen stage when the workpiece is processed, and the adhesion of the reaction product is small. However, the upper surface of the exhaust unit lid 261 can be cleaned as needed. Since the periphery of the base plate 260 is flat without the walls or the like (obstacles in view of the maintenance) constituting the vacuum processing chamber, work efficiency of the maintenance of a worker 400 (not illustrated in FIG. 10B) can be improved.

After the cleaning, the inspection and maintenance, and the interchange of the target members for the normal maintenance (especially, the upper vessel and the lower vessel) are performed, these members are assembled in a procedure opposite to the above description, and are used for the vacuum processing.

Next, a procedure of the abnormal maintenance will be described. Target members for the abnormal maintenance are mainly the members constituting the discharge block unit 220 and the members constituting the specimen stage unit 240.

In the case of the members constituting the discharge block unit 220, as illustrated in FIGS. 8A and 8B, after the discharge block unit 220 is lifted upward and turned in a horizontal direction, maintenance such as inspection and interchange of the heater 222 and inspection, cleaning, and the like of the inner wall of the discharge block 224 can be performed from a desired direction. Since the discharge block unit 220 is avoided from the members constituting the other vacuum processing chamber, work efficiency can be improved.

In the case of the members constituting the specimen stage unit 240, as illustrated in FIGS. 10A and 10B, after the specimen stage unit is lifted upward and turned in a horizontal direction, the specimen stage bottom lid is demounted as illustrated in FIG. 11B, and maintenance of various power cords, sensor wiring, temperature adjusting components, and the like can be performed from a desired direction. At least one of a wiring cord used to electrostatically adsorb the workpiece to the specimen stage, a wiring cord used to apply the high-frequency bias to the specimen stage, a wiring cord or refrigerant pipes used to control the temperature of the specimen stage, and a wiring cord used to detect the temperature of the specimen stage is disposed in the internal cavity of the support beam, and these are also the targets for the abnormal maintenance.

When the discharge block unit 220 is an obstacle of work, the discharge block unit 220 can be turned in a clockwise direction to a region in which the vacuum processing chamber is disposed when viewed from vertically above or its neighborhood. Thereby, work efficiency of the specimen stage unit 240 can be improved. The turning angles of the discharge block unit and the specimen stage unit are properly shifted, and thereby both the units can be subjected to the maintenance at the same time, and thus the work efficiency is improved.

In the present embodiment, the discharge block unit and the specimen stage unit are lifted upward and then turned in the horizontal direction, but they may be configured to be lifted and pulled out linearly in the horizontal direction. Thereby, a movement range can be minimized. A configuration of a movement mechanism is simplified. However, the turning in the horizontal direction is advantageous in that a work space for the maintenance is secured.

In the present embodiment, the lower vessel as well as the upper vessel is interchanged. However, the present embodiment may be configured to attach a liner (a cover) to cover an inner surface of the lower vessel and to interchange the liner.

In the present embodiment, one turning lifter is provided to turn the discharge block unit and the specimen stage unit in the same direction. However, when a work region can be secured, two turning lifters may be provided to turn the units in different directions. The turning lifter for the discharge block unit and the turning lifter for the specimen stage unit are provided, and thereby heights of the units can be freely set. Since more workers can be disposed, concurrent progress of work can be easily performed, and the work can be completed in a short time. The work efficiency is improved.

In the embodiment, movement of the components other than the discharge block unit and the specimen stage unit that are moved using the turning lifter is performed by hands, but a lifting machine such as a crane may also be used.

Figure 12A:
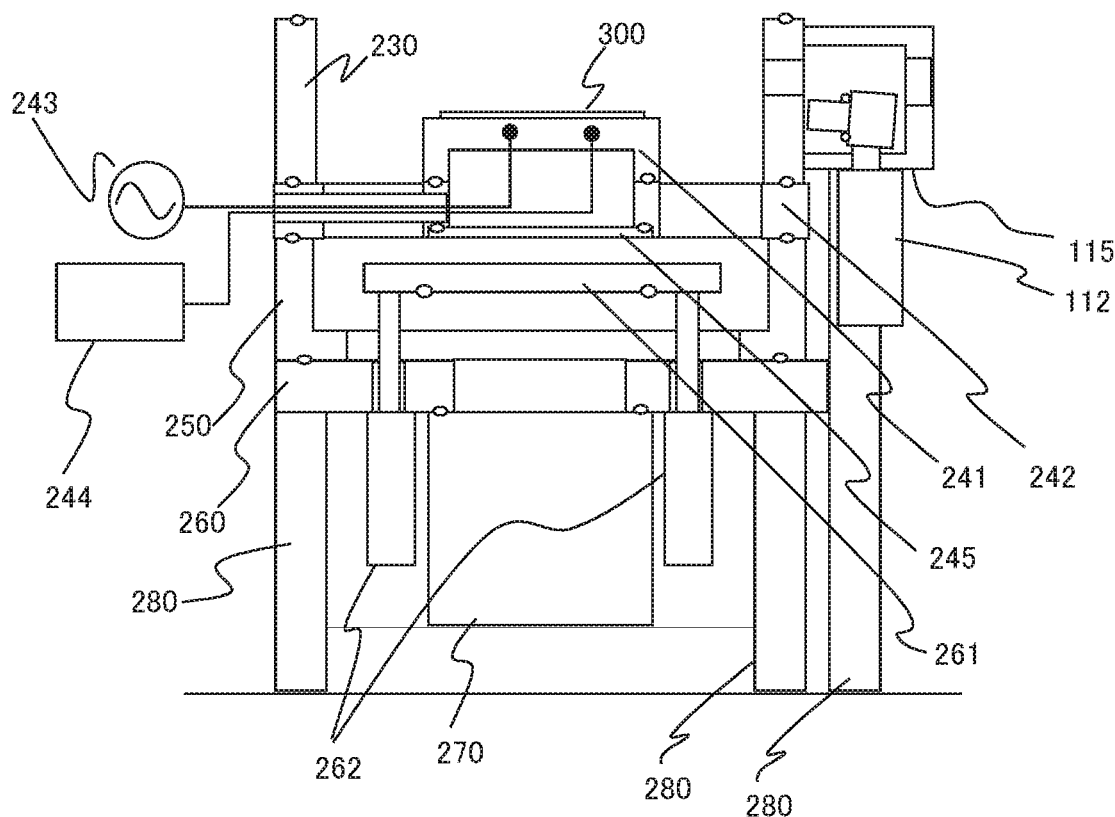
FIGS. 12A and 12B are longitudinal sectional views schematically illustrating an outline of the configuration of the vacuum processing chamber of the embodiment illustrated in FIG. 3.
Figure 12B:
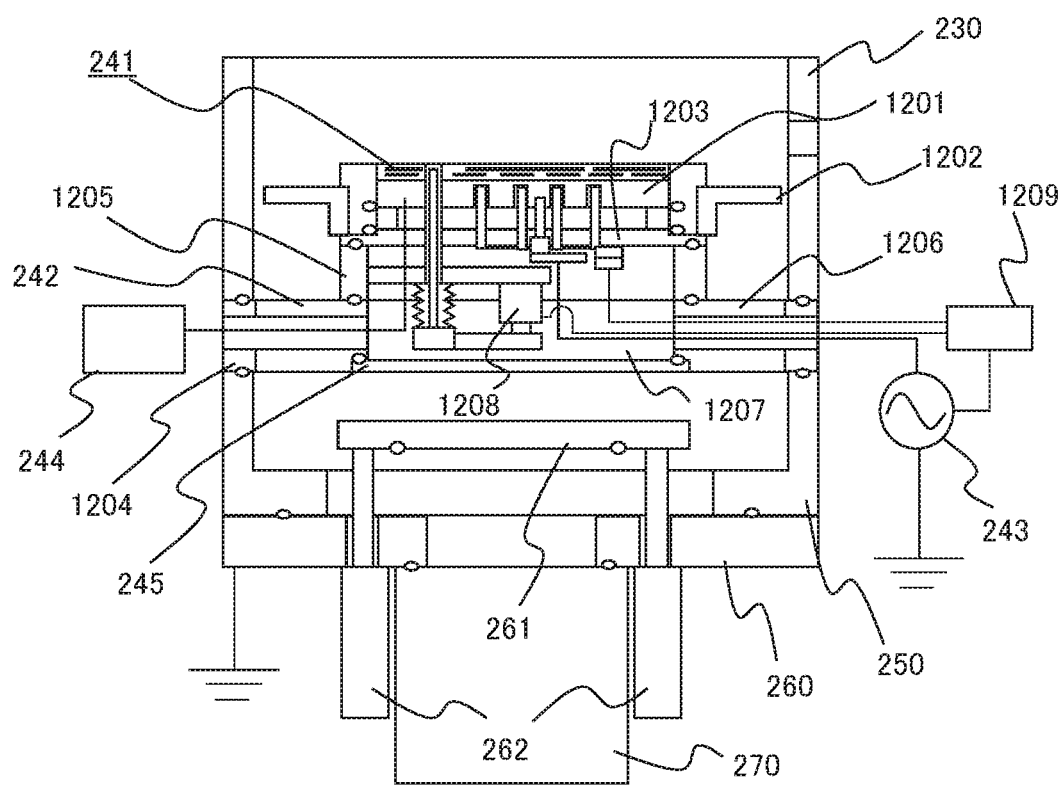

The configuration of the vacuum processing chamber according to the present embodiment will be described in greater detail using FIGS. 12A to 15. FIGS. 12A and 12B are longitudinal sectional views schematically illustrating the outline of the configuration of the vacuum processing chamber according to the embodiment illustrated in FIG. 3.

Especially, FIG. 12A is an enlarged longitudinal sectional view illustrating a lower portion of any of the vacuum processing chambers 200-1 to 200-4 illustrated in FIG. 3 or FIG. 4, and the members such as the first high-frequency power supply 201, the lid member 202, and the coil 206 that are disposed at an upper portion of any of the vacuum processing chambers 200-1 to 200-4 are omitted. That is, the lower portion of any of the vacuum processing chambers 200-1 to 200-4 illustrated in FIG. 3 or FIG. 4 from the upper vessel 230 is enlarged and illustrated.

Any of the vacuum processing chambers 200-1 to 200-4 illustrated in FIG. 3 or FIG. 4 is called a vacuum processing unit 2001 in the following description of FIGS. 12A to 15. When roughly classified, the vacuum processing chamber 2001 illustrated in this figure includes a vacuum vessel, a pedestal that is disposed below the vacuum vessel and supports the vacuum vessel from below, and exhaust unit that is connected to a lower side of the pedestal, communicates with an internal space of the vacuum vessel, and exhausts the internal space.

In this figure, description of the portions to which the reference signs illustrated in the previously described figures such as FIG. 3 are given will be omitted unless it is necessary. Further, the second gate valve 112 that abuts on the sidewall of the vacuum vessel around a gate that is an opening disposed on the sidewall of the vacuum vessel and communicates between the inside and the outside of the internal space of the vacuum vessel, blocks the gate, and airtightly seals or open the gate, and the box 115 in which the second gate valve 112 is provided are illustrated.

Like the embodiment of FIGS. 3 and 4, the vacuum vessel of the vacuum processing chamber 2001 of this figure includes an upper vessel 230, a specimen stage base 242 under the upper vessel 230, and a lower vessel 250 disposed under the specimen stage base 242, and is configured such that these are placed and layered in a vertical direction. The lower vessel 250 is placed on an upper surface of a base plate 260 with a lower surface thereof brought into contact with the upper surface of the base plate 260. An internal space that is partitioned from the outside by the lower vessel 250, the specimen stage base 242, the upper vessel 230, and the second gate valve 112, a projection of a valve element of which is inserted into the gate, abuts on an outer wall of the upper vessel 230 close to an outer circumference of the gate across a seal member, and blocks the gate, and by an earth ring 225 and a discharge block unit 220 that are located at an upper side of the upper vessel 230 and are not illustrated is a space in which, in a state in which a wafer 300 is placed on an upper surface of a specimen stage 241, plasma is formed, and the wafer 300 reacting with particles in the plasma is processed. Hereinafter, this space is called a reaction processing chamber 2002.

The vacuum processing unit 2001 includes a plurality of struts 280, upper ends of which are connected to the base plate 260 and support the base plate 260 and the vacuum vessel on the base plate 260 between a lower surface of the base plate 260 that is the pedestal and a floor surface of a building in which the vacuum processing unit 2001 is disposed. The vacuum processing unit 2001 includes an exhaust pump 270 which communicates with an exhaust port that is disposed in the center of the base plate 260 and is used for exhaust from the inner portion in a space formed between the lower surface of the base plate 260 and the floor surface when the base plate 260 are supported by the struts 280 and which is disposed under the through-hole, and a cylinder 262 that is an actuator that vertically drives an exhaust unit lid 261, which is disposed inside the lower vessel 250 and opens or airtightly blocks the exhaust port, with respect to the exhaust port.

In the vacuum vessel of the vacuum processing unit 2001, the base plate 260 is electrically connected to a ground electrode, and has a ground potential. For this reason, the lower vessel 250, the specimen stage base 242, and the upper vessel 230 that are connected to the base plate 260 by bringing lower surfaces thereof into contact with the base plate 260 have the ground potential.

The exhaust unit includes the exhaust pump 270 such as a turbo molecular pump which communicates with the exhaust port that is the through-hole disposed in the base plate 260 and is disposed below the lower vessel 250 and under the exhaust port, and an exhaust duct (not shown) that connects an inlet of the exhaust pump 270 and the exhaust port and communicates with each other. In the vacuum processing unit 2001 of this figure, an outlet of the exhaust pump 270 is coupled to a roughing vacuum pump such as a rotary pump that is disposed in advance in the building to which the vacuum processing unit 2001 is grounded. The cylinder 262 is driven to move up and down relative to the exhaust port, and thereby the exhaust unit lid 261 increases and decreases an area of flow passage of the exhaust gas toward the exhaust port. Thereby, a flow rate or a speed of an exhaust gas discharged from the exhaust port is adjusted.

FIG. 12B is an enlarged longitudinal sectional view schematically illustrating a configuration of principal parts including the specimen stage base 242 illustrated in FIG. 12A. Especially, a configuration of the specimen stage 241 that is coupled to the specimen stage base 242, is disposed in the reaction processing chamber 2002 inside the vacuum vessel constituted of the upper vessel 230, the specimen stage base 242, and the lower vessel 250, and holds the wafer 300 placed on the upper surface thereof is enlarged and illustrated in greater detail.

As in FIG. 12A, in the vacuum processing unit 2001 illustrated in this figure, the vacuum vessel, the base plate 260 disposed under the vacuum vessel, and the exhaust unit disposed under the base plate 260 are disposed in a vertical direction. Further, the vacuum vessel is configured such that the upper vessel 230, the specimen stage base 242, and the lower vessel 250, each of which has a cylindrical inner sidewall surface, are connected in the vertical direction, and are disposed at positions that make central axes thereof in the vertical direction consistent with one another or are approximated such as to be regarded as such.

When roughly classified, a specimen stage block includes the specimen stage base 242 that forms a lower portion thereof, the specimen stage 241 including a head part 1201 that is placed and connected at an upper side of the specimen stage base 242 and has a cylindrical shape, and an outer circumferential ring 1202 that is disposed at the upper side of the specimen stage base 242 and at an outer circumferential side of the specimen stage 241 in a ring shape to surround them. In the present embodiment, these portions are mounted and demounted from the vacuum vessel or its lower portion and are configured to be interchangeable in a state in which an inner portion of the vacuum vessel reaches an atmospheric pressure and is opened in work in which maintenance of interchange, inspection, and the like of the components of the vacuum processing unit 2001 is performed.

The head part 1201 that forms an upper portion of the specimen stage 241 includes a base plate 1203 that is a plate-like member that has a circular shape and is made of metal, a base member that is placed on the base plate 1203, has a disc shape or a cylindrical shape, and is made of metal, and a film that is disposed to cover a circular upper surface of the base member and is formed of a dielectric. As will be described below, the base plate 1203 and the base member having the dielectric film are coupled to be integrally mountable and demountable.

The specimen stage base 242 is a member that functions as a pedestal on which the specimen stage 241 is placed, and includes a cylindrical base cylinder, a T flange 1205 that is placed and connected above the center of the base cylinder, above which the head part 1201 is placed, and which is connected to a lower surface of an outer circumference of the base plate 1203, and a storage space 1207 that is a space inside the base cylinder and the T flange 1205. As will be described below, the storage space 1207 is a space in which a pin drive unit 1208 for vertically moving a plurality of pins that move the wafer 300 up and down above the head part 1201, connectors to a sensor and electrodes connected to the head part 1201, and the like are disposed, and is maintained at the atmospheric pressure or the same pressure in the building to which the vacuum processing unit 2001 is grounded.

The base cylinder includes a ring-shaped base ring 1204 that forms an outermost circumferential portion and constitutes the vacuum vessel by sandwiching the top and bottom thereof between the upper vessel 230 and the lower vessel 250, a center cylinder that is disposed around the center of the base ring 1204 and has a cylindrical shape, and a plurality of support beams 1206 that are connected between the base ring 1204 and the center cylinder and are configured integrally. In the present embodiment, an inner circumference of the base ring 1204 and an outer circumference of the center cylinder have cylindrical shapes whose radii are different and which are disposed at positions in a horizontal direction which make the centers thereof in a vertical direction consistent with each other or which are approximated such as to be regarded as such. The support beams 1206 have axes that are radially arranged from the position of the central axis in a radial direction, and are arranged such that an angle between the neighboring axes has the same value or a value approximated such as to be regarded as such.

A lower surface of the center cylinder is configured such that the specimen stage bottom lid 245 can be mounted and demounted, and is mounted to airtightly seal and block the internal storage space 1207 against the center cylinder. The storage space 1207 includes a tubular space that is disposed to pass from inner portions of each support beam 1206 and the base ring 1204 to an inner portion of the center cylinder and an outer portion of the vacuum processing unit 2001 and to communicates with one another.

The T flange 1205 includes a space constituting the storage space 1207 at a cylindrical outer circumferential portion and an inner portion thereof, and the pin drive unit 1208 is disposed in the space. The cylindrical outer circumferential portion is configured such that an upper end thereof faces or abuts on a lower surface of an outer circumferential edge of the upper base plate 1203 across the seal member such as the O-ring, and a lower end thereof faces or abuts on a lower end of the center cylinder of the lower base cylinder across the seal member such as the O-ring.

In addition to the pin drive unit 1208, a pipe for a refrigerant supplied to the head part 1201 and wirings such as power supplying cables to sensors or electrodes are disposed in the storage space 1207 inside the specimen stage base 242. Internal passages of the support beams 1206 which constitute the storage space 1207 serve as spaces in which a pipe or a cable connected between the specimen stage 241 and a power supply or a refrigerant supply source disposed outside the vacuum processing unit 2001 is installed.

A plurality of temperature sensors that are inserted into a plurality of recesses disposed inside the base member and detect a temperature of the base member are configured such that ends thereof are disposed in the storage space 1207 and are connected to be communicable with the ends and vessel controller 1209 disposed outside the base ring 1204 or the vacuum processing unit 2001 through the internal spaces of the support beams 1206 by cables, and output of each temperature sensor transmitted during the processing the wafer 300 can be received by the vessel controller 1209. Like the pin drive unit 1208, the temperature sensors are communicably connected to the vessel controller 1209 by the cables, and an operation of the pin drive unit 1208 is adjusted according to an instruction signal from the vessel controller 1209.

High-frequency power having a lower frequency than a frequency of an electric field for forming plasma is supplied to the base member made of metal during the processing of the wafer 300, and a bias potential is formed on the wafer 300 placed on an upper surface of the film made of a dielectric. In the present embodiment, a connector for receiving the high-frequency power for the bias potential from the second high-frequency power supply 243 is inserted into the base member, is electrically connect to the base member, and is mounted on the head part 1201, and a power supplying cable that is electrically connected between an end of the connector disposed inside the storage space 1207 and the second high-frequency power supply 243 is disposed in the storage space 1207 including the internal space of the specific support beam 1206.

A refrigerant flow passage through which a refrigerant whose temperature is adjusted to a value within a predetermined range is supplied to circulate is disposed in the base member made of metal. This refrigerant is adjusted in temperature at the second temperature controller 244 having a thermoregulator using a refrigeration cycle of a chiller or the like, and is supplied to the refrigerant flow passage in the base member by an internal pump, and is heat-exchanged and discharged. The discharged refrigerant returns to the second temperature controller 244 and is again adjusted in temperature, and then is supplied to the refrigerant flow passage in the base member.

The refrigerant pipes that connect the refrigerant flow passage and the second temperature controller 244 are also disposed in the storage space 1207 including the spaces of the support beams 1206.

The vessel controller 1209 includes an arithmetic unit, is disposed outside the vacuum processing unit 2001 or the vacuum vessel, and is connected to be communicable with a plurality of devices such as the pin drive unit 1208 which is disposed inside the specimen stage 241 and the storage space. The vessel controller 1209 receives signals from the communicably connected devices and detects information included in the signals, and transmits instruction signals to these devices to adjust operations of the devices.

The vessel controller 1209 of the present embodiment includes a computing unit configured of a semiconductor device, an interface that transceives a signal with respect to the unit, and a storage device such as a hard disk drive or a memory device such as RAM or ROM in which data is received and recorded or stored. These are connected to be communicable in the vessel controller 1209. The computing unit of the vessel controller 1209 that receives a signal from the outside via the interface detects information from the signal to store the information in the storage device, and reads software pre-stored in the storage device, calculates an instruction signal corresponding to a previous signal along an algorithm recorded in the software, and transmits the instruction signal to a unit to be controlled through the interface.

The storage device of the vessel controller 1209 may be mounted in the vessel controller 1209 or be disposed to be communicable to the outside. The vessel controller 1209 of the present embodiment is connected to the temperature sensors and the pin drive unit 1208.

Figure 13A:
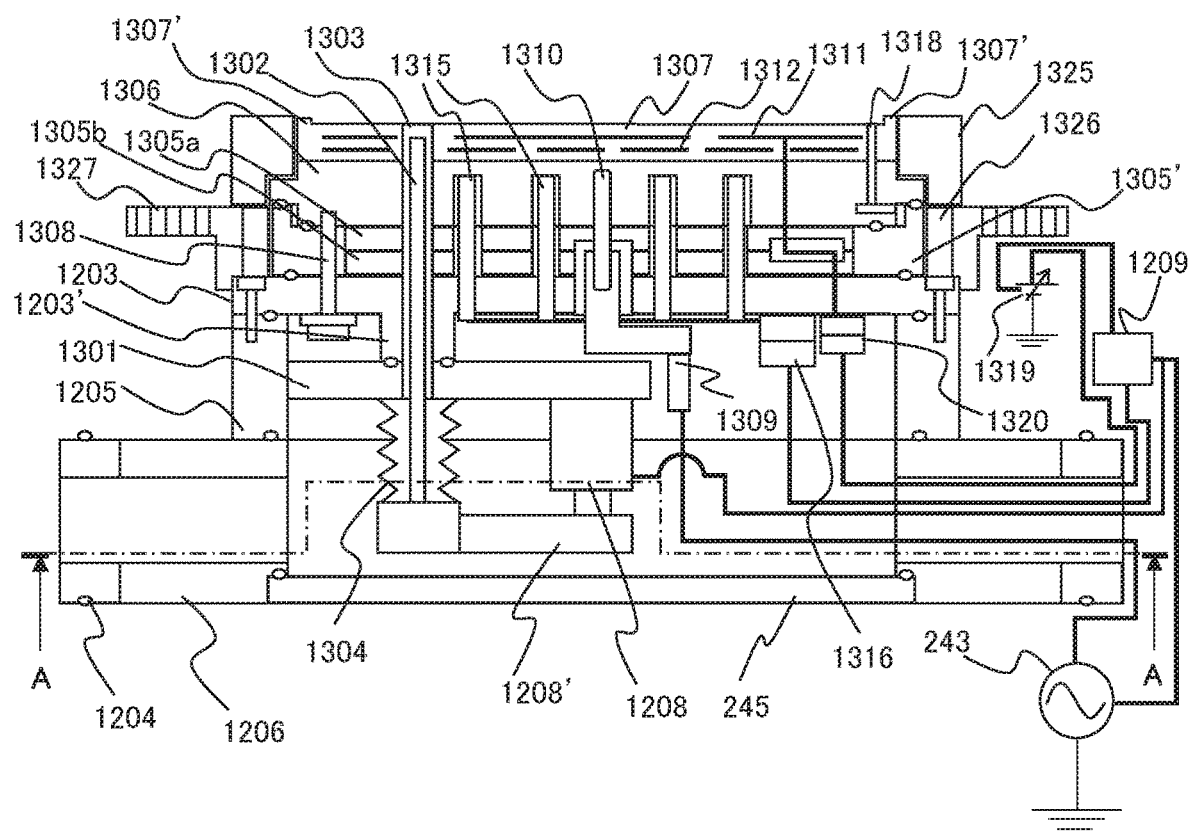
FIGS. 13A and 13B are enlarged longitudinal sectional views schematically illustrating a configuration of a specimen stage of the vacuum processing chamber of the embodiment illustrated in FIGS. 12A and 12B.
Figure 13B:
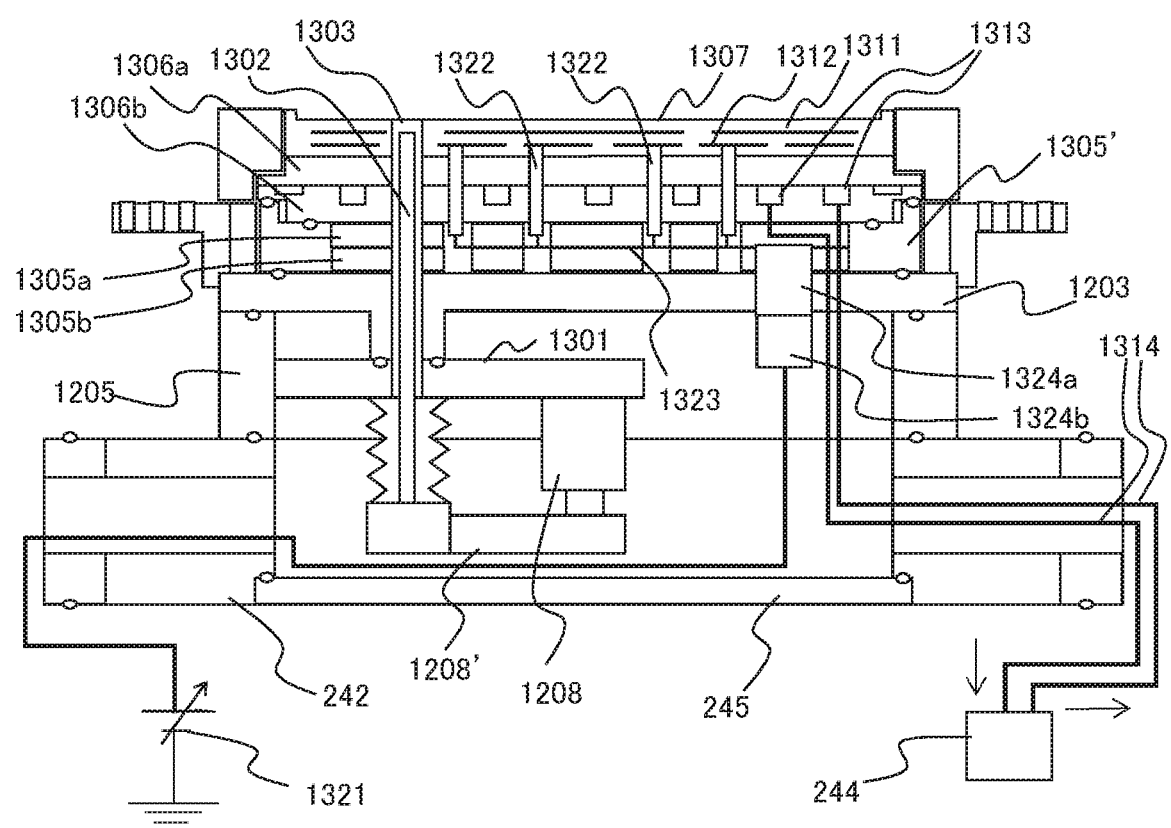

The configurations of the principal parts of the specimen stage block of FIG. 12B are enlarged and described more specifically. FIGS. 13A and 13B are enlarged longitudinal sectional views schematically illustrating a configuration of the specimen stage of the vacuum processing chamber according to the embodiment illustrated in FIGS. 12A and 12B. In the present embodiment, FIGS. 13A and 13B are views illustrating cross sections cut by longitudinal planes passing through the central axes of the specimen stage 241 and the specimen stage base 242 in different directions.

The specimen stage block illustrated in FIG. 13A includes the specimen stage 241, the specimen stage base 242, and the outer circumferential ring 1202. As illustrated in FIGS. 10A and 10B, the specimen stage block is configured to rotate the specimen stage base 242 about a vertical axis of the turning lifter 210 and to allow the specimen stage base 242 to move from the upper side of the lower vessel 250 along with the specimen stage 241 after the portions located above the specimen stage base 242 including the upper vessel 230 of the vacuum processing unit 2001 is demounted from the specimen stage base 242.

As illustrated in FIGS. 13A and 13B, the specimen stage block is configured such that the specimen stage 241, on a lower surface of which the base plate 1203 is provided, is placed above the specimen stage base 242 and these are demountably connected via fastening unit such as bolts. In this state, the outer circumferential ring 1202 made of metal is disposed on an upper surface of the outer circumferential edge of the upper base plate 1203 at the outer circumferential side of the specimen stage 241.

The specimen stage base 242 includes the base cylinder including the outer circumferential ring 1202, the support beams 1206, and the center cylinder, and the T flange 1205 that is disposed to abut on or face the base cylinder across the seal member such as the O-ring on an upper side thereof. Further, the specimen stage base 242 includes the storage space 1207 in which these are connected and disposed.

The T flange 1205 has the cylindrical shape as described above, and includes a cylindrical part that forms an outer circumferential sidewall of the specimen stage base 242 in the vacuum processing unit 2001, and a T-shaped or Y-shaped beam part 1301 that is disposed in the storage space 1207 inside the cylindrical part and is integrally connected to or formed on a cylindrical inner circumferential wall of the cylindrical part. Further, an upper end of the cylindrical part is disposed on the base plate 1203 of the head part 1201 of the specimen stage 241 across the O-ring, and a lower end of the cylindrical part is disposed on the center cylinder of the base cylinder across the O-ring. Thereby, the storage space 1207 is airtightly sealed against the vacuum processing unit 2001.

Ends of the T-shaped or Y-shaped beam part 1301 are integrally connected to or formed on an inner circumferential wall surface of the cylindrical part and are disposed inside the cylindrical part, and the space constituting the storage space 1207 is formed between a plurality of beams that extend from the center of the beam part 1301 to the inner circumferential wall surface of the cylindrical part. The space between these beams becomes a path through which the wiring such as the cables of the sensors and connectors and the refrigerant and gas pipes that are connected inside the head part 1201 through the base plate 1203 are disposed and pass.

The beam part 1301 includes beams, and is a plate-shaped member. A tip of each beam is integrally connected to or formed at a middle position between upper and lower ends in a height direction of the cylindrical inner circumferential wall surface of the cylindrical part, and a space is formed between an upper surface of the beam part 1301 and the lower surface of the upper base plate 1203 in a state in which the base plate 1203 is placed above the T flange 1205 and the inner portion is enclosed. The space between the base plate 1203 and the beam part 1301 is also used as the space in which the connectors and the sensors are disposed. Further, as described above, the upper end of the pin drive unit 1208 is connected to the lower surface of the center of the beam part 1301, and holes through which a plurality of pins 1302 (three pins in the present embodiment) pass are disposed in each beam. The plurality of pins 1302 are coupled to the lower end of the pin drive unit 1208 and are moved in a vertical direction depending on an operation of the pin drive unit 1208 which is expanded and contracted.

These pins 1302 are inserted into through-holes 1303 that pass through the head part 1201 including the upper base plate 1203 and communicate with openings disposed on the dielectric film forming the upper surface of the head part 1201, and perform operations of vertically releasing, approaching, and placing the wafer 300, which is placed above the dielectric film by the movement in the vertical direction, with respect to the upper surface of the head part 1201 or the specimen stage 241. For this reason, spaces in outer circumferential sides of the pins 1302 located in the storage space 1207 communicate with the vacuum processing unit 2001, and an airtight seal is formed between the communicating space and the inner portion of the vacuum processing unit 2001 on the outer circumferential sides of the pins 1302 between the storage space 1207 above and below the through-holes for the pins of the beam part and the pins. Thus, seal members such as O-rings are disposed around the through-holes for the pins of the beam part.

That is, projections 1203', each of which has a cylindrical shape or a frustum shape that protrudes downward from the lower surface of the base plate 1203 around the projection and in the center of each of which the through-hole 1303 through which the pin 1302 passes and is stored inside is disposed, are disposed in multiple places (three places in the present embodiment) of the lower base plate 1203. In a state in which the base plate 1203 and the T flange 1205 are vertically coupled, a lower end face of each of the projections 1203' and an upper surface around the through-hole for the pin disposed at each of the beams of the beam part 1301 abut on or face each other, and the seal member such as the O-ring is interposed therebetween. An airtight seal is formed between the space inside the through-hole for the pin of each of the beams, the space inside the through-hole 1303 in the head part 1201, and the storage space 1207 outside the spaces.

The pins 1302 are connected to upper surfaces of tips of three arms connected to the lower end of the pin drive unit 1208 due to the vertical expansion/contract operation of the pin drive unit 1208 whose upper end is coupled to the lower surface of the center of the beam part 1301 in the storage space 1207, and extend from the upper surfaces of the tips of the three arms to inner portions of the through-holes 1303 inside the head part 1201. An upper tip of each of the pins is located at the maximum height upward from the upper surface of the specimen stage 241 in a state in which the pin drive unit 1208 is contracted to the maximum, and is located in the through-hole 1303 inside the head part 1201 in a state in which the pin drive unit 1208 is expanded to the maximum.

Bellows 1304, which are connected between the lower surfaces of the beams and upper surfaces of the arms to which the pins 1302 are connected, and are contracted depending on vertical movement of the arms and the pins 1302, are disposed on outer circumferences of the pins 1302 located below the beams of the beam part 1301. Upper and lower ends of the bellows 1304 connected to the lower surface of each beam and the upper surface of each arm are coupled to abut on or face the lower surface of each beam and the upper surface of each arm with the seal member such as the O-ring interposed between the upper end and the lower surface of each beam and between the lower end and the upper surface of each arm, and an airtight seal is formed between an inner side of the bellows 1304, which communicate with the inner portion of the vacuum processing unit 2001 via the through-hole 1303 in which each pin 1302 is stored and the through-hole of each beam of the beam part 1301, and the storage space 1207 outside the bellows 1304.

With this configuration, the pins 1302 are moved in the vertical direction depending on the expansion and contraction between the maximum and the minimum of the pin drive unit 1207 driven by the instruction signal from the vessel controller 1209, and the bellows 1304 are expanded and contracted. With respect to the movement of the pins 1302 and the expansion and contraction operations of the bellows 1304, an airtight seal is formed between the inner portions of the bellows and the through-holes 1302 and the storage space 1207. For this reason, even in the midst of an operation of the vacuum processing unit 2001 that processes the wafer 300, particles having reactivity of the plasma and the processing gas formed in the vacuum processing unit 2001 and particles of the reaction product are inhibited from exerting an adverse influence on the pin drive unit 1208, the sensors, and terminals of the connectors disposed in the storage space 1207.

The head part 1201 constituting the specimen stage 241 of the present embodiment includes the base plate 1202, an insulating member 1305 that is placed above the base plate 1202, and a base member 1306 that is placed above the insulating member 1305 and is made of metal. A dielectric film 1307 that contains ceramics such as yttria or alumina of which a placement surface on which the wafer 300 is placed is formed is disposed on a circular upper surface of the base member 1306 having a disc shape or a cylindrical shape. The seal members such as the O-rings are interposed between the base plate 1202, the insulating member 1305, and the base member 1306, and the base plate 1202, the insulating member 1305, and the base member 1306 are integrally connected. An airtight seal is formed between the inner portion of the vacuum processing unit 2001 and the internal space of the specimen stage block that communicates with the storage space 1207, and the head part 1201 is configured to be mounted on the specimen stage base 242 as a group of members, and to be demountable upward.

That is, the base plate 1202 has a disc shape, and is fastened to the base member 1306 via the insulating member 1305 placed above by bolts 1308 that are inserted from the lower side of the base plate 1202 through through-holes disposed in an outer circumferential portion thereof and are made of metal. Thereby, the base plate 1203, the insulating member 1305, and the base member 1306 are integrally coupled.

Further, the base plate 1202 having a disc shape has a larger diameter than the insulating member 1305 and the base member 1306 that have a discoid or cylindrical outer circumference and are disposed above, and is fastened to the upper end of the cylindrical part of the T flange 1205, the upper end of which faces or abuts on the base plate 1202 across the O-ring under the lower surface of the outer circumferential edge of the base plate 1202, on an outer circumferential side of the insulating member 1305 by bolts. Thereby, the bolts on the outer circumferential side are unfastened, and thereby the head part 1201 is integrated and configured to be demountable upward from the T flange 1305 or the specimen stage base 242.

As illustrated in FIG. 13B, the base member 1306 is a member in which an upper base member 1306a and a lower base member 1306b, each of which has a disc shape or a cylindrical shape and is made of metal, are integrated by bringing upper and lower surfaces thereof into contact with each other and joining the surfaces by methods such as brazing or friction stirring, and a refrigerant flow passage 1313 is disposed inside the lower base member 1306b. Further, a power receiving connector 1310 to which high-frequency power from the second high-frequency power supply 242 is supplied is inserted into a recess that is formed in the center of an inner portion of the upper base member 1306a and is formed to have an opening in a vertical direction of the figure, and is connected to the base member 1306.

A lower portion of the power receiving connector 1310 is in contact with a power supplying connector 1309 that is connected to a tip of a power supplying cable, and is electrically connected to the power supplying connector 1309. Along with acceleration of processing caused by charged particles in plasma being induced and bombarded in a direction of the upper surface of the wafer 300 depending on a difference between a bias potential and a potential of plasma that are formed above the head part 1201 and an upper surface of the wafer 300 placed on the placement surface due to power supplied from the second high-frequency power supply 243 to the base member 1306, the wafer 300 and the base member below the wafer are heated.

In the present embodiment, to adjust temperatures of the wafer 300 and the base member 1306 or the head part 1201 that are changed by heating to a value within a desired range suitable for the processing, a refrigerant adjusted to a predetermined temperature in the second temperature controller 244 is supplied to the refrigerant flow passage 1313 in the base member 1306 and circulates therethrough, and a gas such as He having heat transference is supplied to an upper surface of the dielectric film 1307 on the base member 1306 and a back surface of the wafer 300 that is placed on the dielectric film 1307 and is adsorbed and held. In the present embodiment, a gas flow passage 1317 which is disposed on an outer circumferential side of the base member 1306 in a ring shape and through which the gas of heat transference flows, and gas supply passages 1318 which are through passages that communicate with the gas flow passage 1317 and a gap between the wafer 300 and the dielectric film 1307 and communicates with the opening disposed on the upper surface of the dielectric film 1307 that constitutes the placement surface on the base member 1306 are provided in the specimen stage 241.

The gas having heat transference is supplied to the gap between the upper surface of the dielectric film 1307 and the wafer from the gas supply passages 1318 through the opening. Heat transfer is accelerated between the gas having heat transference and a refrigerant that is supplied to the wafer 300, the base member 1306, and furthermore the refrigerant flow passage 1313 inside the base member and circulates therethrough, and a quantity of heat is increased. The temperature of the wafer 300 or the upper surface of the base member 1306 can be adjusted by a value of temperature and a flow rate or a speed of the refrigerant, and furthermore a value and distribution of a pressure of the heat transference gas at the gap.

As described above, the refrigerant that has relatively high heat capacity in comparison with the wafer 300 and is adjusted to a temperature within a predetermined range from the second temperature controller 244 is supplied to the base member 1306 made of metal. The base member 1306 is placed above, serves as a basis of the value of the temperature of the wafer 300 that is subject to the adjustment of temperature, and functions as an electrode to which the high-frequency power for forming the bias potential above the wafer 300 is supplied.

As described above, in the upper base member 1306*a* that is a discoid or cylindrical member and is made of metal, a recess in which an outer circumferential side portion thereof surrounds a center side and is disposed in a ring shape is disposed, and the center side portion surrounded by the recess is a cylindrical portion that has a shape projected upward from a bottom surface of the recess. A circular upper surface of the projected portion of the upper base member 1306*a* is coated with the dielectric film 1307, and the upper surface of the dielectric film 1307 is used as the placement surface of the wafer 300.

The placement surface having a circular shape of the upper surface of the projected portion has a diameter that is equal or approximate to that of the wafer 300. In a state in which the wafer 300 is placed on the placement surface during and before and after the processing thereof, an electrostatic force is formed between the wafer 300 and the dielectric film 1307 by power supplied from a plurality of direct current power supplies whose values are adjusted to a plurality of places inside the dielectric film 1307, and the wafer 300 is adsorbed and held on the upper surface of the dielectric film 1307. Otherwise, heat is generated by supplied direct current power, and a value or distribution of the temperature of the wafer 300 is adjusted.

That is, the dielectric film 1307 is formed using ceramics containing yttria or alumina as a material. In the present embodiment, particles of the material are sprayed onto a region of a larger upper surface including an entire region becoming the placement surface of the upper base member 1306*a* in a semi-molten state by a thermal spraying method, and are formed in a film shape. A plurality of film-like ESC (electrostatic adsorption) electrodes 1311 to which the direct current power for forming the electrostatic force for adsorbing the wafer 300 is supplied, and a plurality of film-like heater electrodes 1312 that are used as a heater for heating and adjusting the temperature of the wafer 300 to a value within a desired range suitable for the processing are disposed inside the dielectric film 1307.

The ESC electrodes 1311 are plurality of film-like electrodes that are arranged in a region below a projection plane of the placement surface of the dielectric film 1307 covered with the wafer 300 in a state in which the wafer 300 is placed. The ESC electrodes 1311 of the present embodiment are formed by a thermal spraying method like the dielectric film 1307.

Two of the plurality of ESC electrodes 1311 are connected to different direct current power supplies 1319 and generate potentials of different polarities, and electric charges are polarized within the wafer 300 across the ceramic material of which the dielectric film 1307 is formed, are accumulated to form the electrostatic force that suctions and holds the wafer 30 in a direction of the dielectric film 1307 during the processing. Further, polarities opposite to those during the processing are given to these ESC electrodes 1311 after the processing of the wafer 300. Thereby, even after the plasma disappears, the polarization of the electric charges accumulated to form the electrostatic force that adsorbs the wafer 300 before or during the processing is relaxed or removed by the vessel.

Each of the ESC electrodes 1311 is electrically connected to an upper portion of an ESC electrode power supplying cable connector unit 1320 mounted on the lower surface of the base plate 1203 via power supplying paths that pass through the base plate 1203, the insulating member 1305, and the base member 1306. Further, a lower portion of the ESC electrode power supplying cable connector unit 1320 connected to the plurality of ESC electrodes is electrically connected to one of the direct current power supplies 1319 allocated to supply the direct current power to the plurality of ESC electrodes 1311 disposed outside the vacuum processing unit 2001 via one power supplying cable disposed in the storage space 1207 below the upper portion of the ESC electrode power supplying cable connector unit 1320 to which the plurality of ESC electrodes are electrically connected.

The direct current power supplies 1319 are configured to variably adjust a magnitude of a current or a voltage to be output, and are connected to be communicable with the vessel controller 1209. A signal that indicates a value of the current or the voltage is transmitted from the direct current power supplies 1319 to the vessel controller 1209. From the direct current power supplies 1319 that receive an instruction signal which the vessel controller 1209 calculates and transmits using the computing unit, the direct current power in which the magnitude of the voltage or the current is adjusted by the direct current power supplies 1319 based on the instruction signal is supplied to the plurality of ESC electrodes 1311 connected to this via the power supplying cable outside the specimen stage 241 and the plurality of power supplying paths inside the specimen stage 241.

The heater electrodes 1312 are a plurality of film-like electrodes that are made of metal and are disposed at low positions inside the dielectric film 1307 in a height direction, and have a circular shape, a fan shape, or an arcuate shape formed by a thermal spraying method like the dielectric film 1307. Each of the heater electrodes 1312 is electrically connected via each of the plurality of heater power supplying connectors 1322 disposed below the heater electrodes 1312 and via at least one heater power supplying connector unit 1324, and a quantity of heat which the direct current power in which the current or the voltage is adjusted to a desired value in a direct current power supply 1321 is supplied to generate is adjusted.

As illustrated in FIG. 13B, the heater power supplying connectors 1322 that is electrically connected to each of the heater electrodes 1312 below each of the heater electrodes 1312 has a lower end that passes through the lower portion of the dielectric film 1307 below the heater electrodes 1312 and the base member 1306 below the heater electrodes 1312 and is exposed downward from a lower surface of the lower base member 1306*b* into the storage space 1207. The lower ends of the heater power supplying connectors 1322 pass through the base plate 1203, and are electrically connected to the heater power supplying connector unit 1324 located below the lower base member 1306*b* via connecting cables 1322' that are electrically connected to connecting terminals through inner portions of insulating members thereof.

Each of the heater power supplying connectors 1322 includes a connecting terminal that is electrically connected to each of the connecting cables 1322' at an inner portion thereof and is made of metal to form a power supplying path, and an insulating boss that insulates the connecting terminal from the base member 1306 disposed at an outer circumferential side thereof and is made of a dielectric. Each of the heater power supplying connectors 1322 is inserted into an insertion hole disposed in the base member 1306 from the lower side of the base member 1306, and is mounted on the base member 1306.

In this state, the connecting terminals of the heater power supplying connectors 1322 inside the insertion holes are in contact with connecting terminals for the heater, which are electrically connected to the heater electrodes 1312 and extend downward from upper portions of the insertion holes, at inner sides of the insulating bosses of the heater power supplying connectors 1322, or one of the two connecting terminals is fitted into the other, so that both the upper and lower connecting terminals are connected. The lower ends of the heater power supplying connectors 1322 are connected to the power supplying paths inside the insulators and the upper portion of the heater power supplying connector unit 1324 mounted on the base plate 1203 via the connecting cables 1322' in an internal space of the insulating member 1305 between the base plate 1203 and the base member 1306.

As will be described below, gaps or spaces of center sides of the insulating member 1305 and the base member 1306 are spaces that communicate with the storage space 1207 to form a part of the storage space 1207, and the inner and outer portions are airtightly sealed by the seal member such as the O-ring disposed to surround these members at the outer circumferential sides thereof. For this reason, like the storage space 1207, connecting portions of the connectors and the cables on the power supplying paths disposed in the spaces are maintained at atmospheric pressure or a pressure of a value approximated so as to be regarded as such regardless of whether or not the vacuum processing unit 2001 is operated.

The heater power supplying connector unit 1324 is a connector that includes a terminal connected to and disconnected from the power supplying path mounted on the base plate 1203, and includes two upper and lower portions. An upper heater power supplying connector unit 1324*a* is connected to the connecting cables 1322' of the plurality of heater power supplying connectors 1322 in a place between the upper surface of the base plate 1203 and the lower surface of the base member 1306. A lower heater power supplying connector unit 1324*b* is connected to the power supplying cable connected to the direct current power supply 1321 for the heater in a storage space below the lower surface of the base plate 1203.

The upper heater power supplying connector unit 1324*a* and the lower heater power supplying connector unit 1324*b* are configured to be mountable and demountable, and the connecting terminals electrically connected to the cables provided therein in a state in which both are integrally connected so that the direct current power supply 1321 and the plurality of heater power supplying connectors 1322 are electrically connected. Thereby, direct current power output from the direct current power supply 1321 is supplied in parallel to the plurality of heater power supplying connectors 1322 and the plurality of heater electrodes 1312 electrically connected to these connectors.

In this way, the dielectric film 1307 in which the ESC electrodes 1311 and the heater electrodes 1312 are installed is formed by spraying and laminating respective materials by a thermal spraying method. First, a coating of a lower layer of the dielectric film 1307 is formed on an upper surface of the upper base member 1306*a* on which irregularities for easy adhesion of a material are previously formed by a thermal spraying method using ceramics as a material, and a film for the heater electrodes 1312 is formed on the coating.

The coating of the lower layer and an upper surface of the film for the heater electrodes 1312 are covered, and an intermediate layer of the dielectric film 1307 is formed by a thermal spraying method using ceramics as a material. Then, the ESC electrodes 1311 are formed on the intermediate layer by a thermal spraying method. Afterward, the intermediate layer and the film layer of the ESC electrodes 1311 are covered, and an upper layer of the dielectric film 1307 is formed by a thermal spraying method.

A shape of the dielectric film 1307 laminated by a thermal spraying method is adjusted such that a surface constituting at least the placement surface is scraped, and holes between particles of the surface formed by a thermal spraying method are blocked. In a state in which the wafer 300 is placed on the upper surface of the dielectric film 1307 that constitutes the placement surface and is adsorbed by an electrostatic force, a fluid such as a gas having heat transference such as He is supplied to a gap formed between the back surface of the wafer 300 and the upper surface of the placement surface, and heat transfer between the wafer 300 and the specimen stage 241 is accelerated. However, a shape of the surface is adjusted such that a contact area between the wafer 300 and the dielectric film 1307 that constitutes the placement surface secures a desired amount of heat transfer between the wafer 300 and the dielectric film 1307.

As illustrated in FIG. 13A, the power receiving connector 1310 made of metal is inserted into and abuts on the base member 1306 made of metal, and the high-frequency power from the second high-frequency power supply 243 during the processing of the wafer 300 during which plasma is formed in the vacuum processing unit 2001 is supplied to the base member 1306 that is the electrode through the cables disposed in the storage space 1207 via the power supplying connector 1309 and the power receiving connector 1310 that is in contact with the power supplying connector 1309. Due to the supply of the high-frequency power, a bias potential is formed. Depending on a potential difference between the bias potential and a potential of the plasma above the wafer 300 in a state in which the wafer 300 is placed on, electrostatically adsorbed to, and held on the placement surface of the specimen stage 241, processing such as etching is accelerated by inducing charged particles in the plasma in a direction of the upper surface of the wafer 300 and bombarding the charged particles a film layer of the processing target on the surface.

The upper portion of the lower base member 1306*b* having a discoid or cylindrical shape has a groove that is disposed around the center thereof in a concentric or spiral shape and is multiply formed in a radial direction, and is joined with the upper base member 1306*a*. Thereby, the refrigerant flow passage 1313 is formed inside the base member 1306. An inlets and outlet of the refrigerant flow passage 1313 are connected to ends of pipes 1314 that are for refrigerant supply and return and are connected to the second temperature controller 244 on the inner side of the storage space 1207 via connectors for connection which are disposed below the base plate 1203.

The refrigerant that reaches a temperature within a predetermined range using a refrigeration cycle of a chiller or the like of the second temperature controller 244 is supplied into the refrigerant flow passage 1313 through the pipe 1314 and the inlet. After the refrigerant which performs heat exchange in the base member 1306 and whose temperature is raised returns to the second temperature controller 244 through the outlet of the refrigerant flow passage 1313 and the pipe 1314 connected to the outlet, and then the temperature thereof is adjusted to a value within a predetermined range again, the refrigerant is supplied to the refrigerant flow passage 1313 in the base member 1306, and circulates in a closed circulation line. Due to this supply for circulation of the refrigerant, the base member 1306 is adjusted to a value within a desired range suitable for the processing.

In the present embodiment, a plurality of gas supply passages 1318 disposed to pass through the dielectric film 1307 that constitutes the placement surface of the wafer 300 by covering a cylindrical projection of the upper portion of the base member 1306 and a circular upper surface of the projection, and openings that are disposed in a plurality of places on the outer circumferential side of the displacement surface of the upper surface of the dielectric film 1307 which communicates with the gas supply passages 1318 are provided. A ring projection 1307', which is disposed around the center side of the upper surface in a ring shape where the flat upper surface comes into contact with the back surface of the wafer 300 in a state in which the wafer 300 placed on the placement surface of the dielectric film 1307 is adsorbed, is disposed on an outer circumferential edge of the dielectric film 1307 which covers an outer circumferential edge of the placement surface of the upper base member 1306*a*. The plurality of openings are disposed on the surface of a recessed displacement surface on the center side of ring projection 1307' along the ring projection 1307'.

The heat transference gas supplied from the openings to the gap between the dielectric film 1307 and the wafer 300 in a recess that is a circular region on the center side of ring projection 1307' in the state in which the wafer 300 is placed is interrupted at an end of an outer circumferential side of the region by the ring projection 1307', but the heat transference gas is kept leaking into the vacuum processing unit 2001 outside the specimen stage 241 by a minute amount. The recess is filled with the heat transference gas, and a variation (distribution) in amount of heat transfer in an in-plane direction of the wafer 300 is reduced. Simultaneously, even in a region around the outer circumferential edge of the wafer 300 in a circumferential direction, the amount of heat transfer or the temperature of the wafer 300 can be further approximated to a desired amount or temperature.

The insulating member 1305 is a member formed of a dielectric material, is interposed between the base member 1306 made of metal and the base plate 1203 made of metal, both of which are fastened in a vertical direction by bolts 1308, and insulates the base member 1306 and the base plate 1203 and the temperature sensors 1315 that is mounted in the base plate 1203 as illustrated in FIG. 13A and is inserted into the base member 1306 through the base plate 1203. Further, a seal member such as an O-ring is interposed, deformed, and held between the insulating member 1305 and the base plate 1203 and between the insulating member 1305 and the base member 1306, and an airtight seal is formed between the space such as the gap that is directed inward from each of the insulating member 1305 and the base member 1306 above the base plate 1203 and communicate with the storage space 1207 and the inner portion of the vacuum processing unit 2001 outside them.

When roughly classified, the insulating member 1305 of the present embodiment is made up of two members. That is, the insulating member 1305 includes an insulating ring 1305' that is disposed on an outer circumferential side, has a ring shape, has an outer circumferential sidewall formed in a cylindrical shape, and is formed of ceramics such as alumina as a material, and two upper and lower insulating plates 1305*a* and 1305*b* that are disposed on the center side of the insulating ring 1305' in a region surrounded by the insulating ring 1305' and are formed of an elastic resin such as polytetrafluoroethylene as a material, and a gap is formed among them.

Due to the fastening of the base member 1306 and the base plate 1203 using the bolts 1308, upper and lower ends of the insulating ring 1305' on the outer circumferential side have a smooth surface, and seal members such as O-rings are interposed between the base members 1306 above and the outer circumferential surface of the base plate 1203 below. Thereby, a space directed inward from the insulating ring 1305' and the spaces (the gaps) that are directed inward from the base member 1306 and the base plate 1203 fastened on the insulating ring 1305' across the insulating ring 1305' in a vertical direction using the bolts 1308 and that communicate with the storage space 1207 are airtightly sealed from the outside.

Further, the insulating ring 1305' is formed of ceramics such as alumina have relatively high rigidity as a material, is resistant to deformation, and is fastened to the base member 1306 and the base plate 1203, so that both can be regarded that positions thereof are fixed. Since the deformation of the insulating ring 1305' is relatively small, the base member 1306 and the base plate 1203 are fastened using the bolts 1308 as in this state, and thereby a variation in distance between both of them in a vertical direction is reduced below a desired variation. Thus, occurrence of a problem that the temperature sensors 1315 come into contact with or are electrically conducted to the base plate 1203 and the base member 1306 and thus insulation between them is damaged is suppressed. In addition, a phenomenon that the pipe, the cable, and the device called the sensor that are mounted on the base plate 1203 or the base member 1306 are displaced or receive an external force in association with a change in shape and dimensions of each member constituting the head part 1201 due to a change in temperature in the processing of the wafer 300 on the specimen stage 241 during or after the fastening, and thus are damaged or suffer from a change in detection performance, is reduced.

The insulating ring 1305' is a ring-shaped member that constitutes outer circumferential portions of the head part 1201 and the insulating member 1305, and is interposed and held between the base member 1306 above and the base plate 1203 below. An upper portion of the insulating ring 1305' has a ring-shaped projection that protrudes upward to surround a center side thereof at an outer circumferential portion thereof, and a flat upper surface at a portion where a vertical height thereof on an inner circumferential (center) side of the ring-shaped projection is lower than that of the projection.

An outer circumferential region of a lower portion of the lower base member 1306b constituting the lower portion of the base member 1306 is disposed in such a ring shape that a thickness thereof in a vertical direction is reduced and a recess that is recessed upward when viewed from the lower surface of the lower base member 1306b surrounds a central portion thereof. In a state in which the insulating ring 1305' is interposed and held between the base plate 1203 and the base member 1306, the ring-shaped projection of the insulating ring 1305' is engaged with a recess of the outer circumferential side of the lower base member 1306b and, is fitted into the recess, so that the flat upper surface of the projection and that flat upper surface on the inner circumferential side of the projection are connected to or opposite to the lower base member 1306b at an interval with seal members such O-rings interposed therebetween, and a flat lower surface of the insulating ring 1305' is connected to or opposite to the upper surface of the lower base plate 1203 at an interval with a seal member such as an O-ring interposed therebetween.

Further, the insulating ring 1305' has openings that are formed in the upper surface on the inner circumferential side of the ring-shaped projection thereof, and that are through-holes through the bolts 1308 for fastening both the base member 1306 and the base plate 1203 pass in a vertical direction. The bolts 1308 are inserted from below the through-holes of the base plate 1203, pass through the through-holes of the insulating ring 1305' which are disposed to make axial directions thereof coincide with those of the bolts 1308 above the through-holes of the base plate 1203, are inserted and screwed into internally threaded holes of the upper base member 1306, so that the base member 1306 and the lower base plate 1203 are coupled and fastened across the insulating ring 1305' and the O-rings between them.

In the present embodiment, the projection of the upper portion of the insulating ring 1305' is fitted into the outer circumferential recess of the lower base member 1306b, and both are coupled to be in contact with each other across the O-ring or to make surfaces thereof face each other at an interval. In this state, a radial position of an inner circumferential sidewall surface of the ring-shaped projection of the insulating ring 1305' from the central axis of the specimen stage 241 or the head part 1201 in the vertical direction is farther than that of an outer circumferential sidewall surface of the recess of the lower base member 1306b from the central axis of the specimen stage 241 or the head part 1201 in the vertical direction, and a gap having a predetermined length (width) between them in a radial direction is formed around the center in a ring shape. This ring-shaped gap is airtightly coupled with a connector for a pipe connected to a gas source (not shown) via a through-hole for the pipe of the base plate 1203, and becomes a gas flow passage 1317 into which a high-transference gas such as He is supplied to flow through an outer circumferential portion inside the head part 1201 in a ring shape.

The gas such as He supplied to the gas flow passage 1317 is diffused inside the gas flow passage 1317 in a circumferential direction of the head part 1201, and is introduced into an outer circumferential portion of the placement surface from each of the plurality of gas supply passages 1318 that are arranged around the central axis of the specimen stage 241 at the same angle. The heat transference gas is supplied to a plurality of outer circumferential portions of the back surface of the wafer 300 at the same flow rate or speed, so that a variation in amount of heat transfer in a circumferential direction between the wafer 300 and the base member 1306 or the refrigerant in the refrigerant flow passage 1313 inside the base member 1306 through the medium of the dielectric film 1307, furthermore a variation in the temperature of the wafer 300, is reduced.

The two upper and lower insulating plates 1305a and 1305b disposed in the region of the center side of the head part 1201 are members formed of a resin having relatively low rigidity compared to the insulating ring 1305' as a material. In the present embodiment, a plurality of through-holes in which the plurality of temperature sensors 1315 that pass through the base plate 1203 from the lower side of the base plate 1203 in the figure and are inserted into the base member 1306 are disposed are arranged. Further, through-holes in which the power receiving connector 1310 that passes through the base plate 1203 and is inserted into the base member 1306 are disposed in the centers of the insulating plates 1305a and 1305b.

The power receiving connector 1310 and each of the temperature sensors 1315 are inserted upward from the lower side of the base member 1306 in the figure, and lower ends thereof are mounted on the base plate 1203 in a state in which the base member 1306 is fastened to the base plate 1203 across the insulating member 1305, so that positions of the lower ends thereof are fixed.

In the insulating plates 1305a and 1305b that are disposed to be vertically stacked and are formed of a resin, the through-holes are disposed in conformity with the temperature sensors 1315 and the power receiving connector 1310 that pass through the insulating plates 1305a and 1305b. In the present embodiment, in a state in which the temperature sensors 1315 and the power receiving connector 1310 are mounted on the base plate 1203, a predetermined gap is provided between an inner circumferential wall surface of the through-hole of each of the insulating plates 1305a and 1305b and an outer circumferential sidewall surface of each of the temperature sensors 1315 and between an inner circumferential wall surface of the through-hole of each of the insulating plates 1305a and 1305b and an outer circumferential sidewall surface of the power receiving connector 1310.

Each of the temperature sensors 1315 of this example includes a thermocouple that is a sensor main body that has a bar shape at an upper portion thereof, is disposed in a central region extending along an axis thereof, and extends in an axial direction, a sheath that has a predetermined height in the axial direction, is disposed to surround an outer circumference of the thermocouple, and is made of metal, and a connector part that is connected or coupled to the sheath and the thermocouple and is mounted on the lower surface of the base plate 1203. The connector part is electrically connected to the thermocouple through an inner portion thereof at one side thereof insulated from the thermocouple, and is connected to a cable through which a signal from the thermocouple is transmitted. A plurality of cables from the connector parts of the temperature sensors 1315 are connected to one sensor cable connector unit 1316 that is disposed to be coupled to the lower surface of the base plate 1203, and are communicably connected to the vessel controller 1209 from the sensor cable connector unit 1316 as a group of cables.

The temperature sensors 1315 are inserted into the through-holes, which are disposed in a plurality of places of the base plate 1203 and in a plurality of places of each of the insulating plates 1305*a* and 1305*b* and the lower base member 1306*b* that are disposed at corresponding positions above the base plate 1203, from the lower side of the base plate 1203, so that tips of the thermocouples and the sheaths thereof are inserted into cylindrical recesses disposed at positions corresponding to the through-holes of the upper base member 1306*a*. In a state in which the connector parts are mounted on the base plate 1203, the thermocouples of the temperature sensors 1315 do not about on inner wall surfaces of the recesses of the upper base member 1306*a*.

The through-holes into which the temperature sensors are inserted and the recesses of the upper base member 1306*a* which are disposed at positions corresponding to the through-holes are disposed in different places in radial and circumferential directions with respect to the upper surface of the specimen stage 241 or the base member 1306 having a cylindrical or discoid shape. In this state, signals of temperatures detected by the thermocouples of the temperature sensors 1315 are transmitted to the vessel controller 1209, and the computing unit disposed inside the vessel controller 1209 detects values of the temperatures and distribution of these values in the places of the temperature sensors 1315 along the algorithm of the software stored in the storage device constituting an inner portion of the computing unit.

In a state in which the connector parts of the temperature sensors 1315 are mounted on the base plate 1203, the sheaths of the temperature sensors 1315 which are made of metal are in contact with and electrically connected to the base plate 1203 at connecting parts of lower ends thereof or the connector parts. The sheath of each of the temperature sensors 1315 has a cylindrical shape that is disposed to surround the thermocouple at a distance on an outer circumferential side of the thermocouple, and is insulated from the thermocouple.

In a state in which the temperature sensors 1315 are inserted from the lower side of the base plate 1203 and are mounted in the specimen stage 241, the sheaths of the temperature sensors 1315 are disposed at a distance from the base member 1306. That is, the sheaths are electrically insulated from the base member 1306, and are electrically connected to the base plate 1203.

The base plate 1203 is electrically connected to the base plate 260 having a ground potential via the specimen stage base 242 and the lower vessel 250 below the base plate 1203. For this reason, the sheaths of the temperature sensors 1315 also have a ground potential, and a component of the high-frequency power supplied from the second high-frequency power supply 243 to the base member 1306 is inhibited from overlapping with a signal output from the temperature sensors 1315 to become noise. Detection accuracy of values of temperatures of the inner portion or the upper surface of the specimen stage 241 or distribution of the temperatures in the radial or circumferential direction is inhibited from being damaged in the vessel controller 1209.

In the present embodiment, as described above, the high-frequency power output from the second high-frequency power supply is connected to one end of the power supplying cable through the power supplying cable, and is supplied to the base member 1306 into and to the center of which the power receiving connector 1310 is inserted and connected via the power supplying connector 1309 disposed in the center of the storage space 1207 under the base plate 1203 and the power receiving connector 1310 connected to the power supplying connector 1309. The through-holes into which the power supplying connector 1309 and the power receiving connector 1310 are inserted are disposed in the centers of the insulating plates 1305*a* and 1305*b* between the base member 1306 and the base plate 1203.

A power supplying cable, one end of which is connected to the second high-frequency power supply 243, is connected to an end of the power supplying connector 1309, exposed to the storage space 1207, which is mounted on the lower surface of the base plate 1203. A magnitude or an amount of the high-frequency power output according to the instruction signal from the vessel controller 1209 is adjusted by the second high-frequency power supply 243 that is communicably connected to the vessel controller 1209, and a magnitude and distribution of the bias potential formed above the head part 1201 is adjusted by the high-frequency power supplied through the power receiving connector 1310.

In the present embodiment, the power receiving connector 1310 is a member having an L shape or an inverted T shape. The power receiving connector 1310 includes an upper member (an upper portion) made of a conductor such as metal, and a lower member (a lower portion) that is electrically connected to the upper member at an upper end thereof, has a connecting terminal connected to the power supplying connector 1309 at an end of a lower portion thereof, and has an L shape or an inverted T shape.

In a state in which the power receiving connector 1310 is inserted into the through-hole disposed in the centers of the base plate 1203 and the insulating plate 1305*a* or the insulating plate 1305*b* and upper and lower portions thereof are connected, the lower portion of the power receiving connector 1310 is inserted into the through-hole and is mounted on the lower surface of the base plate 1203.

The upper portion of the power receiving connector 1310 is a bar-shaped member made of metal, is inserted into and passes through the through-hole of the center of the lower base member 1306*b*, is inserted into a fitting hole that is a recess disposed in the center of the upper base member 1306*a* above the through-hole, and is electrically connected to the upper base member 1306*a*. In a state in which a lower end of the upper portion of the power receiving connector 1310 is connected to the lower portion of the power receiving connector 1310, the lower end is fitted into a recess disposed in the connecting terminal of the lower portion which is made of metal.

The lower portion of the power receiving connector 1310 is a member having an L shape or an inverted T shape. A terminal connected to the lower end of the upper portion made of metal, a terminal connected to the power supplying connector 1309 at an end of the lower portion having an L shape or an inverted T shape, and a power supplying path connected between these terminals are located inside a member formed of a dielectric material or an insulator material.

A terminal having a fitting hole into which the lower end of the bar-shaped member that constitutes the upper portion and is made of metal is fitted and connected in a state in which the upper and lower portions of the power receiving connector 1310 are integrally connected is disposed at an upper end of the lower portion. Further, the lower portion of the power receiving connector 1310 which has an L shape or an inverted T shape is exposed to the storage space 1207 under the lower surface of the base plate 1203, and the power supplying connector 1309 disposed in the storage space 1207 is connected to the connecting terminal of one end of the lower portion.

The power supplying connector 1309 is a high-frequency power supplying connector that is disposed in the center of a main body formed of a material of a dielectric or an insulator and has a connecting terminal that is electrically connected to the power supplying cable along which the high-frequency power from the second high-frequency power supply 243 flows. The connecting terminal is exposed at one end of the power supplying connector 1309, and the other end is connected to the power supplying cable. However, the power supplying cable that is electrically connected to the connecting terminal at an inner portion thereof is tugged and extended.

The power supplying connector 1309 connected to the second high-frequency power supply 243 via the power supplying cable is configured such that work of mounting and demounting the power receiving connector 1310 in the storage space 1207 is possible. The mounting and the demounting is performed on an end of the portion that is the L-shaped or T-shaped portion of the power receiving connector mounted on the head part 1201 or the base plate 1203 and is exposed in the storage space 1207 under the lower surface of the base plate 1203.

In the present embodiment, in a state in which the lower portion of the power receiving connector 1310 is exposed below the lower surface of the base plate 1203 and is mounted on the lower surface of the base plate 1203, an upper end of the power supplying connector 1309 from which the power supplying cable electrically connected between the lower portion of the power receiving connector 1310 and the second high-frequency power supply 243 is mounted on the lower portion of the power receiving connector 1310. In a state in which the base plate 1203 is integrally mounted on the insulating member 1305 and the base member 1306 above the base plate 1203, the power supplying connector 1309 and the power receiving connector 1310 are configured such that the mounting and demounting work is possible, and the head part 1201 is configured to be able to be integrally mounted on and demounted from the specimen stage base 242.

An insulating boss, which surrounds an outer circumferential side of a place where the bar-shaped upper portion and the lower portion of the power receiving connector 1310 are connected, is formed of an insulating material such as ceramics or a dielectric, and has a cylindrical shape or a ring shape, is provided on the outer circumferential side. The insulating boss is a member that maintains a gap between the insulating plate 1305a or 1305b and the base plate 1203 and the place where the upper and lower portions of the power receiving connector 1310 are connected in a radial direction in the centers of the insulating plates 1305a and 1305b and the base plate 1203 in a state in which the power receiving connector 1310 is mounted on the head part 1201, and that is disposed between the lower surface of the lower base member 1306b and the upper surface of the base plate 1203 with a gap in a vertical direction. The power supplying path of the power receiving connector 1310 is insulated from the insulating boss.

In this head part 1201 of the present embodiment, the upper portion of the power receiving connector 1310 is mounted on the base member 1306 first so that both are connected. Afterward, the insulating ring 1305' and the insulating plates 1305a and 1305b on the center side of the insulating ring 1305' are disposed blow the lower surface of the base member 1306 in the figure, and the upper portion of the power receiving connector 1310 is inserted into the through-holes inside the base member 1306 and the insulating plates 1305a and 1305b in the center thereof. The insulating boss is disposed.

Then, the base plate 1203 and the base member 1306 are interposed between the insulating member 1305 and the insulating boss, and are fastened using the bolts 1308. The insulating boss formed of ceramics also functions as a member that is disposed between the power receiving connector 1310 and the base plate 1203 such that upper and lower end faces thereof face the lower surface of the center of the base member 1306 and the upper surface of the center of the base plate 1203 via a predetermined slight gap between upper and lower end faces and that is insulated between the base member 1306 and the base plate 1203 like the insulating member 1305, and as a member that a distance (a height) of a vertical space between the base member 1306 and the base plate 1203 is inhibited from being equal to or less than a desired value.

As illustrated in FIG. 13B, the plurality of heater power supplying connectors 1322 that are electrically connected to the lower surfaces of the plurality of heater electrodes 1312 inside the dielectric film 1307 are disposed in the head part 1201. Lower ends of these heater power supplying connectors 1322 are configured such that the connecting cables 1322' constituting the power supplying paths for the heater electrodes 1312 are tugged out of internal connecting terminals, are connected to an upper heater power supplying connector unit 1324a of a heater power supplying connector unit 1324 located above the upper surface of the base plate 1203, and receive the direct current power from the direct current power supply 1321 for the heater via the heater power supplying connector unit 1324.

The heater power supplying connector unit 1324 includes an upper heater power supplying connector unit 1324a that is mounted on the base plate 1203 and is exposed upward from the upper surface of the base plate 1203, and a lower heater power supplying connector unit 1324b that is mounted on a lower surface of the upper heater power supplying connector unit 1324a to be mountable and demountable from below, and is electrically connected to the power supplying path, and is electrically connected to the direct current power supply 1321 for the heater.

Each of the insulating plates 1305a and 1305b has through-holes disposed to be consistent with positions of the heater power supplying connectors 1322 in the base member 1306, and the insulating plate 1305 is interposed between the base member 1306 and the base plate 1203. Thereby, the head part 1201 is integrally configured. In this state, lower ends of the heater power supplying connectors 1322 are fitted into the through-holes with a gap maintained therearound. The head part 1201 is configured such that the insulating plates 1305a and 1305b are interposed between the base member 1306 and the base plate 1203. In this state, a gap is formed between the base member 1306 and the base plate 1203, and the plurality of connecting cables 1322' that are electrically connected between the heater power supplying connectors 1322 and the heater power supplying connector unit 1324 are disposed in the gap.

Each of the heater power supplying connectors 1322 of the present embodiment includes a boss that is formed of a dielectric or insulator material has a cylindrical shape, and a connecting terminal that is disposed inside the boss. In a state in which the heater power supplying connectors 1322 are inserted into and mounted in the base member 1306, upper ends of the connecting terminals are connected to the connecting terminals close to the heater electrodes 1312, and are electrically connected to the heater electrodes 1312, and lower ends of the connecting terminals are electrically connected to the connecting cables 1322'.

The heater power supplying connectors 1322 are inserted into insertion holes made up of the through-holes of the lower base member 1306*b* and the cylindrical holes disposed in the upper base member 1306*a*, are disposed at upper ends (bottom portions) in the insertion holes, are electrically connected to the heater electrodes 1312 located above, and are fitted and abut on the connecting terminals for the heater extending downward in a state in which they are insulated from the base member 1306 surrounding outer circumferences thereof on inner sides of the boss. In this way, the heater electrodes 1312 and the direct current power supply 1321 for the heater are electrically connected inside the insertion holes that communicate with the storage space 1207 and reach the atmospheric pressure.

The power supplying cables 1323 connect the lower ends of the heater power supplying connectors 1322 and the upper part 1324*a* of the heater power supplying connection unit 1324 located below the upper surface of the base plate 1203 in the gap between the insulating plates 1305*a* and 1305*b*. The lower heater power supplying connector unit 1324*b* and the direct current power supply 1321 are connected by one power supplying cable or a group of power supplying cables, and direct current power from the direct current power supply 1321 for the heater is supplied in parallel to the plurality of heater electrodes 1312 through the connecting cables 1322' branched off from the upper heater power supplying connector unit 1324*a* and the heater power supplying connectors 1322 connected to the connecting cables 1322'.

In the present embodiment, the insulating plates 1305*a* and 1305*b* formed of a resin material are disposed between the members disposed therearound with a gap, and inhibit the connecting portions between the ends of the power supplying cables 1323 and the heater power supplying connectors 1322 or the heater power supplying connector unit 1324 from being damaged or disconnected even when deformation of the base member 1306 which is caused depending on the temperature of the wafer 300 during the processing occurs.

The outer circumferential ring 1202 of the present embodiment is a ring-shaped member that is disposed on the outer circumferential side of the specimen stage 241 and covers surroundings of the specimen stage 241, and includes a susceptor ring 1325, a cover ring 1326, and a confinement ring 1327 when roughly classified. These members are simply placed on the outer circumferential side of the specimen stage 241 without units that are fastened to the specimen stage 241 or to each other.

In a state in which the outer circumferential ring 1202 is placed around the specimen stage 241, the susceptor ring 1325 is disposed on an outer circumferential side of an upper portion of the upper base member 1306*a*, the cover ring 1326 is disposed around an outer circumferential surface of the head part 1201 below the susceptor ring 1325 and above the base plate 1203, and the confinement ring 1327 is disposed on an outer circumferential side of the cover ring 1326 above the base plate 1203. A gap having a predetermined magnitude is disposed between surfaces of these members which face each other.

In the present embodiment, after the cover ring 1326 of the outer circumferential ring 1202 is mounted on the specimen stage 241 or the head part 1201, the susceptor ring 1325 and the confinement ring 1327 are mounted on the specimen stage 241 in turn. Hereinafter, description will be made in the order in which the confinement ring 1327 and the susceptor ring 1325 are mounted after the cover ring 1326 is mounted, but the susceptor ring 1325 may be mounted first according to a shape or specifications of the specimen stage.

First, the cover ring 1326 is a member that is formed of a ceramics material such as alumina or yttria and has a ring shape or a cylindrical shape. The cover ring 1326 is fitted from above with an inner circumferential wall surface thereof maintained with a predetermined gap on an outer circumferential side of the cylindrical outer circumferential sidewall of the insulating ring 1305' of the insulating member 1305 having an cylindrical outer sidewall shape of the head part 1201 configured such that the base plate 1203 and the base member 1306 are fastened across the insulating member 1305, and is placed above an upper surface of an outer circumferential edge of the base plate 1203.

In the present embodiment, a magnitude (a height) of the inner circumferential wall surface of the cover ring 1326 is set to be identical to that of the outer circumferential sidewall of the insulating ring 1305'. However, without being limited to this configuration, the cover ring 1326 is disposed to cover the outer circumferential sidewall of the insulating ring 1305'. In a state in which a flat lower end face of the cover ring 1326 is placed above the upper surface of the base plate 1203, the flat lower end face of the cover ring 1326 is placed to cover an upper surface ranging from an outer circumferential end of the insulating ring 1305' to an outer circumferential end of the upper surface of the base plate 1203.

The confinement ring 1327 is a ring-shaped member that has a coating formed of a ceramics material such as alumina or yttria on a surface of a base made of metal, and includes a ring plate-shape flange part that extends from an inner circumferential portion whose longitudinal cross section has a cylindrical shape and an upper end of the inner circumferential portion in an outer circumferential direction. In this point, the confinement ring 1327 is a member having an inverted L-shaped cross section.

A diameter of a cylindrical inner circumferential sidewall of the inner circumferential portion of the confinement ring 1327 is slightly larger than that of an outer circumferential sidewall of the cover ring 1326. In a state in which the cover ring 1326 is mounted on the specimen stage 241, the confinement ring 1327 is fitted into an outer circumferential side of the cover ring 1326 from above with a gap, and is placed above the upper surface of the outer circumferential edge of the base plate 1203 on the outer circumferential side of the cover ring 1326. In this state, the cover ring 1326 or the confinement ring 1327 is inserted from above the outer circumferential edge of the base plate 1203 on the outer circumferential side of the insulating ring 1305', and covers upper sides of the plurality of bolts by which the base plate 1203 and the T flange 1205 are fastened with respect to the vacuum processing unit 2001.

A bottom surface of the cylindrical inner circumferential portion of the confinement ring 1327 and the base member made of metal are exposed. In a state in which the confinement ring 1327 is placed on the upper surface of the outer circumferential edge of the base plate 1203 on the outer circumferential side of the cover ring 1326 and both are in contact with each other, the exposed bottom surface and the exposed portion of the base plate 1203 which is made of metal are in contact with each other and are electrically connected.

For this reason, the confinement ring 1327 is electrically connected to the lower vessel 250 via the base plate 1203 and the T flange 1205, and has a ground potential during the processing of the wafer 300 in the same way as them. The flange part of the confinement ring 1327 having this potential is disposed around the circumference of the specimen stage 241 in a space between the flange part and the inner circumferential wall surface of the vacuum processing unit 2001 on the outer circumferential side of the specimen stage 241 in the vacuum processing unit 2001.

A plurality of through-holes that pass through upper and lower surfaces in a vertical direction are disposed at the flange part of the confinement ring 1327 which has a ring disc shape. The space of the vacuum processing unit 2001 on the outer circumferential side of the specimen stage 241 serves as, so to speak, a passage through which the particles in the plasma formed in the space above the specimen stage 241 and the particles of the gas supplied into the vacuum processing unit 2001, or the particles of the reaction product or the like formed during the processing of the wafer 300 flow downward, move below the specimen stage 241, and are exhausted.

The flange part of the confinement ring 1327 is disposed in the passage to cross a direction of the flow. Thereby, the particles of the gas and the neutral particles in the plasma move through through-holes of the flange part, and the charged particles in the plasma are inhibited from moving downward. That is, the plasma is inhibited from reaching the outer circumferential sidewall surface of the specimen stage 241 or the specimen stage 242 below the confinement ring 1327 and the inner wall surface of vacuum processing unit 2001 to cause an interaction with the materials of the members constituting them or from adhering to the surfaces.

Further, so to speak, the electrodes having a ground potential are disposed in a place that is the passage on the outer circumferential side of the specimen stage 241 and is close to the placement surface of the wafer 300 on the upper surface of the head part 1201 or the base member 1306 to surround the outer circumference of the wafer 300 on the specimen stage 241 or the placement surface. Electrical connection between the confinement ring 1327 and the base plate 1203 is stably maintained, and upper surfaces of the bolts for fastening the head part 1201 on the T flange 1205 are covered by the electrodes. Thereby, the bolts and the plasma or the charged particles of the plasma and particles having reactivity are inhibited from coming into contact with each other to cause the interaction, and generation of abnormal discharge during the processing of the wafer 300 is suppressed, so that the processing is stabilized. Furthermore, consumption of the members in the vacuum processing unit 2001 is suppressed due to this configuration, and reproducibility of the processing of the wafer 300 is improved.

In the present embodiment, after the confinement ring 1327 is mounted on the outer circumferential side of the cover ring 1326, the susceptor ring 1325 is placed above the cover ring 1326 to surround the outer circumference of the upper portion of the head part 1201. The susceptor ring 1325 is a ring-shaped member formed of a ceramics material such as alumina or yttria.

The susceptor ring 1325 is disposed at an outer circumferential portion of an upper portion of the upper base member 1306a to surround the outer circumference of the placement surface of the wafer 300, surrounds either the placement surface of the circular wafer 300 which is made up of the dielectric film 1307 that is an upper surface of a cylindrical projection part that is inserted into a recess where a height of a surface of the upper base member 1306a is reduced (a recess having a step) and is surrounded by the recess of the upper base member 1306a or the wafer 300 placed on the placement surface, and covers an upper surface of the recess or an outer circumferential sidewall surface of the projected part with respect to the plasma in the vacuum processing unit 2001.

In a state in which the susceptor ring 1325 of the present embodiment is mounted on the recess of the upper portion of the base member 1306, a position of the susceptor ring 1325 from the center of the base member 1306 on an inner circumferential edge of the susceptor ring 1325 or the center of the placement surface of the wafer 300 in a radial direction is slightly greater than a position of an outer circumferential edge of the projected part or the placement surface surrounded by the recess in the radial direction, so that a gap is disposed between them. In a state in which the wafer 300 is placed on the placement surface, a position of the outer circumferential edge of the wafer 300 is greater than the inner circumferential edge of the susceptor ring 1325 on the outer circumferential side. As a result, in a state in which the wafer 300 is placed and held on the placement surface, the outer circumferential edge thereof is located to be overhung outside the inner circumferential edges of the projected part and the susceptor ring 1325 located on an outer circumferential side of the projected part.

Further, a height of an upper surface of the susceptor ring 1325 of the present embodiment is lower than a height of the placement surface of the upper base member 1306a or a height of the placement surface of the dielectric film 1307 or the flat upper surface of the ring projection 1307' caused by the dielectric film 1307 that is disposed at an outer circumferential end of the projected part and surrounds a portion of the center side. The wafer 300 is disposed such that the back surface of the outer circumferential edge thereof to be overhung on the placement surface covers an upper surface of the inner circumferential edge of the susceptor ring 1325 below the back surface.

Further, although not illustrated, the upper surface of the inner circumferential edge of the susceptor ring 1325 on the outer circumferential side has a higher height than the inner circumferential edge. For this reason, a shape of the upper surface on which the wafer 300 is recessed on the center side of the raised ring-shaped portion of the susceptor ring 1325 (the height is lowered) is disposed inside a circular region. Thereby, when the wafer 300 is placed on the specimen stage 241 or the placement surface, it is allowed to be located closer to the center side for itself.

A thickness of the outer circumferential portion of the susceptor ring 1325 of the present embodiment in a vertical direction is greater than that of the inner circumferential side of the of the susceptor ring 1325. The inner circumferential portion of the susceptor ring 1325 is placed on an upper surface (a bottom surface) of the recess in a state in which it is fitted to the recess, and includes a portion having a larger thickness of the outer circumferential side thereof surrounds and covers an outer circumference of the outer circumferential sidewall surface of the upper base member 1306a.

Further, a flat lower surface of the outer circumferential portion where the thickness is increased is disposed to face an upper end surface of the cover ring 1326 with a gap. A magnitude of this gap and a height position of the susceptor ring 1325 in a vertical direction are determined by the thickness of the inner circumferential portion that abuts on the bottom surface of the recess of the upper base member 1306a.

Due to the gap between an lower end face of the susceptor ring 1325 and the cover ring 1326 and the gap between the lower end face of the susceptor ring and the confinement ring 1327, a distance between the plasma or the charged particles in the vacuum processing unit 2001 and upper ends of the bolts by which the base plate 1203 and the T flange are fastened becomes a creepage distance, and thereby occurrence of an interaction between the bolts and the plasma or the charged particles is suppressed.

Figure 14A:
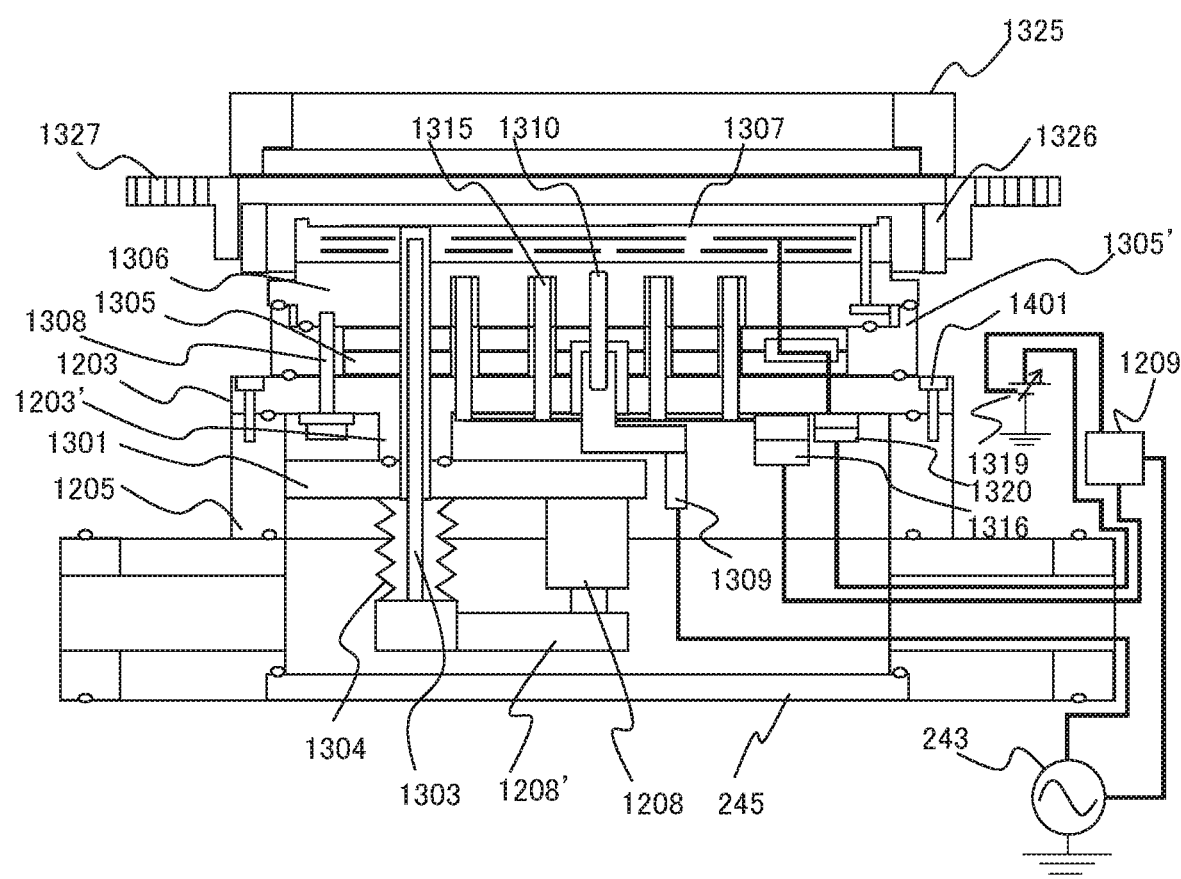
FIGS. 14A and 14B are longitudinal sectional views schematically illustrating a state in which the specimen stage of the embodiment illustrated in FIGS. 12A to 13B is disassembled into a plurality of components.
Figure 14B:
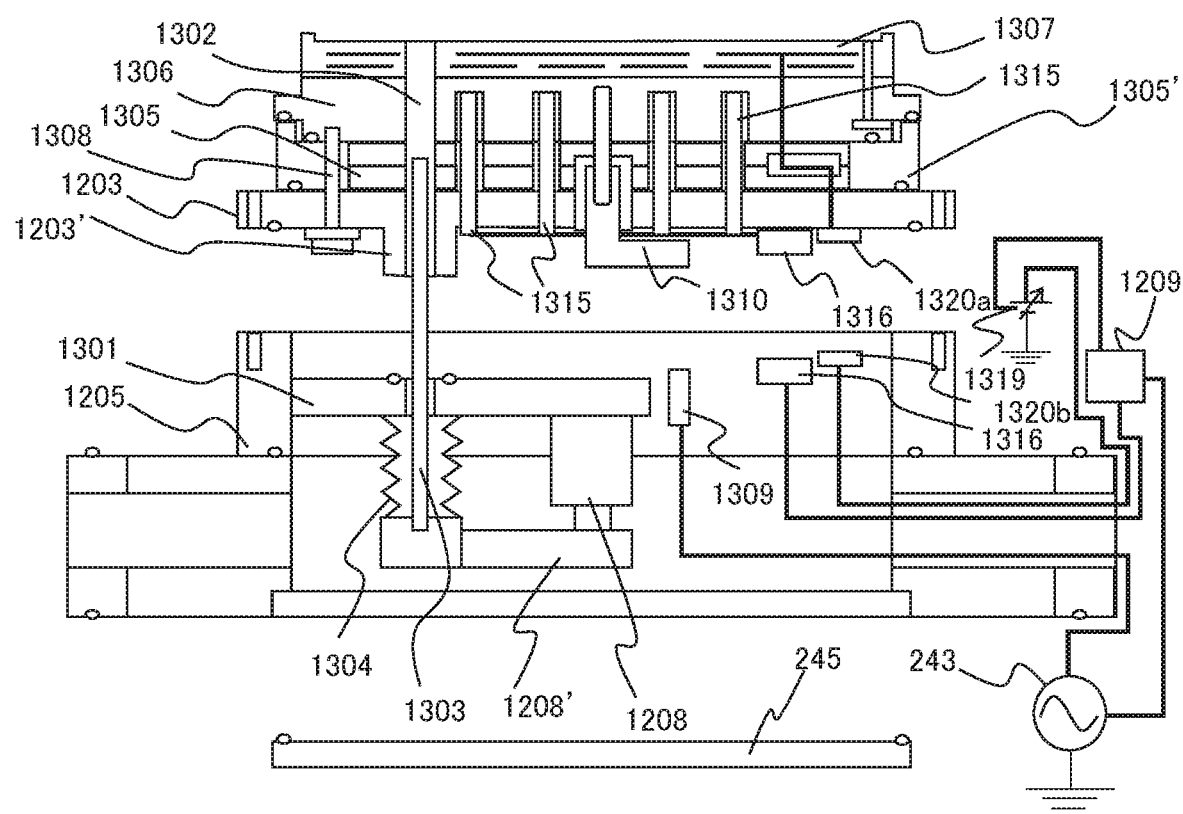

Hereinafter, a flow of an operation of disassembling the specimen stage 241 of the present embodiment will be described using FIGS. 14A and 14B. FIGS. 14A and 14B are longitudinal sectional views schematically illustrating a state in which the specimen stage according to the embodiment illustrated in FIGS. 12A, 12B, 13A and 13B is disassembled into a plurality of components.

In this figure, in a state in which the head part 1201 of the specimen stage 241 is mounted on the specimen stage base 242, a state in which the outer circumferential ring 1202 is demounted upward from the specimen stage 241 is illustrated in FIG. 14A. A state in which the head part 1201 is further demounted above the specimen stage base 242 from the state illustrated in FIG. 14A is illustrated in FIG. 14B.

For disassembly of the specimen stage 241 illustrated in FIGS. 14A and 14B, it is detected by the vessel controller 1209 whether the number of processed wafers 300 in the vacuum processing unit 2001 or a value of accumulation of a time for which the plasma is formed in the vacuum processing unit 2001 reaches a preset value, an operation of processing the wafer 300 in the vacuum processing unit 2001 is stopped and changed into an operation for maintenance and inspection. In the operation for maintenance and inspection, a pressure in the vacuum processing unit 2001 is changed into the atmospheric pressure, and the vacuum processing unit 2001 is opened. Work of a worker demounting and interchanging the members inside the vacuum processing unit 2001 or cleaning, washing, and remounting the members is performed.

Prior to this work, when it is confirmed that the processed wafer 300 is ejected from the vacuum processing unit 2001, the vessel controller 1209 leaves operating the vacuum processing unit 2001 in an operation mode for maintenance and inspection to a user or a worker. Afterward, after the gate is closed to seal the inside of the vacuum processing unit 2001, an inert gas such as nitrogen or argon is introduced into the vacuum processing unit 2001, the pressure in the vacuum processing unit 2001 is raised to the atmospheric pressure or an extent regarded to be equal to the atmospheric pressure.

Further, the upper portion including the upper vessel 230 of the vacuum processing unit 2001 is demounted and removed from the upper side of the specimen stage block using the turning lifter 210 or the like. After the specimen stage 241 and the specimen stage base 242 are slightly raised, they are turned around the axis of the turning lifter 210 in a vertical direction, are demounted from the lower vessel 250, and are moved from the upper side of the lower vessel 250 to the space for maintenance around the base plate 260.

In this state, the specimen stage 241 and the specimen stage base 242 are moved to a position at which the components or members are out of the way above and below the specimen stage 241 and the specimen stage base 242. After the worker performs work on the specimen stage 241 and the specimen stage base 242, a necessary space is secured, and damage to efficiency of the work is suppressed.

In the present embodiment, the worker can demount the outer circumferential ring 1202 from the specimen stage 241 first. It is schematically illustrated in FIG. 14A that the susceptor ring 1325, the cover ring 1326, and the confinement ring 1327 that constitute the outer circumferential ring 1202 above the specimen stage 241 mounted on the specimen stage base 242 are together demounted, but they are demounted one by one.

In the event of the demounting, these members are demounted in the reverse order of the order when mounted on the specimen stage 241. That is, inversely to the case of the description using FIGS. 13A and 13B, in the order of the susceptor ring 1325, the confinement ring 1327, and the cover ring 1326, they are demounted above the specimen stage 241.

In the present embodiment, these members constituting the outer circumferential ring 1202 and other members are not fastened. For this reason, the worker only needs to demount these members above from the specimen stage 241 in the event of the demounting, so that a work load is reduced, and a time required for the work for maintenance and inspection is reduced.

When the cover ring 1326 of the outer circumferential ring 1202 is demounted from the specimen stage 241, the upper surfaces of the bolts 1401 by which the outer circumferential edge of the base plate 1203 and the T flange 1205 are fastened are exposed toward the worker. In this state, the worker can easily demount the head part 1201 of the specimen stage 241 above the specimen stage base 242 by releasing the fastening of them.

In a state in which the outer circumferential ring 1202 is demounted from a place on the outer circumferential side thereof, the head part 1201 of the specimen stage 241 is integrally demounted above from the specimen stage base 242. In this case, the plurality of bolts 1401 by which this is fastened to the upper end of the T flange 1205 on the outer circumferential side of the base plate 1203 are demounted, and the sensors, the pipes, and the connectors of the power supplying cables mounted on the lower surface of the base plate 1203 are demounted. Then, the head part 1201 is demounted above along with the sensors, the cables, the connectors, and the like mounted on the base plate 1203.

That is, in the present embodiment, the bolts 1401 disposed around the central axis of the specimen stage 241 at intervals of the same angle or an angle approximated to the same angle in a circumferential direction are demounted from the outer circumferential portion of the upper surface of the base plate 1203.

Prior to this, the specimen stage bottom lid 245 constituting the bottom surface of the specimen stage base 242 is demounted above, and the storage space 1207 is released below. Thereby, the worker can do work of demounting the connectors of the power supplying cables, the sensors, and the pipes mounted on the lower surface of the base plate 1203 from the lower side of the specimen stage base 242, and thus improve the work efficiency.

The worker gets access to the inner portion of the storage space 1207 from the lower side of the specimen stage base 242 that opens downward, and releases the connection between the power supplying connector 1309 and the power receiving connector 1310, the connection between the upper and lower portions of the sensor cable connector unit 1316, the connection between the upper and lower portions of the ESC electrode connector unit 1320, and the connection between the upper heater power supplying connector unit 1324a and the lower heater power supplying connector unit 1324b. Likewise, although not illustrated, the worker releases the connection between the pipes 1314 to which the refrigerant supplied to the refrigerant flow passage 1313 is supplied to circulate and the base plate 1203 or between the pipes 1314 and the head part 1201.

The worker can demount the head part 1201 in which the connectors of the cables, the pipes, and the like mounted on the lower surface of the base plate 1203 is released above the specimen stage base 242 in a state in which the plurality of temperature sensors 1315 and heater power supplying connectors 1322 are disposed inside the base member 1306 or the insulating member 1305 of the head part 1201. Even in the event of the demounting, the plurality of temperature sensors 1315 are configured such that the lower portions thereof are mounted on the lower surface of the base plate 1203 and the positions thereof are fixed, the plurality of cables to which the output signal flows are connected to the upper portion of the sensor cable connector unit 1316 mounted on the base plate 1203 in the storage space 1207 under the base plate 1203, whereas the upper portion of the sensor cable connector unit 1316 to which the cable into which the plurality of cables are united connects the vessel controller 1209 is separated from above in the storage space 1207 by the worker.

Likewise, the lower portions of the plurality of heater power supplying connectors 1322 extend downward from the lower surface of the lower base member 1306b, and are connected to the upper heater power supplying connector unit 1324a via the power supplying cables 1323 that are disposed between the insulating plates 1305a and 1305b in the space inside the head part 1201 communicating with the storage space 1207 directed inward from the insulating ring 1305' above the base plate 1203. Meanwhile, the lower heater power supplying connector unit 1324b that is electrically connected to the direct current power supply 1321 is separated from the heater power supplying connector unit 1324a below the base plate 1203.

Similarly, with regard to the other connectors, the connection of the head part 1201 and the coupling of the base plate 1203 are released by work done from below by the worker in the storage space 1207 in which the specimen stage bottom lid 245 constituting the bottom surface is opened.

In this way, in the present embodiment, after it is detected by the vessel controller 1209 that the number of processed wafers 300 in the vacuum processing unit 2001 or a value of accumulation of a time for which the plasma is formed reaches a predetermined value for performing maintenance such as interchange and inspection of a component, the head part 1201 in which an adherent is deposited on the surfaces of the members constituting the vacuum processing unit 2001 or the surfaces of the members are worn is integrally demounted as a group of members (units) during an operation for maintenance of the vacuum processing unit 2001 started by the vessel controller 1209, is interchanged with a head part 1201 made up of members that are prepared in advance and are subjected to surface cleaning or are newly manufactured as a unit, and is fastened and connected to the upper end of the T flange 1205 of the specimen stage base 242 in which the cover that covers the surface of the head part 1201 and is made of a dielectric is cleaned or which is interchanged with a new component by the plurality of bolts 1401.

When the upper portion of the specimen stage 241 including the base plate 1203 is demounted upward, lower end faces of the projections 1203', each of which is disposed on the lower surface of the base plate 1203, has a cylindrical shape or a frustum shape that protrudes downward from the lower surface of the base plate 1203, and in the center of which the through-hole 1303 through which each of the pins 1302 passes and is stored inside is disposed, abut on or face the upper surfaces of the outer circumferences of the through-holes for the pins 1303 disposed at the beams of the beam part 1301 on which the seal member such as the O-ring is placed, the sealing between the spaces inside the through-holes for the pins of the beams and the through-holes 1303 in the head part 1201 and the storage space 1207 outside the through-holes 1302 is released. The upper surface of the beam part 1301 including the portions around the through-holes for the pins 1303 is exposed to the air.

As described above, the head part 1201 configured such that the base plate 1203 and the base member 1306 of the specimen stage 241 of the present embodiment are fastened with the insulating member 1305 interposed therebeween is configured such that the upper portion of the specimen stage 241, inclusive of the base plate 1203, can be integrally demounted from the specimen stage base 242 in a state in which the temperature sensors 1315, the heater power supplying connectors 1322, the upper portion of the sensor cable connector unit 1316 that is connected to them by cables, and the upper portion of the heater power supplying connector unit 1324 are mounted. The head part 1201 is interchanged as one unit, and thereby a load of work such as adjustment after a component is interchanged or mounted during a maintenance operation is reduced. The vacuum processing unit 2001 does not perform an operation for processing the wafer 300. An increase in so-called downtime and a reduction in efficiency of the operation of the vacuum processing unit 2001 are suppressed.

In the present embodiment, the space inside the head part 1201 which is airtightly sealed by the seal members such as the O-rings interposed between the outer circumferential portions of the base plate 1203, the insulating member 1305, and the base member 1306 and in which the temperature sensors 1315 and the heater power supplying connectors 1322 are disposed communicates with the storage space 1207, and has the atmospheric pressure or a pressure having a value approximated such as to be regarded as such even during the processing of the wafer 300. In this point, the internal space of the head part 1201 serves as, so to speak, a part of the storage space 1207.

In a state in which the head part 1201 is mounted above the specimen stage base 242 and is disposed in the vacuum processing unit 2001, the storage space 1207 is airtightly partitioned from the space inside the vacuum processing unit 2001. For this reason, even when a number by which the wafer 300 is processed or accumulation of a time for which the plasma is formed is increased in the vacuum processing unit 2001, spaces around temperature detection portions of the temperature sensors 1315 and a contact portion between the connecting terminals of the connectors are suppressed such that a change associated with a pressure as well as time elapse of a condition under which there is no entry of a gas and particles having reactivity is small.

In this way, the connecting terminals of the temperature sensors 1315 and the heater power supplying connectors 1322 are disposed in an environment in which the change of the condition is small. Thereby, as the number of processed wafers 300 or the accumulation of a time for which the plasma is formed is increased, a change in output of detection and an output result is suppressed. Further, degradation of accuracy in adjusting the power supplied to the electrodes in the head part 1201 and the amount of the refrigerant or the like supplied into the head part 1201 based on an instruction signal for realizing a desired condition that is calculated and sent using this result of detection is reduced. Thereby, a yield and reproducibility of the processing of the wafer 300 in the vacuum processing unit 2001 are improved.

In a case in which a distance from a detecting target or a relative position of arrangement is changed, calibration work of adjusting a correlation between an output signal as a result detected whenever the case occurs and a temperature detected from the output signal to a value fitted to a real value (or a sufficiently approximated value and a value regarded as such) with accuracy sufficient for an operation is commonsensically required for the detectors such as the temperature sensors 1315 disposed inside the head part 1201 as a unit made up of a group of members. Meanwhile, in the present embodiment, calibration of the temperature sensors 1315 mounted when only the previously prepared head part 1201 is separately assembled is performed before the head part 1201 is mounted on the specimen stage base 242 of the vacuum processing unit 2001 during the maintenance operation.

That is, in a state in which the plurality of temperature sensors 1315 are mounted in the head part 1201 prepared for interchange, the head part 1201 as a single unit is placed on the specimen stage base 242 suitable for calibration, and condition including an atmosphere becomes the same condition during the processing of the wafer 300 or a condition approximated such as to be regarded as such. Then, the calibration of the temperature sensors 1315 is performed. A surface of a member on which plurality of temperature sensors 1315 on which this calibration is performed are configured to be mounted is cleaned, or a head part 1201 that is a new component is interchanged with the head part 1201 used for the processing of the wafer 300, and is mounted on the specimen stage base 242. Then, a difference between an environment condition such as an amount of interaction with a temperature and a pressure or particles in the storage space 1207 and a condition under which the calibration is performed has a small temporal change, and thus a change in accuracy of the detection using the temperature sensors 1315 is also suppressed.

For this reason, the calibration is performed under the atmospheric pressure prior to the mounting. Thereby, a need to perform the calibration of the temperature sensors 1315 again after the head part 1201 is mounted above the specimen stage 242 is reduced. By omitting this, a time required for an operation for preparation up to resumption of the operation for the processing of the wafer 300 in the vacuum processing unit 2001 after work for maintenance or inspection is shortened. Further, a temporal change of the reproducibility of the processing of the wafer 300 performed in the vacuum processing unit 2001 is suppressed, and the yield and efficiency of the processing is improved.

Figure 15:
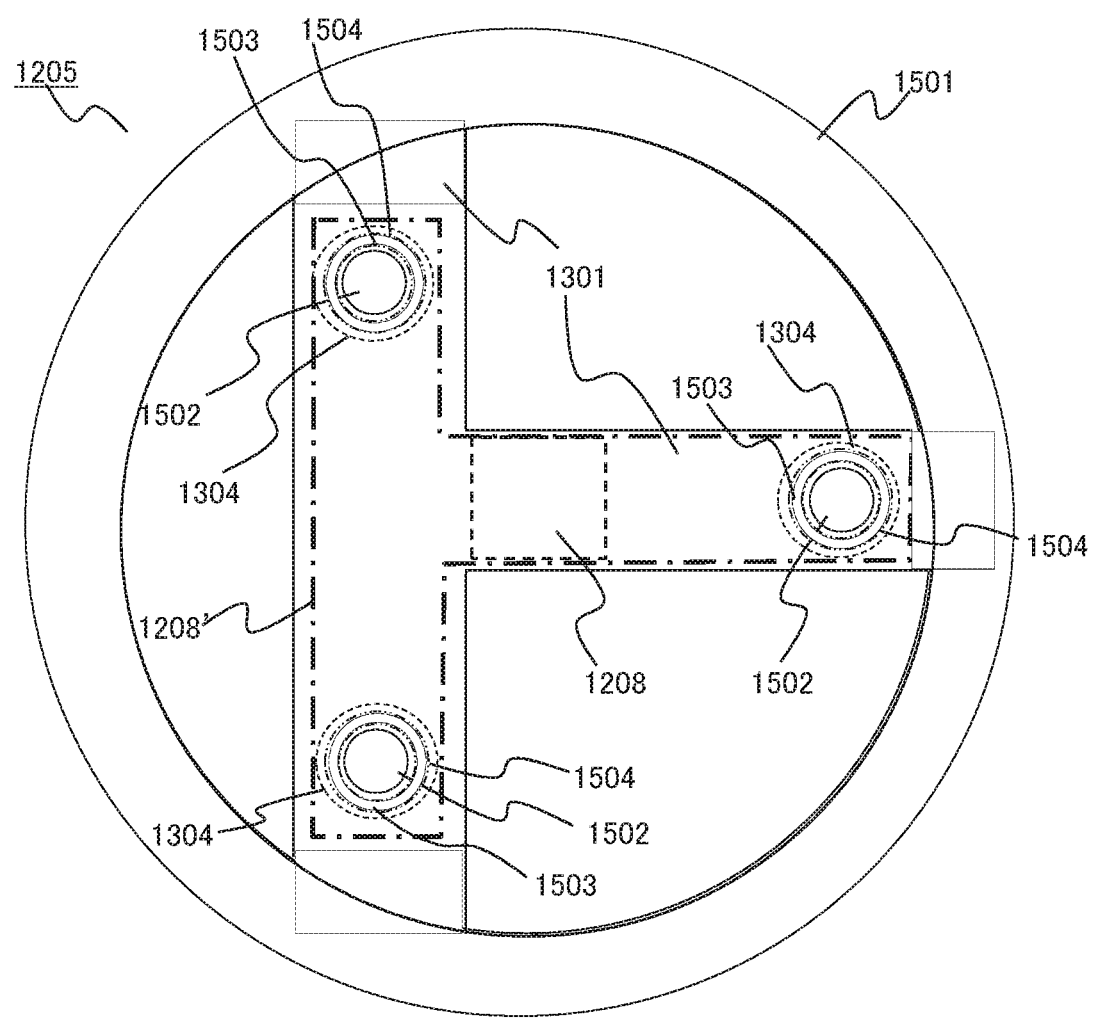
FIG. 15 is a top view schematically illustrating an outline of a configuration of a T flange of the vacuum processing chamber of the embodiment illustrated in FIGS. 12A to 14B.

A configuration of the T flange 1205 of the present embodiment will be described using FIG. 15. FIG. 15 is a top view schematically illustrating an outline of the configuration of the T flange of the vacuum processing chamber according to the embodiment illustrated in FIGS. 12A to 14B.

The T flange 1205 of the present embodiment includes a cylindrical part 1501 that is located on an outer circumferential side thereof and constitutes an outer circumferential sidewall of the upper portion of the specimen stage base 242, and a beam part 1301 that is disposed inside a cylindrical inner circumferential wall surface thereof and is integrally formed by connecting inner circumferential wall surfaces. Further, the beam part 1301 of the present embodiment has a plane shape of a T or Y shape when viewed from above, and has three plate-shaped beams that extend from the center of the cylindrical part 1501 in a radial direction. A through-hole 1502 for a pin into which the pin 1302 is inserted is disposed at each of the beams.

Further, a pin drive unit 1208 is coupled to a lower surface of the center of the beam part 1301. An upper end of the pin drive unit 1208 is positioned to be mounted on the lower surface of the beam part 1301, and a cylindrical actuator whose length is expanded and contracted by a fluid or driving of a motor is provided at a lower end of the pin drive unit 1208. Like the beam part 1301, an arm 1208' that is a T-shaped or Y-shaped plate member is connected to a lower end of the actuator, and bellows 1304 having bellows-shaped portions, each of which is connected from a lower ends of the three pins 1302 and an upper surface of the arm 1208' around the lower ends of the three pins 1302 to lower surfaces of the beams of the beam part 1301 located above the arm 1208' and is expanded or contracted in association with an increase or decrease in a distance between the upper surface of the arm 1208' and the lower surface of the beam part 1301 due to upward or downward movement of the arm 1208', and is made of metal, are disposed at three tips of the arm 1208' which are stored inside the storage space 1207 and move up and down without abutting on a surrounding wall surface.

Further, ring-shaped lower surfaces of the projections 1203' of the base plate 1203 are places that are in contact with the upper surface of the beam part 1301 which surrounds the through-holes 1502 and is located on an outer circumferential side via seal member such as O-rings or face the upper surface of the beam part 1301 with a gap. An airtight seal is formed between an upper end face of each of the bellows 1304 and the lower surface of the beam part 1301 and between a lower end face of each of the bellows 1304 and the upper surface of the arm 1208', and between a space inside each of the through-holes 1502 in which each of the pins 1302 is stored and which includes the inside of each of the bellows 1304 and the storage space 1207 at an outer circumferential portion of the through-hole 1502, and the O-ring is interposed between the lower end face of each of the projections 1203' and the upper surface of the beam part 1301 and is and in contact with them.

In the T flange 1205, the upper surface of the T-shaped or Y-shaped beam part 130 on the outer circumferential sides of the through-holes 1502 has ring-shaped grooves 1504 into which O-rings 1503 for forming an airtight seal between the beam part 1301 and the base plate 1203 is fitted and assembled. Further, the storage space 1207 around the bellows 1304 communicates with the vacuum processing unit 2001 via the through-holes 1303 of the base member 1306 in which the pins 1302 are stored on the upper side thereof. That is, spaces between the lower surface of the beam part 1301 and the bellows 1304 and the upper surface of the arm 1208' are places where an airtight seal is formed between the storage space 1207 and the inner portion of the reaction processing chamber 2002.

A seal member such as an O-ring is interposed between an upper end face of the cylindrical part 1501 and a lower surface of the outer circumferential edge of the upper base plate 1203 of the cylindrical part 1501 and between a lower end face of the cylindrical part 1501 and an upper end face of the center cylinder of the base cylinder, and the storage space 1207 that is the space inside these members and the inner portion of the vacuum processing unit 2001 that is the space outside these members are airtightly sealed.

The beam part 1301 of the T flange 1205 of the present embodiment has a T or Y shape in which the plate-shaped three beams connecting facing places of the inner circumferential wall surface of the cylindrical part 1501 are connected in the center of the cylindrical part 1501 in one when viewed from above. The beam part 1301 is formed integrally with the cylindrical part, or is formed of a separate member that is connected and integrated to the cylindrical part. In this configuration, when an external force is applied to the beam part 1301 whose ends are integrated to the cylindrical part, a change in positions of the upper and lower surfaces of the beam part 1301 is suppressed.

The upper end face of the pin drive unit 1208 is connected to and mounted on the lower surface of the center of the beam part 1301. The cylindrical actuator in which a tip position is moved in a vertical direction and whose length is increased or decreased is provided on the lower end of the pin drive unit 1208. An upper end of the actuator is stored in a main body of the pin drive unit 1208, and a lower end of the actuator is connected to the arm 1208' having the same plane shape of the T or Y shape as the beam part 1301.

The arm 1208' of this example includes three plate-shaped beams that extend from the same center as the beam part 1301 to an outer circumferential side. The lower ends of the pins 1302 are mounted on upper surfaces of tips of the beams, and positions of the pins 1302 are fixed. The beams of the arm 1208' have a shorter length than the beams of the beam part 1301 above the beams of the arm 1208', and are disposed such that the tips thereof do not come into contact with the members inside the storage space 1207 during vertical movement of height associated with an operation of expansion or contraction of the actuator of the pin drive unit 1208 in a vertical direction. The pins 1302 are vertically moved in the through-holes 1303 and 1502 in association with the vertical movement of the arm 1208', and thereby the wafer 300 supported by riding on tips of the pins 1302 is moved up and down.

With the above configuration, a change in mounting position of the pin drive unit 1208 connected to the lower surface of the beam part 1301 in association with the driving of the pin drive unit 1208 or breakage of a seal between the ring-shaped lower end face of each of the projections 1203' of the base plate 1203 connected across the O-ring connected to upper surface of the beam part 1301 and the upper surface of the beam part 1301 is suppressed, and reliability of the processing of the wafer 300 using the vacuum processing unit 2001 is improved.

Figure 16:
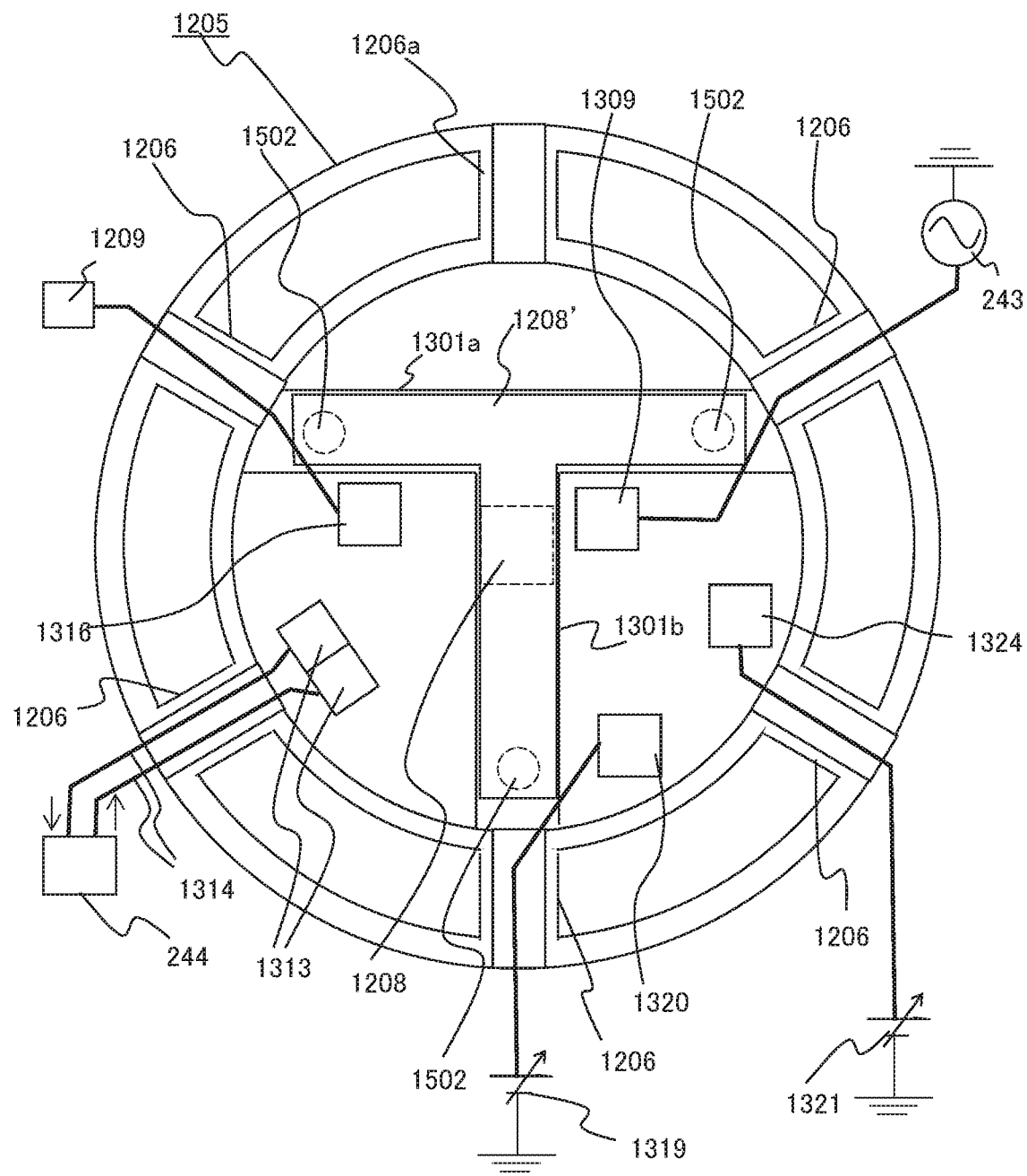
FIG. 16 is a bottom view schematically illustrating an outline of the specimen stage of the vacuum processing chamber of the embodiment illustrated in FIGS. 13A and 13B.

A configuration of the specimen stage unit 240 of the present embodiment will be described using FIG. 16. FIG. 16 is a bottom view schematically illustrating an outline of the configuration of the specimen stage according to the embodiment illustrated in FIGS. 13A and 13B. Especially, the outline of the configuration when a cross section of the specimen stage unit 240 taken along line A-A of FIG. 13A is viewed from below is schematically illustrated.

In the present embodiment, the T flange 1205 of the specimen stage unit 241 includes six support beams 1206 that are connected between the specimen stage base 242 and the specimen stage 241, and these support beams 1206 are disposed on the outer circumferential side of the specimen stage 241 to extend in a radial direction at an equal angle around the central axis of the specimen stage 241 in a vertical direction or at an angle approximated such as to be regarded as such.

Spaces that constitute a part of the storage space 1207 and communicate with a part of the storage space 1207 below the specimen stage 241 are disposed inside the support beams 1206.

The application of the high-frequency bias to the specimen stage 241 and the temperature control of the specimen stage 241 are performed via the wiring cords for the power supply and the wiring cords for the temperature control or the pipes for the refrigerant that are disposed in the storage space 1207 inside the specimen stage base 242 including the support beams 1206 and the specimen stage 241. Further, the power supplying cable for supplying the second high-frequency power for bias formation has one end that is connected to the second high-frequency power supply 243 and is disposed inside the storage space 1207 through a part of the storage space 1207 in the support beams 1206, and the other end that is connected to the power supplying connector 1309.

In the same way as described above, the cable through which the direct current power from the direct current power supply 1321 is supplied to the heater 222 for increasing or decreasing the temperature of the wafer 300, the cables for transmitting signals between the temperature sensors 1315 that detect the temperature of the wafer 300 or the base member 1306 and the pin drive unit 1208 and between the temperature sensors 1315 and the vessel controller 1209, and the two pipes 1314 for the refrigerant supply and return that are connected between the refrigerant flow passage 1313 inside the base member 1306 and the second temperature controller 244 are disposed in the spaces inside the support beams 1206 constituting the storage space 1207 and in the space under the base plate 1203 of the specimen stage 241, have one ends connected to the heater power supplying connector unit 1324, the sensor cable connector unit 1316, and the inlet and outlet of the refrigerant flow passage 1313 on the lower surface of the base plate 1203, and portions close to the other ends led from the outlet openings of the storage space 1207 inside the support beams 1206 disposed on the outer circumferential sidewall of the specimen stage base 242 to the outside of the vacuum vessel. Further, the wiring cord for the direct current power that is supplied from the direct current power supply 1321 to the ESC electrodes 1311 for adsorbing the wafer 300 on the upper surface of the specimen stage 241 with an electrostatic force is similarly disposed inside one of the support beams 1206 that becomes the cavity of the specimen stage base 242 and in the storage space 1207 under the base plate 1203, and is configured such that a portion close to the other end thereof is led to the outside of the vacuum vessel on the outer circumferential side of the specimen stage base 242 from the opening that communicates with the storage space 1207 inside the support beams 1206, and one end thereof is connected to the ESC electrode power supplying cable connector unit 1320 on the lower surface of the base plate 1203.

In the present embodiment, among the six support beams 1206 that are radially disposed at an equal angle around the central axis of the specimen stage 241 of FIG. 16 in a vertical direction and at an angle approximated such as to be regarded as such, a support beams 1206*a* illustrated on the uppermost side in the figure is disposed between the pin drive unit 1208 disposed on the central axis below the specimen stage 241 or the base plate 1203 and the valve box 115, the second gate valve 112, or the vacuum transfer chamber, and is disposed to face the central axis or the pin drive unit 1208. That is, the central axis of the internal storage space 1207 that extends in the same direction as the central axis of the support beam 1206*a* is disposed parallel to a transferring direction of the wafer 300 that is transferred between the reaction processing chamber 2002 and the vacuum transfer chamber or a moving direction of an arm tip of the vacuum transfer robot. Further, an opening of the outer circumferential wall surface of the specimen stage base 242 of the storage space 1207 at an inner portion of the support beam 1206*a* is disposed to face the valve box 115 or the drive unit of the second gate valve 112 disposed below the valve box 115, and the cables or the pipes 1313 are not stored in the storage space 1207.

Out of the T-shaped beam part 1301 that is formed integrally with the T flange 1205 or is connected to the T flange 1205 across the transferring direction of the wafer 300 in which the support beam 1206*a* extends, a beam part 1301*a* having the through-holes 1502 at portions close to opposite ends thereof which are formed integrally with the T flange 1205 or are connected to the T flange 1205 is disposed at the inner portion of the storage space 1207 under the base plate 1203 in the specimen stage 241, and another beam part 1301*b* having the through-hole 1502 at an end thereof that is formed integrally with the T flange 1205 or is connected to the T flange 1205 is integrally connected to the middle between the two through-holes 1502 of the beam part 1301*a*. The two pins 1302 are disposed in the two through-holes 1502 of the beam part 1301*a* to vertically pass through the through-holes 1502. The arm tip of the vacuum transfer robot enters between these pins 1302 through the gate opened by the second gate valve 112 in a state in which these pins 1302 protrude upward from upper openings of the through-holes 1303 of the dielectric film 1307 at the upper portion of the specimen stage 241, or the pins 1302 protrude to both sides with respect to an entering or leaving direction of the arm tip in a state in which the arm tip enters and is located above the dielectric film 1307. Thereby, the wafer 300 is delivered between the pins 1302 and the arm tip.

In the embodiment illustrated in FIG. 16, the cable for communicating the signal, the power supplying cable, and the pipes 131 for the refrigerant are disposed between the storage space under the base plate 1203 and the outside of the vacuum vessel across the storage space 1207 in the other support beams 1206 excluding the support beam 1206*a*. The ends of them which are close to the storage space 1207 under the base plate 1203 are connected to the lower surface of the base plate 1203 through any one of two regions or spaces divided by the beam parts 1301*a* and 1301*b* and the cylindrical outer circumferential wall of the T flange when viewed from above.

According to the above embodiment, the vacuum processing unit 2001 does not perform the operation for the processing of the wafer 300, so that an increase in so-called downtime and a reduction in efficiency of the operation of the vacuum processing unit 2001 are suppressed.

A power supplying point of the high-frequency power applied to the specimen stage are disposed in the center of the specimen stage, and thereby in-plane uniformity of the wafer is not damaged, and thus processing having a high yield becomes possible.

Further, the connecting terminals of the temperature sensors 1315 and the heater power supplying connectors 1322 are disposed in the environment in which a change in condition is reduced. Thereby, a change in output of detection and an output result in association with an increase in the number of processed wafers 300 or the accumulation of a time for which the plasma is formed is suppressed. Further, degradation of accuracy in adjusting the power supplied to the electrodes in the head part 1201 and the amount of the refrigerant or the like supplied into the head part 1201 based on an instruction signal for realizing a desired condition that is calculated and sent using this result of detection is reduced.

Thereby, the yield and reproducibility of the processing of the wafer 300 in the vacuum processing unit 2001 are improved. Further, a time required for an operation for preparation up to resumption of the operation for the processing of the wafer 300 in the vacuum processing unit 2001 after work for maintenance or inspection is shortened. Further, a temporal change of the reproducibility of the processing of the wafer 300 performed in the vacuum processing unit 2001 is suppressed, and the yield and efficiency of the processing are improved.

In the present embodiment, an ECR type vacuum processing apparatus is used as the vacuum processing apparatus, but without being limited thereto, the vacuum processing apparatus may also be applied to an ICP type apparatus or the like. The vacuum processing apparatus having the vacuum processing units 2001 arranged in a link type is used, but without being limited thereto, the vacuum processing apparatus may also be applied to a cluster type apparatus.

The present invention is not limited to the aforementioned embodiment, and includes various modifications. For example, the aforementioned embodiment is described in detail to facilitate understanding the present invention, and is not necessarily limited to having all the described configurations. A part of a certain configuration can be substituted with another configuration, or another configuration can be added to the certain configuration.

What is claimed is:

1. A vacuum processing apparatus comprising:
    a processing chamber which is disposed inside a vacuum vessel, and whose inner portion is exhausted and depressurized;
    a specimen stage which is disposed in the processing chamber where a specimen to be processed is placed on an upper surface of the specimen stage; and
    an opening which is disposed below the specimen stage, and communicates with an exhaust pump for exhausting the inner portion of the processing chamber,
    wherein the specimen is processed using plasma formed above the specimen stage and in the processing chamber, and
    the specimen stage includes: a base member that includes a dielectric film, where the specimen is placed on an upper surface of the dielectric film, and the base member is made of metal; a base plate that is disposed below the base member, is interposed and insulated between the base member and an insulating member, and is made of metal; a connector that is inserted into a center of the base member from below the base plate, is mounted on a lower surface of the base plate, and supplies high-frequency power to the base member; a cylindrical pedestal which is disposed below the base plate, whose internal space is under an atmospheric pressure, and which is connected to the base plate in a state in which the base plate, and the base member and the insulating member fastened to the base plate are placed on an upper side of the internal space; a plate-shaped beam part which is disposed in the internal space of the cylindrical pedestal with a gap from the lower surface of the base plate, and extends outward from the center of the internal space in a T or Y shape, and whose end is connected to an inner circumferential wall surface of the cylindrical pedestal; a plurality of pins that pass through the beam part, the base plate, the insulating member, and the base member, support the specimen on tips thereof on an upper side of the specimen stage, and vertically move the specimen; a drive unit of the plurality of pins that is mounted on a lower surface of the center of the beam part; and a seal that is disposed at the beam part, is disposed around a through-hole through which each of the plurality of pins passes, and forms an airtight seal between a periphery of each of the pins and the internal space in the cylindrical pedestal under the atmospheric pressure.

2. The vacuum processing apparatus according to claim 1, wherein the seal on an upper surface of the beam part performs sealing in a state in which the base member is mounted on the cylindrical pedestal.

3. The vacuum processing apparatus according to claim 2, wherein, in a state in which the connector is mounted on the base plate, and the base member and the insulating member fastened to the base plate are constituted to be demountable from the cylindrical pedestal.

4. The vacuum processing apparatus according to claim 2, wherein the gap between the upper surface of the beam part and the lower surface of the base plate and a high-frequency power supply that supplies the high-frequency power through the internal space are connected as to be mounted and demounted.

5. The vacuum processing apparatus according to claim 2, wherein cables for supplying power to the base member or pipes for supplying a gas or a fluid are connected to the base plate through the space between a plurality of T-shaped or Y-shaped beams of the beam part.

6. The vacuum processing apparatus according to claim 1, wherein, in a state in which the connector is mounted on the base plate, and the base member and the insulating member fastened to the base plate are constituted to be demountable from the cylindrical pedestal.

7. The vacuum processing apparatus according to claim 1, wherein the gap between an upper surface of the beam part and the lower surface of the base plate and a high-frequency power supply that supplies the high-frequency power through the internal space are connected as to be mounted and demounted.

8. The vacuum processing apparatus according to claim 1, wherein cables for supplying power to the base member or pipes for supplying a gas or a fluid are connected to the base plate through the internal space between a plurality of T-shaped or Y-shaped beams of the beam part.

* * * * *